(12) United States Patent
Liu et al.

(10) Patent No.: US 9,543,147 B2
(45) Date of Patent: Jan. 10, 2017

(54) PHOTORESIST AND METHOD OF MANUFACTURE

(71) Applicant: Taiwan Semiconductor Manufacturing Company, Ltd., Hsin-Chu (TW)

(72) Inventors: Chen-Yu Liu, Kaohsiung (TW); Ching-Yu Chang, Yuansun Village (TW); Chien-Chih Chen, Hsin-Chu (TW); Yen-Hao Chen, Hsin-Chu (TW)

(73) Assignee: Taiwan Semiconductor Manufacturing Company, Ltd., Hsin-chu (TW)

( * ) Notice: Subject to any disclaimer, the term of this patent is extended or adjusted under 35 U.S.C. 154(b) by 0 days.

(21) Appl. No.: 14/849,154

(22) Filed: Sep. 9, 2015

(65) Prior Publication Data
US 2016/0005595 A1    Jan. 7, 2016

Related U.S. Application Data

(63) Continuation-in-part of application No. 14/724,107, filed on May 28, 2015, which is a continuation-in-part
(Continued)

(51) Int. Cl.
*G03F 7/004* (2006.01)
*H01L 21/027* (2006.01)
(Continued)

(52) U.S. Cl.
CPC ......... *H01L 21/0276* (2013.01); *C08F 220/18* (2013.01); *C08F 220/22* (2013.01);
(Continued)

(58) Field of Classification Search
CPC .............. G03F 7/11; G03F 7/40; G03F 7/425; C08F 220/22; H01L 21/0276; H01L 21/02343; H01L 21/02359; H01L 21/31111
(Continued)

(56) References Cited

U.S. PATENT DOCUMENTS 4,072,527 A    2/1978 Fan
4,212,935 A    7/1980 Canavello et al.
(Continued)

FOREIGN PATENT DOCUMENTS

EP    1500977 A1    1/2005
JP    2006145788 A   6/2006
(Continued)

OTHER PUBLICATIONS

Hamad, et al., "Fluorinated Dissolution Inhibitors for 157 nm Lithography," Proc. SPIE vol. 4690, Jul. 15, 2002, pp. 477-485.
(Continued)

*Primary Examiner* — Amanda C Walke
(74) *Attorney, Agent, or Firm* — Slater Matsil, LLP

(57) ABSTRACT

A system and method for anti-reflective layers is provided. In an embodiment the anti-reflective layer comprises a floating additive in order to form a floating additive region along a top surface of the anti-reflective layer after the anti-reflective layer has dispersed. The floating additive may comprise an additive group which will decompose along with a fluorine unit bonded to the additive group which will decompose. Additionally, adhesion between the middle layer and the photoresist may be increased by applying an adhesion promotion layer using either a deposition process or phase separation, or a cross-linking may be performed between the middle layer and the photoresist.

22 Claims, 14 Drawing Sheets

Related U.S. Application Data of application No. 14/490,517, filed on Sep. 18, 2014, now Pat. No. 9,256,128, which is a continuation-in-part of application No. 14/056,737, filed on Oct. 17, 2013, now Pat. No. 9,245,751.

(60) Provisional application No. 61/777,782, filed on Mar. 12, 2013, provisional application No. 61/985,945, filed on Apr. 29, 2014.

(51) Int. Cl.

| | | |
|---|---|---|
| *H01L 21/02* | (2006.01) | |
| *H01L 21/308* | (2006.01) | |
| *C08F 220/22* | (2006.01) | |
| *G03F 7/42* | (2006.01) | |
| *G03F 7/40* | (2006.01) | |
| *G03F 7/11* | (2006.01) | |
| *C08F 220/18* | (2006.01) | |
| *C11D 11/00* | (2006.01) | |
| *H01L 21/311* | (2006.01) | |

(52) U.S. Cl.
CPC ............ *C11D 11/0047* (2013.01); *G03F 7/11* (2013.01); *G03F 7/40* (2013.01); *G03F 7/425* (2013.01); *H01L 21/02118* (2013.01); *H01L 21/3081* (2013.01); *H01L 21/3086* (2013.01); *H01L 21/31133* (2013.01)

(58) Field of Classification Search
USPC ......... 430/271.1, 273.1, 322, 329, 330, 331; 510/175, 176
See application file for complete search history.

(56) References Cited

U.S. PATENT DOCUMENTS

| | | |
|---|---|---|
| 4,268,601 A | 5/1981 | Namiki et al. |
| 4,289,845 A | 9/1981 | Bowden et al. |
| 4,346,164 A | 8/1982 | Tabarelli et al. |
| 4,491,628 A | 1/1985 | Ito et al. |
| 4,663,275 A | 5/1987 | West et al. |
| 4,777,119 A | 10/1988 | Brault et al. |
| 4,939,070 A | 7/1990 | Brunsvold et al. |
| 5,002,850 A | 3/1991 | Shinozaki et al. |
| 5,268,260 A | 12/1993 | Bantu et al. |
| 5,288,588 A | 2/1994 | Yukawa et al. |
| 5,738,975 A | 4/1998 | Nakano et al. |
| 5,750,312 A | 5/1998 | Chandross et al. |
| 5,766,824 A | 6/1998 | Batchelder et al. |
| 5,856,065 A | 1/1999 | Hagen |
| 5,863,710 A | 1/1999 | Wakiya et al. |
| 5,886,102 A | 3/1999 | Sinta et al. |
| 5,889,141 A | 3/1999 | Marrocco, III et al. |
| 6,008,265 A | 12/1999 | Vallee et al. |
| 6,147,249 A | 11/2000 | Watanabe et al. |
| 6,187,504 B1 | 2/2001 | Suwa et al. |
| 6,306,554 B1 | 10/2001 | Barclay et al. |
| 6,613,493 B2 | 9/2003 | Lee et al. |
| 6,627,377 B1 | 9/2003 | Itatani et al. |
| 6,787,289 B2 | 9/2004 | Yamada et al. |
| 6,788,477 B2 | 9/2004 | Lin |
| 6,790,579 B1 | 9/2004 | Goodall et al. |
| 6,835,527 B2 | 12/2004 | Takata et al. |
| 6,852,473 B2 | 2/2005 | Martin et al. |
| 6,872,503 B2 | 3/2005 | Wheland et al. |
| 6,875,554 B2 | 4/2005 | Hatanaka et al. |
| 6,936,400 B2 | 8/2005 | Takasu et al. |
| 6,952,253 B2 | 10/2005 | Lof et al. |
| 6,991,888 B2 | 1/2006 | Padmanaban et al. |
| 7,192,910 B2 | 3/2007 | Wojtczak et al. |
| 7,195,860 B2 | 3/2007 | Endo et al. |
| 7,235,348 B2 | 6/2007 | Ho et al. |
| 7,264,918 B2 | 9/2007 | Endo et al. |
| 7,312,014 B2 | 12/2007 | Maesawa et al. |
| 7,320,855 B2 | 1/2008 | Huang et al. |
| 7,344,970 B2 | 3/2008 | Forman et al. |
| 7,354,890 B2 | 4/2008 | Hara et al. |
| 7,362,412 B2 | 4/2008 | Holmes et al. |
| 7,393,624 B2 | 7/2008 | Allen et al. |
| 7,432,035 B2 | 10/2008 | Maeda et al. |
| 7,432,042 B2 | 10/2008 | Chang et al. |
| 7,460,206 B2 | 12/2008 | Weissenrieder et al. |
| 7,470,503 B1 | 12/2008 | Brandl |
| 7,507,783 B2 | 3/2009 | Meador et al. |
| 7,541,134 B2 | 6/2009 | Iwabuchi et al. |
| 7,579,308 B2 | 8/2009 | Lee |
| 7,582,398 B2 | 9/2009 | Iftime et al. |
| 7,585,612 B2 | 9/2009 | Thackeray et al. |
| 7,595,141 B2 | 9/2009 | Kudo et al. |
| 7,608,386 B2 | 10/2009 | Nozaki et al. |
| 7,648,815 B2 | 1/2010 | Itatani et al. |
| 7,700,533 B2 | 4/2010 | Egbe et al. |
| 7,709,370 B2 | 5/2010 | Allen et al. |
| 7,718,541 B2 | 5/2010 | Makiyama et al. |
| 7,733,459 B2 | 6/2010 | Dierichs et al. |
| 7,738,074 B2 | 6/2010 | Streefkerk et al. |
| 7,759,253 B2 | 7/2010 | Chang |
| 7,779,781 B2 | 8/2010 | Mertens et al. |
| 7,824,837 B2 | 11/2010 | Wu et al. |
| 7,846,637 B2 | 12/2010 | Ishizuka et al. |
| 7,879,529 B2 | 2/2011 | Endo et al. |
| 7,879,782 B2 | 2/2011 | Wu et al. |
| 7,888,300 B2 | 2/2011 | Seki et al. |
| 7,919,222 B2 | 4/2011 | Vohra et al. |
| 7,959,141 B2 | 6/2011 | Makino |
| 7,985,534 B2 | 7/2011 | Tsubaki |
| 7,989,578 B2 | 8/2011 | Wu |
| 7,998,655 B2 | 8/2011 | Tsubaki |
| 8,003,587 B2 | 8/2011 | Lee et al. |
| 8,017,304 B2 | 9/2011 | Tarutani et al. |
| 8,071,272 B2 | 12/2011 | Tsubaki |
| 8,088,548 B2 | 1/2012 | Houlihan et al. |
| 8,088,557 B2 | 1/2012 | Tsubaki |
| 8,092,703 B2 | 1/2012 | Ishibashi et al. |
| 8,105,748 B2 | 1/2012 | Ohashi et al. |
| 8,257,901 B2 | 9/2012 | Kim et al. |
| 8,323,870 B2 | 12/2012 | Lee et al. |
| 8,329,387 B2 | 12/2012 | Yao et al. |
| 8,334,338 B2 | 12/2012 | Yoshimura et al. |
| 8,460,856 B2 | 6/2013 | Yeh et al. |
| 8,507,177 B2 | 8/2013 | Wang et al. |
| 8,512,939 B2 | 8/2013 | Wang et al. |
| 8,518,628 B2 | 8/2013 | Chang et al. |
| 8,546,062 B2 | 10/2013 | Huang et al. |
| 8,586,290 B2 | 11/2013 | Wang et al. |
| 8,617,417 B2 | 12/2013 | Inaba et al. |
| 8,753,797 B2 | 6/2014 | Lin et al. |
| 8,835,697 B2 | 9/2014 | Kori et al. |
| 8,841,058 B2 | 9/2014 | Chang |
| 8,889,334 B2 | 11/2014 | Kennedy et al. |
| 8,951,948 B2 | 2/2015 | Rath et al. |
| 2001/0044070 A1 | 11/2001 | Uetani et al. |
| 2002/0012875 A1 | 1/2002 | Pavelchek et al. |
| 2002/0015826 A1 | 2/2002 | Desmarteau et al. |
| 2002/0051933 A1 | 5/2002 | Kodama et al. |
| 2002/0068237 A1 | 6/2002 | Imai |
| 2002/0172896 A1 | 11/2002 | Adams et al. |
| 2003/0022097 A1 | 1/2003 | Malik et al. |
| 2003/0073027 A1 | 4/2003 | Namiki et al. |
| 2003/0079764 A1 | 5/2003 | Hirose et al. |
| 2003/0087179 A1 | 5/2003 | Iwasaki |
| 2003/0175624 A1 | 9/2003 | Nozaki et al. |
| 2004/0084150 A1 | 5/2004 | George et al. |
| 2004/0096780 A1 | 5/2004 | Nozaki et al. |
| 2004/0161698 A1 | 8/2004 | Kanagasabapathy et al. |
| 2004/0180299 A1 | 9/2004 | Rolland et al. |
| 2005/0134817 A1 | 6/2005 | Nakamura |
| 2005/0145803 A1 | 7/2005 | Hakey et al. |
| 2005/0145821 A1 | 7/2005 | French et al. |
| 2005/0225737 A1 | 10/2005 | Weissenrieder et al. |
| 2005/0266354 A1 | 12/2005 | Li et al. |
| 2005/0287466 A1 | 12/2005 | Miyamoto et al. |

(56) References Cited

U.S. PATENT DOCUMENTS

| | | |
|---|---|---|
| 2006/0008736 A1 | 1/2006 | Kanda et al. |
| 2006/0094613 A1 | 5/2006 | Lee |
| 2006/0105267 A1 | 5/2006 | Khojasteh et al. |
| 2006/0141400 A1 | 6/2006 | Hirayama et al. |
| 2006/0204890 A1 | 9/2006 | Kodama |
| 2006/0246373 A1 | 11/2006 | Wang |
| 2006/0257781 A1 | 11/2006 | Benoit et al. |
| 2006/0257785 A1 | 11/2006 | Johnson |
| 2007/0031755 A1 | 2/2007 | Hirayama et al. |
| 2007/0207406 A1 | 9/2007 | Guerrero et al. |
| 2008/0113300 A2 | 5/2008 | Choi et al. |
| 2008/0149135 A1 | 6/2008 | Cho et al. |
| 2008/0160729 A1 | 7/2008 | Krueger et al. |
| 2008/0187860 A1 | 8/2008 | Tsubaki et al. |
| 2008/0227025 A1 | 9/2008 | Kanda |
| 2008/0241778 A1 | 10/2008 | Kulp |
| 2009/0042147 A1 | 2/2009 | Tsubaki |
| 2009/0239176 A1 | 9/2009 | Kanda |
| 2009/0305163 A1 | 12/2009 | Iwashita et al. |
| 2009/0311624 A1 | 12/2009 | Horiguchi et al. |
| 2010/0040971 A1 | 2/2010 | Tarutani et al. |
| 2010/0239984 A1 | 9/2010 | Tsubaki |
| 2010/0265580 A1 | 10/2010 | Yun et al. |
| 2011/0020755 A1 | 1/2011 | Tsubaki |
| 2011/0033801 A1 | 2/2011 | Zampini et al. |
| 2011/0076626 A1 | 3/2011 | Padmanaban et al. |
| 2011/0097670 A1 | 4/2011 | Wang et al. |
| 2011/0250543 A1 | 10/2011 | Tsubaki |
| 2011/0263136 A1 | 10/2011 | Kim et al. |
| 2011/0287634 A1 | 11/2011 | Barr et al. |
| 2012/0052687 A1 | 3/2012 | Raghavan et al. |
| 2012/0171616 A1 | 7/2012 | Thackeray et al. |
| 2012/0238106 A1 | 9/2012 | Chuang |
| 2012/0282553 A1 | 11/2012 | Kimura et al. |
| 2012/0308741 A1 | 12/2012 | Kim et al. |
| 2012/0308939 A1 | 12/2012 | Kudo et al. |
| 2013/0171569 A1 | 7/2013 | Tachibana et al. |
| 2014/0011133 A1 | 1/2014 | Liu et al. |
| 2014/0011359 A1 | 1/2014 | Klipp et al. |

FOREIGN PATENT DOCUMENTS

| | | |
|---|---|---|
| KR | 20020006322 A | 1/2002 |
| KR | 20090049517 A | 5/2009 |
| KR | 20110127088 A | 11/2011 |
| TW | 513747 | 12/2002 |
| TW | 550695 | 9/2003 |
| TW | I336819 B | 2/2011 |
| TW | I341961 B | 5/2011 |
| TW | I343513 B | 6/2011 |
| WO | 2005088397 A2 | 9/2005 |
| WO | 2006054432 A1 | 5/2006 |

OTHER PUBLICATIONS

Hoo, Ng Wah et al., "The Effect of UPW Quality on Photolithography Defect," Proc. SPIE, vol. 7520, Lithography Asia, Dec. 14, 2009, 7 pages.

Kitano, Junichi et al., "Resist pattern collapse prevention for the sub-90nm node," Microlithography World, May 2004, pp. 18-24, PennWell Publishing Corp.

Kunz, Roderick R., Kunz SPIE Short Course, 21 pages, MIT Lincoln Library, 2002, publisher unknown.

Lau, Aldrich N. K. et al., "New Thermal Cross-Linkers Based on Triazene: Cross-Linking of Fluorinated Polyimides and Aromatic Polymers," Macromolecules, 1992, pp. 7294-7299, Vol 25.

Reiser, Arnost, Photoreactive Polymers: The Science and Technology of Resists, Feb. 1989, 409 pages, Wiley-Interscience, New York.

Robertson, Stewart et al., "Physical Resist Simulation for a Negative Tone Development Process," 2010 International Symposium on Lithography Extension, Oct. 20-22, 2010, 19 pages.

Sekiguchi, Atsushi et al., "Analysis of Deprotection Reaction in Chemically Amplified Resists Using an Fourier Transform Infrared Spectrometer with an Exposure Tool," Japan J. Appl. Phys., Mar. 2000, pp. 1392-1398, vol. 39, Part 1, No. 3A.

Switkes, M. et al., "Extending optics to 50 nm and beyond with immersion lithography, " Journal of Vacuum Science & Technology B: Microelectronics and Nanometer Structures, Nov./Dec. 2003, vol. 21, No. 6., pp. 2794-2799.

Tarutani, Shinji et al., "Process parameter influence to negative tone development process for double patterning," Proc. SPIE vol. 7639, Advances in Resist Materials and Processing Technology XXVII, Mar. 29, 2010, 13 pages.

Tsvetanova, D. et al., "Degradation of 248 nm Deep UV Photoresist by Ion Implantation," Journal of the Electromechanical Society, Jun. 10, 2011, 10 pages, vol. 158, Issue 8.

PHOTORESIST AND METHOD OF MANUFACTURE

CROSS REFERENCE

This application is a continuation-in-part of U.S. patent application Ser. No. 14/724,107, filed on May 28, 2015, entitled "Photoresist Layer and Method," which is a continuation-in-part of U.S. patent application Ser. No. 14/490,517, filed on Sep. 18, 2014, entitled "Anti-Reflective Layer and Method," which is a continuation-in-part of U.S. patent application Ser. No. 14/056,737, filed on Oct. 17, 2013, entitled "Anti-Reflective Layer and Method," claims the benefit of U.S. Provisional Application No. 61/777,782 filed on Mar. 12, 2013, entitled "Anti-Reflective Layer and Method," and also claims the benefit of U.S. Provisional Application No. 61/985,945 filed on Apr. 29, 2014, entitled "Anti-Reflective Layer and Method," which applications are hereby incorporated herein by reference.

BACKGROUND

As consumer devices have gotten smaller and smaller in response to consumer demand, the individual components of these devices have necessarily decreased in size as well. Semiconductor devices, which make up a major component of devices such as mobile phones, computer tablets, and the like, have been pressured to become smaller and smaller, with a corresponding pressure on the individual devices (e.g., transistors, resistors, capacitors, etc.) within the semiconductor devices to also be reduced in size.

One enabling technology that is used in the manufacturing processes of semiconductor devices is the use of photolithographic materials. Such materials are applied to a surface and then exposed to an energy that has itself been patterned. Such an exposure modifies the chemical and physical properties of the exposed regions of the photolithographic material. This modification, along with the lack of modification in regions of the photolithographic material that were not exposed, can be exploited to remove one region without removing the other.

However, as the size of individual devices has decreased, process windows for photolithographic processing as become tighter and tighter. As such, advances in the field of photolithographic processing, such as the use of anti-reflective layers to prevent undesired reflections of impinging light, have been necessitated in order to keep up the ability to scale down the devices, and further improvements are needed in order to meet the desired design criteria such that the march towards smaller and smaller components may be maintained.

BRIEF DESCRIPTION OF THE DRAWINGS

For a more complete understanding of the present embodiments, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely a bottom anti-reflective coating utilized in the manufacturing of semiconductor devices. Other embodiments may also be applied, however, to other coatings in different processes.

Figure 1:
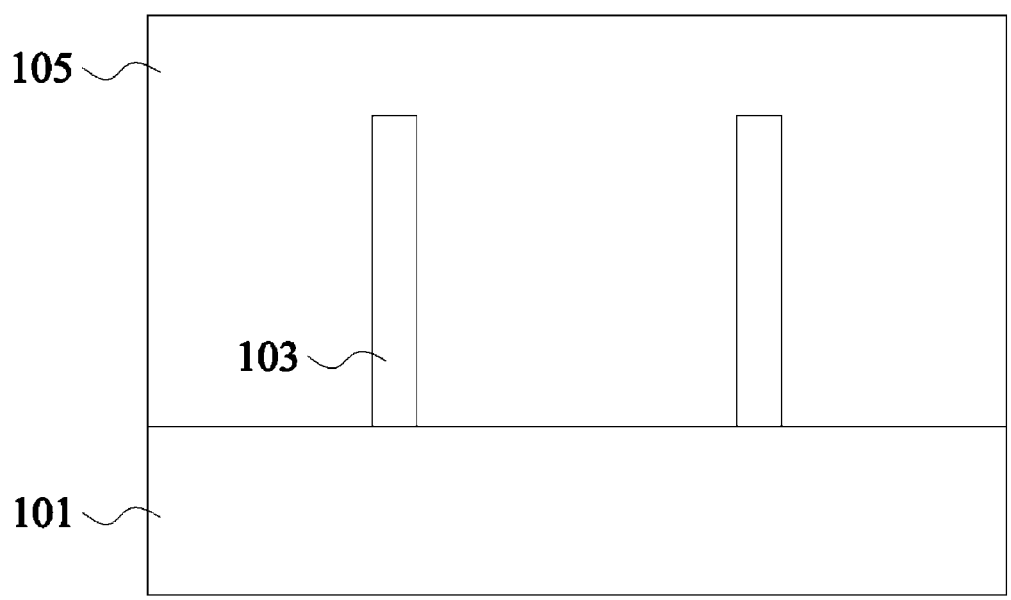
FIG. 1 illustrates an initial dispersion of a bottom anti-reflective layer on a semiconductor substrate in accordance with an embodiment.

With reference now to FIG. 1, there is shown a substrate 101 with fins 103 formed over the substrate 101 and a bottom anti-reflective coating (BARC) layer 105 applied over the fins 103 and the substrate 101. The substrate 101 may be substantially conductive or semiconductive with an electrical resistance of less than $10^3$ ohm-meter and may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The fins 103 will serve as a fin structure for the eventual formation of FinFET or multiple gate transistors (not separately illustrated in FIG. 1). In an embodiment the fins 103 may be formed from the material of the substrate 101 and, as such, may also comprise bulk silicon, doped or undoped, or be an active layer of a SOI substrate. The fins 103 may be formed by first applying a masking material over the substrate 101, patterning the masking material, and then using the masking material as a mask to etch into the substrate 101, thereby forming the fins 103 from the material of the substrate 101.

However, using the material of the substrate 101 to form the fins 103 is only one illustrative method that may be used to form the fins 103. Alternatively, the fins 103 may be formed by initially depositing a semiconductor material, such as silicon, silicon-germanium, or the like, over the substrate 101 and then masking and etching the semiconductor material to form the fins 103 over the substrate 101. In yet another alternative, the fins 103 may be formed by masking the substrate 101 and using, e.g., an epitaxial growth process to grow the fins 103 on the substrate 101. These, and any other suitable method for forming the fins 103 may alternatively be utilized, and all such methods are fully intended to be included within the scope of the embodiments.

The BARC layer 105 is applied over the fins 103 and fills the regions between the fins 103 in preparation for an application of a photoresist 401 (not illustrated in FIG. 1 but illustrated and described below with respect to FIG. 4A). The BARC layer 105, as its name suggests, works to prevent the uncontrolled and undesired reflection of energy (e.g., light) such as light back into the overlying photoresist 401 during an exposure of the photoresist 401, thereby preventing the reflecting light from causing reactions in an undesired region of the photoresist 401. Additionally, the BARC layer 105 may have a different refractive index (n), a different extinction coefficient (k), or thickness (T) value and a different etch resistance than the photoresist 401, and the BARC layer 105 may be used to provide a planar surface over the substrate 101 and the fins 103, helping to reduce the negative effects of the energy impinging at an angle.

In an embodiment the BARC layer 105 comprises a polymer resin, a catalyst, and a cross-linking agent, all of which are placed into a solvent for dispersal. The polymer resin may comprise a polymer with various monomers bonded together. In an embodiment the polymer may comprise different monomers such as a cross-linking monomer and a monomer with chromophore units. In an embodiment the monomer with the chromophore unit may comprise vinyl compounds (e.g., with conjugated double bonds) containing substituted and unsubstituted phenyl, substituted and unsubstituted anthracyl, substituted and unsubstituted phenanthryl, substituted and unsubstituted naphthyl, substituted and unsubstituted acridine, substituted and unsubstituted quinolinyl and ring-substituted quinolinyls (e.g., hydroxyquinolinyl), substituted and unsubstituted heterocyclic rings containing heteroatoms such as oxygen, nitrogen, sulfur, or combinations thereof, such as pyrrolidinyl, pyranyl, piperidinyl, acridinyl, quinolinyl. The substituents in these units may be any hydrocarbyl group and may further contain heteroatoms, such as, oxygen, nitrogen, sulfur, or combinations thereof, such as alkylenes, esters, ethers, combinations of these, or the like, with carbon atoms between 1 and 12.

In specific embodiments the monomers with chromophore units include styrene, hydroxystyrene, acetoxystyrene, vinyl benzoate, vinyl 4-tert-butylbenzoate, ethylene glycol phenyl ether acrylate, phenoxypropyl acrylate, N-methyl maleimide, 2-(4-benzoyl-3-hydroxyphenoxy) ethyl acrylate, 2-hydroxy-3-phenoxypropyl acrylate, phenyl methacrylate, benzyl methacrylate, 9-anthracenylmethyl methacrylate, 9-vinylanthracene, 2-vinylnaphthalene, N-vinylphthalimide, N-(3-hydroxyl)phenyl methacrylamide, N-(3-hydroxy-4-hydroxycarbonylphenylazo)phenyl methacrylamide, N-(3-hydroxyl-4-ethoxycarbonylphenylazo) phenyl methacrylamide, N-(2,4-dinitrophenylamino phenyl) maleimide, 3-(4-acetoaminophenyl)azo-4-hydroxystyrene, 3-(4-ethoxycarbonylphenyl)azo-acetoacetoxy ethyl methacrylate, 3-(4-hydroxyphenyl)azo-acetoacetoxy ethyl methacrylate, tetrahydroammonium sulfate salt of 3-(4-sulfophenyl)azoacetoacetoxy ethyl methacrylate combinations of these, or the like. However, any suitable monomer with chromophore units to absorb the impinging light and prevent the light from being reflected may alternatively be used, and all such monomers are fully intended to be included within the scope of the embodiments.

The cross-linking monomer may be used to cross-link the monomer with other polymers within the polymer resin to modify the solubility of the BARC layer 105, and may optionally have an acid labile group. In a particular embodiment the cross-linking monomer may comprise a hydrocarbon chain that also comprises, e.g., a hydroxyl group, a carboxyl acid group, a carboxylic ester group, epoxy groups, urethane groups, amide groups, combinations of these, and the like. Specific examples of cross-linking monomers that may be utilized include polyhydroxystyrene, poly(hydroxynaphthalene), poly(meth)acrylates, polyarylates, polyesters, polyurethanes, alkyd resins (aliphatic polyesters), poly(hydroxystyrene-methylmethacrylate), homopolymers and/or copolymers obtained by polymerization of at least one of the following monomers: styrene, hydroxystyrene, hydroxyethyl(meth)acrylate, hydroxypropyl(meth)acrylate, methyl(meth)acrylate, ethyl(meth)acrylate, (meth)acrylic acid, poly(4-hydroxystyrene), and poly(pyromellitic dianhydride-ethylene glycol-propylene oxide).

The various monomers will be polymerized with one another to form a polymer structure with a carbon chain backbone for the polymer resin. In an embodiment the polymer structure may have a carbon chain backbone that is an acrylic, a polyester, an epoxy novalac, a polysaccharide, a polyether, a polyimide, a polyurethane, and mixtures thereof. One example of a particular polymer resin that may be utilized has the following structure:

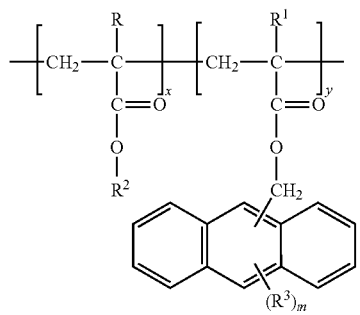

where each R and $R^1$ may be a hydrogen or a substituted or unsubstituted alkyl group having from 1 to 8 carbon atoms; each $R^2$ may be a substituted or unsubstituted alkyl having from 1 to 10 carbon atoms; and each $R^3$ may be a halogen atom, an alkyl having from 1 to 8 carbon atoms, an alkoxy having between 1 to 8 carbon atoms, an alkenyl having between 2 to 8 carbon atoms, an alkynyl having from 2 to 8 carbon atoms, cyano, nitro; m is an integer of from 0 to 9; and x is the mole fraction of percent of alkyl units in the polymer resin and is between about 10% and about 80%; and y is the mole fraction or percent of anthracene units in the polymer resin and is between about 5% and about 90%.

In another embodiment the polymer resin may also comprise a surface energy modification monomer (with, e.g., a surface energy modification group). The surface energy modification monomer is utilized to try and match the surface energy of the BARC layer 105 to the surface energy of the material of the substrate 101 and the fins 103 (e.g., silicon). By matching the surface energies, capillary forces may be used to enhance the gap filling performance of the BARC layer 105.

In one embodiment the surface energy modification monomer may be used to increase the surface energy of the BARC layer 105. In such an embodiment, to raise the surface energy of the BARC layer 105, the surface energy modification group within the surface energy modification monomer comprises one or more of a hydroxyl group, a carboxyl group, an amine group, or an amide group. In a particular embodiment the surface energy modification monomer may have a structure such as the following:

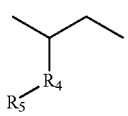

Wherein the $R^4$ and $R^5$ groups collectively form the surface energy modification group and where $R^4$ is an alkyl group with hydrogen attached to the hydrocarbons and wherein $R^4$ may have a straight, branched, or cyclic structure. The alkyl group within $R^4$ may also comprise hetero atoms, such as containing nitrogen or oxygen atoms. $R^5$ may contain at least one of a hydroxyl, carboxyl, amine, or amide group.

In particular embodiments, the surface energy modification monomer may comprise an acrylic acid monomer, a methacrylic acid monomer, a hydrostyrene monomer, or a monomer derived from 2-hydroxyethyl acrylate. For example, in an embodiment in which the surface energy modification group is a hydrostyrene monomer, the surface energy modification monomer may have the following structure:

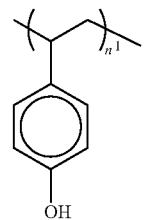

In an embodiment in which the surface energy modification monomer is an acrylic acid monomer, the surface energy modification monomer may have the following structure:

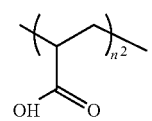

In an embodiment in which the surface energy modification group is a monomer derived from 2-hydroxyethyl acrylate, the surface energy modification monomer may have the following structure:

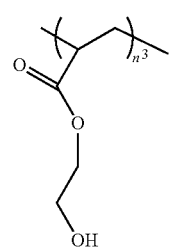

However, as one of ordinary skill in the art will recognize, the precise structures and examples described to raise the surface energy of the BARC layer 105 are intended to be illustrative and are not intended to be limiting. Rather, any suitable functional group within any suitable monomer that would raise the surface energy of the BARC layer 105 may alternatively be utilized. These are all fully intended to be included within the scope of the embodiments.

Alternatively, the surface energy modification monomer may be used to decrease the surface energy of the BARC layer 105. In such an embodiment, to decrease the surface energy of the BARC layer 105, the surface energy modification group within the surface energy modification monomer comprises one or more of an alkyl group, a fluoro group, a chloro group, or a benzyl group. In particular embodiments, the surface energy modification group may comprise a linear, branched, or cyclic alkyl or fluoro functional group.

In a particular embodiment the surface energy modification monomer may have a structure such as the following:

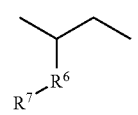

Wherein the $R^6$ and $R^7$ groups collectively form the surface energy modification group and where $R^6$ is an alkyl group with hydrogen attached to the hydrocarbons and wherein $R^6$ may have a straight, branched, or cyclic structure. The alkyl group within $R^6$ may also comprise hetero atoms, such as containing nitrogen or oxygen atoms. However, in this embodiment, $R^7$ may contain at least one of an alkyl, fluoro, or benzyl group, and may comprise a linear, branched, or cyclic alkyl or fluoro group. For example, in some embodiments the polymer resin with the surface energy modification monomer may have the following structures:

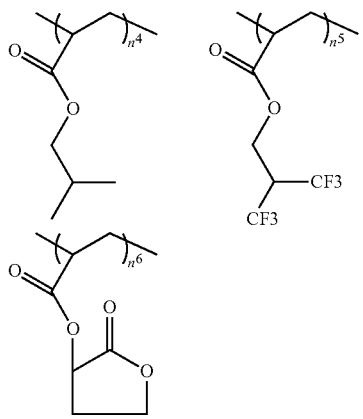

By utilizing the surface energy modification monomer, the surface energy of the polymer resin and, as such, the BARC layer 105 may be modified such that it more closely resembles the surface energy of the substrate 101 and the fins 103. By adjusting the surface energy, the BARC layer 105, instead of being repelled by the underlying material, will actually be pulled into small openings between structures by capillary forces. This helps the BARC layer 105 fill such gaps without voids.

Additionally, as one of ordinary skill in the art will recognize, the above description for the various monomers that may be polymerized to form the polymer resin for the BARC layer 105 are intended to be illustrative and are not intended to limit the embodiments in any fashion. Rather, any suitable monomer or combination of monomers that perform the desired functions of the monomers described herein may also be utilized. All such monomers are fully intended to be included within the scope of the embodiments.

In another embodiment one of the surface energy modification monomer, the cross-linking monomer, or the monomer with the chromophore unit may also comprise an inorganic component. In an embodiment the inorganic component may comprise a silicon atom and the surface energy modification group may be bonded to the silicon atom within the surface energy modification monomer. Alternatively, the chromophore group (within the monomer with the chromophore unit) may be bonded to the inorganic component within the chromophore monomer, or the cross-linking group may be bonded to the inorganic component within the cross-linking monomer. Any suitable combination of inorganic component within any of the surface energy modification monomer, the chromophore monomer, or the cross-linking monomer may be utilized.

By utilizing an inorganic material within the monomers, the surface energy of the BARC layer 105 may be modified. Additionally, if it is modified so that the surface energy of the BARC layer 105 is similar to the surface energy of the underlying material (e.g., the substrate 101 and fins 103), capillary forces may be used to pull the BARC layer 105 into small spaces between structures such as the fins 103. This will then help with filling the gaps and preventing defects that may arise from an inconsistent filling of the BARC layer 105.

In one embodiment the surface energy modification monomer with the energy modification group may be used to increase the surface energy of the BARC layer 105. In such an embodiment, to raise the surface energy of the BARC layer 105, the surface energy modification group comprises one or more of a hydroxyl group, a carboxyl group, an amine group, or an amide group. In a particular embodiment the surface energy modification monomer may have a structure such as the following:

Wherein $R^8$ and $R^9$ collectively make up the surface energy modification group and where $R^8$ is an alkyl group with hydrogen attached to the hydrocarbons and wherein $R^8$ may have a straight, branched, or cyclic structure. The alkyl group within $R^8$ may also comprise hetero atoms, such as containing nitrogen or oxygen atoms. $R^9$ may contain at least one of a hydroxyl, carboxyl, amine, or amide group.

In particular embodiments, the surface energy modification monomer may comprise an acrylic acid group, a methacrylic acid group, or a hydrostyrene group. In an embodiment in which the surface energy modification monomer comprises silicon and the surface energy modification group is hydrostyrene, the surface energy modification monomer may have the following structure:

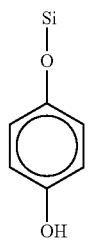

In an embodiment in which the surface energy modification monomer comprises silicon and the surface energy modification group is a hydroxyl group, the surface energy modification monomer may have the following structure:

In another embodiment the surface energy modification monomer comprises silicon and the surface energy modification group is a methacrylic acid group. In another embodiment the surface energy modification monomer comprises silicon and the surface energy modification group is an acrylic acid monomer.

However, as one of ordinary skill in the art will recognize, the precise structures and examples described to raise the surface energy of the BARC layer 105 are intended to be illustrative and are not intended to be limiting. Rather, any suitable functional group that would raise the surface energy of the BARC layer 105 may alternatively be utilized. These are all fully intended to be included within the scope of the embodiments.

Alternatively, the surface energy modification monomer with an inorganic component may be used to decrease the surface energy of the BARC layer 105. In such an embodiment, to decrease the surface energy of the BARC layer 105, the surface energy modification group in the surface energy modification monomer comprises one or more of an alkyl group, a fluoro group, or a benzyl group. In particular embodiments, the surface energy modification monomer may comprise a linear, branched, or cyclic alkyl or fluoro functional group.

In a particular embodiment the surface energy modification monomer may have a structure such as the following:

Wherein $R^{10}$ and $R^{11}$ collectively form the surface energy modification group and where $R^{10}$ is an alkyl group with hydrogen attached to the hydrocarbons and wherein $R^{10}$ may have a straight, branched, or cyclic structure. The alkyl group within $R^{10}$ may also comprise hetero atoms, such as containing nitrogen or oxygen atoms. However, in this embodiment, $R^{11}$ may contain at least one of an alkyl, fluoro, benzyl group, and may comprise a linear, branched, or cyclic alkyl or fluoro group. For example, in some embodiments the surface energy modification monomer may have one of the following structures:

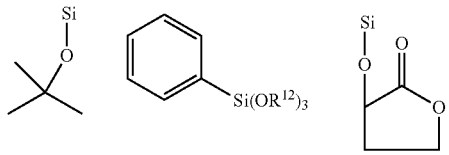

Wherein $R^{12}$ is an alkyl with from one to six carbon atoms.

Additionally in this embodiment, the inorganic element (e.g., silicon) is not limited to being only present on the polymer backbone. Rather, the inorganic element may be placed anywhere within the polymer resin. As one example, the cross-linking monomer may be formed with an inorganic functional group, such as silicon ethoxyl or silicon methoxyl, although any other suitable cross-linking material may also be utilized.

The catalyst may be a compound that is used to initiate a cross-linking reaction between the polymers within the polymer resin, and may be, e.g., a thermal acid generator, a photoacid generator, a photobase generator, suitable combinations of these, or the like. In an embodiment in which the catalyst is An ionic or non-ionic thermal acid generator, the catalyst will generate an acid when sufficient heat is applied to the BARC layer 105. Specific examples of the thermal acid generator include butane sulfonic acid, triflic acid, nonaflurobutane sulfonic acid, nitrobenzyl tosylates, such as 2-nitrobenzyl tosylate, 2,4-dinitrobenzyl tosylate, 2,6-dinitrobenzyl tosylate, 4-nitrobenzyl tosylate; benzenesulfonates such as 2-trifluoromethyl-6-nitrobenzyl 4-chlorobenzenesulfonate, 2-trifluoromethyl-6-nitrobenzyl 4-nitro benzenesulfonate; phenolic sulfonate esters such as phenyl, 4-methoxybenzenesulfonate; alkyl ammonium salts of organic acids, such as triethylammonium salt of 10-camphorsulfonic acid, onium salts, derivatives of napthalene sulfonic acid salts, combinations of these, or the like.

In an embodiment in which the catalyst is a photoacid generator, the catalyst may comprise halogenated triazines, onium salts, diazonium salts, aromatic diazonium salts, phosphonium salts, sulfonium salts, iodonium salts, imide sulfonate, oxime sulfonate, disulfone, o-nitrobenzylsulfonate, sulfonated esters, halogenerated sulfonyloxy dicarboximides, diazodisulfones, α-cyanooxyamine-sulfonates, imidesulfonates, ketodiazosulfones, sulfonyldiazoesters, 1,2-di(arylsulfonyl)hydrazines, nitrobenzyl esters, and the s-triazine derivatives, suitable combinations of these, and the like.

Specific examples of photoacid generators that may be used include α-(trifluoromethylsulfonyloxy)-bicyclo[2.2.1]hept-5-ene-2,3-dicarbo-ximide (MDT), N-hydroxy-naphthalimide (DDSN), benzoin tosylate, t-butylphenyl-α-(p-toluenesulfonyloxy)-acetate and t-butyl-α-(p-toluenesulfonyloxy)-acetate, triarylsulfonium and diaryliodonium hexafluoroantimonates, hexafluoroarsenates, trifluoromethanesulfonates, iodonium perfluorooctanesulfonate, N-camphorsulfonyloxynaphthalimide, N-pentafluorophenylsulfonyloxynaphthalimide, ionic iodonium sulfonates such as diaryl iodonium (alkyl or aryl) sulfonate and bis-(di-t-butylphenyl)iodonium camphanylsulfonate, perfluoroalkanesulfonates such as perfluoropentanesulfonate, perfluorooctanesulfonate, perfluoromethanesulfonate, aryl (e.g., phenyl or benzyl)triflates such as triphenylsulfonium triflate or bis-(t-butylphenyl)iodonium triflate; pyrogallol derivatives (e.g., trimesylate of pyrogallol), trifluoromethanesulfonate esters of hydroxyimides, α,α'-bis-sulfonyl-diazomethanes, sulfonate esters of nitro-substituted benzyl alcohols, naphthoquinone-4-diazides, alkyl disulfones, and the like.

In other embodiment the catalyst may be a photobase generator. In such an embodiment the photobase generator may comprise quaternary ammonium dithiocarbamates, a aminoketones, oxime-urethane containing molecules such as dibenzophenoneoxime hexamethylene diurethan, ammonium tetraorganylborate salts, and N-(2-nitrobenzyloxycarbonyl) cyclic amines, suitable combinations of these, or the like.

In an embodiment the floating cross-linking agent is also included with the polymer resin and the catalyst. The floating cross-linking agent will react with the polymers within the polymer resin and form linear or branched polymers structure that have larger molecular weight molecules, thereby improving the cross-linking density. In an embodiment the floating cross-linking agent may be an aliphatic polyether such as a polyether polyol, a polyglycidy ether, a vinyl ether, a glycouril, a triazene, combinations of these, or the like.

In an embodiment in which the floating cross-linking agent is a polyether polyol, the floating cross-linking agent has the following structure:

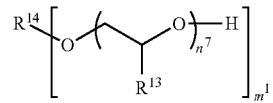

where $n^7$ represents an integer of 1 to 300; $m^1$ represents an integer of 2 to 6; $R^{13}$ represents a hydrogen atom or an alkyl group having 1 to 10 carbons atom(s); and $R^{14}$ represents an alkyl group having 1 to 10 carbon atom(s), an alkenyl group having 2 to 6 carbon atoms, an alkynyl group having 2 to 10 carbon atoms, alkylcarbonyl group having 2 to 10 carbon atoms, an alkylcarbonylamino group having 2 to 10 carbon atoms, an alkyloxyalkyl group having 2 to 10 carbon atoms, an alkylamino group having 1 to 10 carbon atom(s), an alkyldiamino group having 1 to 10 carbon atom(s) or a combination thereof and is an organic group capable of having a valence number of 2 to 6 according to the number m of polyoxyalkylene groups. Specific examples of alkyl groups that may be used for $R^{13}$ include methyl group, an ethyl group, a propyl group, an isopropyl group, an n-butyl group and an n-pentyl group.

Specific examples of an alkyl group that may be used for $R^{14}$ include methyl group, an ethyl group, an n-propyl group, an isopropyl group, a cyclopropyl group, an n-butyl group, an isobutyl group, an s-butyl group, a tert-butyl group, a cyclobutyl group, a 1-methyl-cyclopropyl group, a 2-methyl-cyclopropyl group, an n-pentyl group, a 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, a cyclopentyl group, a 1-methyl-cyclobutyl group, a 2-methyl-cyclobutyl group, a 3-methyl-cyclobutyl group, a 1,2-dimethyl-cyclopropyl group, a 2,3-dimethyl-cyclopropyl group, a 1-ethyl-cyclopropyl group, a 2-ethyl-cyclopropyl group, an n-hexyl group, a 1-methyl-n-pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, a 2,3-dimethyl-n-butyl group, a 3,3-dimethyl-n-butyl group, a 1-ethyl-n-butyl group, a 2-ethyl-n-butyl group, a 1,1,2-trimethyl-n-propyl group, a 1,2,2-trimethyl-n-propyl group, a 1-ethyl-1-methyl-n-propyl group, a 1-ethyl-2-methyl-n-propyl group, a cyclohexyl group, a 1,4-dimethyl-cyclohexyl group, a 1-methyl-cyclopentyl group, a 2-methyl-cyclopentyl group, a 3-methyl-cyclopentyl group, a 1-ethyl-cyclobutyl group, a 2-ethyl-cyclobutyl group, a 3-ethyl-cyclobutyl group, a 1,2-dimethyl-cyclobutyl group, a 1,3-dimethyl-cyclobutyl group, a 2,2-dimethyl-cyclobutyl group, a 2,3-dimethyl-cyclobutyl group, a 2,4-dimethyl-cyclobutyl group, a 3,3-dimethyl-cyclobutyl group, a 1-n-propyl-cyclopropyl group, a 2-n-propyl-cyclopropyl group, a 1-isopropyl-cyclopropyl group, a 2-isopropyl-cyclopropyl group, a 1,2,2-trimethyl-cyclopropyl group, a 1,2,3-trimethyl-cyclopropyl group, a 2,2,3-trimethyl-cyclopropyl group, a 1-ethyl-2-methyl-cyclopropyl group, a 2-ethyl-1-methyl-cyclopropyl group, a 2-ethyl-2-methyl-cyclopropyl group and a 2-ethyl-3-methyl-cyclopropyl group.

Specific examples of the alkenyl group that may be used for $R^{14}$ include an ethenyl group, a 1-propenyl group, a 2-propenyl group, a 1-methyl-1-ethenyl group, a 1-butenyl group, a 2-butenyl group, a 3-butenyl group, a 2-methyl-1-propenyl group, a 2-methyl-2-propenyl group, a 1-ethyl-ethenyl group, a 1-methyl-1-propenyl group, a 1-methyl-2-propenyl group, a 1-pentenyl group, a 2-pentenyl group, a 3-pentenyl group, a 4-pentenyl group, a 1-n-propyl-ethenyl group, a 1-methyl-1-butenyl group, a 1-methyl-2-butenyl group, a 1-methyl-3-butenyl group, a 2-ethyl-2-propenyl group, a 2-methyl-1-butenyl group, a 2-methyl-2-butenyl group, a 2-methyl-3-butenyl group, a 3-methyl-1-butenyl group, a 3-methyl-2-butenyl group, a 3-methyl-3-butenyl group, a 1,1-dimethyl-2-propenyl group, a 1-isopropyl-ethenyl group, a 1,2-dimethyl-1-propenyl group, a 1,2-dimethyl-2-propenyl group, a 1-cyclopentenyl group, a 2-cyclopentenyl group, a 3-cyclopentenyl group, a 1-hexenyl group, a 2-hexenyl group, a 3-hexenyl group, a 4-hexenyl group, a 5-hexenyl group, a 1-methyl-1-pentenyl group, a 1-methyl-2-pentenyl group, a 1-methyl-3-pentenyl group, a 1-methyl-4-pentenyl group, a 1-n-butyl-etenyl group, a 2-methyl-1-pentenyl group, a 2-methyl-2-pentenyl group, a 2-methyl-3-pentenyl group, a 2-methyl-4-pentenyl group, a 2-n-propyl-2-propenyl group, a 3-methyl-1-pentenyl group, a 3-methyl-2-pentenyl group, a 3-methyl-3-pentenyl group, a 3-methyl-4-pentenyl group, a 3-ethyl-3-butenyl group, a 4-methyl-1-pentenyl group, a 4-methyl-2-pentenyl group, a 4-methyl-3-pentenyl group, a 4-methyl-4-pentenyl group, a 1,1-dimethyl-2-butenyl group, a 1,1-dimethyl-3-butenyl group, a 1,2-dimethyl-1-butenyl group, a 1,2-dimethyl-2-butenyl group, a 1,2-dimethyl-3-butenyl group, a 1-methyl-2-ethyl-2-propenyl group, a 1-s-butyl-etenyl group, a 1,3-dimethyl-1-butenyl group, a 1,3-dimethyl-2-butenyl group, a 1,3-dimethyl-3-butenyl group, a 1-isobutyl-etenyl group, a 2,2-dimethyl-3-butenyl group, a 2,3-dimethyl-1-butenyl group, a 2,3-dimethyl-2-butenyl group, a 2,3-dimethyl-3-butenyl group, a 2-isopropyl-2-propenyl group, a 3,3-dimethyl-1-butenyl group, a 1-ethyl-1-butenyl group, a 1-ethyl-2-butenyl group, a 1-ethyl-3-butenyl group, a 1-n-propyl-1-propenyl group, a 1-n-propyl-2-propenyl group, a 2-ethyl-1-butenyl group, a 2-ethyl-2-butenyl group, a 2-ethyl-3-butenyl group, a 1,1,2-trimethyl-2-propenyl group, a 1-tert-butyl-etenyl group, a 1-methyl-1-ethyl-2-propenyl group, a 1-ethyl-2-methyl-1-propenyl group, a 1-ethyl-2-methyl-2-propenyl group, a 1-isopropyl-1-propenyl group, a 1-isopropyl-2-propenyl group, a 1-methyl-2-cyclopentenyl group, a 1-methyl-3-cyclopentenyl group, a 2-methyl-1-cyclopentenyl group, a 2-methyl-2-cyclopentenyl group, a 2-methyl-3-cyclopentenyl group, a 2-methyl-4-cyclopentenyl group, a 2-methyl-5-cyclopentenyl group, a 2-methylene-cyclopentyl group, a 3-methyl-1-cyclopentenyl group, a 3-methyl-2-cyclopentenyl group, a 3-methyl-3-cyclopentenyl group, a 3-methyl-4-cyclopentenyl group, a 3-methyl-5-cyclopentenyl group, a 3-methylene-cyclopentyl group, a 1-cyclohexenyl group, a 2-cyclohexenyl group and a 3-cyclohexenyl group Specific examples of the alkynyl group that may be used for $R^{14}$ include an ethynyl group, a 1-propynyl group, a 2-propynyl group, a 1-butynyl group, a 2-butynyl group, a 3-butynyl group, a 1-methyl-2-propynyl group, a 1-pentynyl group, a 2-pentynyl group, a 3-pentynyl group, a 4-pentynyl group, a 1-methyl-2-butynyl group, a 1-methyl-3-butynyl group, a 2-methyl-3-butynyl group, a 3-methyl-1-butynyl group, a 1,1-dimethyl-2-propynyl group, a 2-ethyl-2-propynyl group, a 1-hexynyl, a 2-hexynyl group, a 3-hexynyl group, a 4-hexynyl group, a 5-hexynyl group, a 1-methyl-2-pentynyl group, a 1-methyl-3-pentynyl group, a 1-methyl-4-pentynyl group, a 2-methyl-3-pentynyl group, a 2-methyl-4-pentynyl group, a 3-methyl-1-pentynyl group, a 3-methyl-4-pentynyl group, a 4-methyl-1-pentynyl group, a 4-methyl-2-pentynyl group, a 1,1-dimethyl-2-butynyl group, a 1,1-dimethyl-3-butynyl group, a 1,2-dimethyl-3-butynyl group, a 2,2-dimethyl-3-butynyl group, a 3,3-dimethyl-1-butynyl group, a 1-ethyl-2-butynyl group, a 1-ethyl-3-butynyl group, a 1-n-propyl-2-propynyl group, a 2-ethyl-3-butynyl group, a 1-methyl-1-ethyl-2-propynyl group and a 1-isopropyl-2-propynyl group.

Specific examples of the alkylcarbonyl group that may be used for $R^{14}$ include a methylcarbonyl group, an ethylcarbonyl group, an n-propylcarbonyl group, an isopropylcarbonyl group, a cyclopropylcarbonyl group, an n-butylcarbonyl group, an isobutylcarbonyl group, an s-butylcarbonyl group, a tert-butylcarbonyl group, a cyclobutylcarbonyl group, a 1-methyl-cyclopropylcarbonyl group, a 2-methylcyclopropylcarbonyl group, an n-pentylcarbonyl group, a 1-methyl-n-butylcarbonyl group, a 2-methyl-n-butylcarbonyl group, a 3-methyl-n-butylcarbonyl group, a 1,1-dimethyl-n-propylcarbonyl group, a 1,2-dimethyl-n-propylcarbonyl group, a 2,2-dimethyl-n-propylcarbonyl group, a 1-ethyl-n-propylcarbonyl group, a cyclopentylcarbonyl group, a 1-methyl-cyclobutylcarbonyl group, a 2-methyl-cyclobutylcarbonyl group, a 3-methyl-cyclobutylcarbonyl group, a 1,2-dimethyl-cyclopropylcarbonyl group, a 2,3-dimethyl-cyclopropylcarbonyl group, a 1-ethyl-cyclopropylcarbonyl group, a 2-ethyl-cyclopropylcarbonyl group, an n-hexylcarbonyl group, a 1-methyl-n-pentylcarbonyl group, a 2-methyl-n-pentylcarbonyl group, a 3-methyl-n-pentylcarbonyl group, a 4-methyl-n-pentylcarbonyl group, a 1,1-dimethyl-n-butylcarbonyl group, a 1,2-dimethyl-n-butylcarbonyl group, a 1,3-dimethyl-n-butylcarbonyl group, a 2,2-dimethyl-n-butylcarbonyl group, a 2,3-dimethyl-n-butylcarbonyl group, a 3,3-dimethyl-n-butylcarbonyl group, a 1-ethyl-n-butyl carbonyl group, a 2-ethyl-n-butylcarbonyl group, a 1,1,2-trimethyl-n-propylcarbonyl group, a 1,2,2-trimethyl-n-propylcarbonyl group, a 1-ethyl-1-methyl-n-propylcarbonyl group, a 1-ethyl-2-methyl-n-propylcarbonyl group, a cyclohexylcarbonyl group, a 1-methyl-cyclopentylcarbonyl group, a 2-methyl-cyclopentylcarbonyl group, a 3-methyl-cyclopentylcarbonyl group, a 1-ethyl-cyclobutylcarbonyl group, a 2-ethyl-cyclobutylcarbonyl group, a 3-ethyl-cyclobutylcarbonyl group, a 1,2-dimethyl-cyclobutylcarbonyl group, a 1,3-dimethyl-cyclobutylcarbonyl group, a 2,2-dimethyl-cyclobutylcarbonyl group, a 2,3-dimethyl-cyclobutylcarbonyl group, a 2,4-dimethyl-cyclobutylcarbonyl group, a 3,3-dimethyl-cyclobutylcarbonyl group, a 1-n-propyl-cyclopropylcarbonyl group, a 2-n-propyl-cyclopropylcarbonyl group, a 1-isopropyl-cyclopropylcarbonyl group, a 2-isopropyl-cyclopropylcarbonyl group, a 1,2,2-trimethyl-cyclopropylcarbonyl group, a 1,2,3-trimethyl-cyclopropylcarbonyl group, a 2,2,3-trimethyl-cyclopropylcarbonyl group, a 1-ethyl-2-methyl-cyclopropylcarbonyl group, a 2-ethyl-1-methyl-cyclopropylcarbonyl group, a 2-ethyl-2-methyl-cyclopropylcarbonyl group and a 2-ethyl-3-methyl-cyclopropylcarbonyl group.

Specific examples of the alkylcarbonylamino group that may be used for $R^{14}$ a methylcarbonylamino group, an ethylcarbonylamino group, an n-propylcarbonylamino group, an isopropylcarbonylamino group, a cyclopropylcarbonylamino group, an n-butylcarbonylamino group, an isobutylcarbonylamino group, an s-butylcarbonylamino group, a tert-butylcarbonylamino group, a cyclobutylcarbonylamino group, a 1-methyl-cyclopropylcarbonylamino group, a 2-methyl-cyclopropylcarbonylamino group, an n-pentylcarbonylamino group, a 1-methyl-n-butylcarbonylamino group, a 2-methyl-n-butylcarbonylamino group, a 3-methyl-n-butylcarbonylamino group, a 1,1-dimethyl-n-propylcarbonylamino group, a 1,2-dimethyl-n-propylcarbonylamino group, a 2,2-dimethyl-n-propylcarbonylamino group, a 1-ethyl-n-propylcarbonylamino group, a cyclopentylcarbonylamino group, a 1-methyl-cyclobutylcarbonylamino group, a 2-methyl-cyclobutylcarbonylamino group, a 3-methyl-cyclobutylcarbonylamino group, a 1,2-dimethyl-cyclopropylcarbonylamino group, a 2,3-dimethyl-cyclopropylcarbonylamino group, a 1-ethyl-cyclopropylcarbonylamino group, a 2-ethyl-cyclopropylcarbonylamino group, an n-hexylcarbonylamino group, a 1-methyl-n-pentylcarbonylamino group, a 2-methyl-n-pentylcarbonylamino group, a 3-methyl-n-pentylcarbonylamino group, a 4-methyl-n-pentylcarbonylamino group, a 1,1-dimethyl-n-butylcarbonylamino group, a 1,2-dimethyl-n-butylcarbonylamino group, a 1,3-dimethyl-n-butylcarbonylamino group, a 2,2-dimethyl-n-butylcarbonylamino group, a 2,3-dimethyl-n-butylcarbonylamino group, a 3,3-dimethyl-n-butylcarbonylamino group, a 1-ethyl-n-butylcarbonylamino group, a 2-ethyl-n-butylcarbonylamino group, a 1,1,2-trimethyl-n-propylcarbonylamino group, a 1,2,2-trimethyl-n-propylcarbonylamino group, a 1-ethyl-1-methyl-n-propylcarbonylamino group, a 1-ethyl-2-methyl-n-propylcarbonylamino group, a cyclohexylcarbonylamino group, a 1-methyl-cyclopentylcarbonylamino group, a 2-methyl-cyclopentylcarbonylamino group, a 3-methyl-cyclopentylcarbonylamino group, a 1-ethyl-cyclobutylcarbonylamino group, a 2-ethyl-cyclobutylcarbonylamino group, a 3-ethyl-cyclobutylcarbonylamino group, a 1,2-dimethyl-cyclobutylcarbonylamino group, a 1,3-dimethyl-cyclobutylcarbonylamino group, a 2,2-dimethyl-cyclobutylcarbonylamino group, a 2,3-dimethyl-cyclobutylcarbonylamino group, a 2,4-dimethyl-cyclobutylcarbonylamino group, a 3,3-dimethyl-cyclobutylcarbonylamino group, a 1-n-propyl-cyclopropylcarbonylamino group, a 2-n-propyl-cyclopropylcarbonylamino group, a 1-isopropyl-cyclopropylcarbonylamino group, a 2-isopropyl-cyclopropylcarbonylamino group, a 1,2,2-trimethyl-cyclopropylcarbonylamino group, a 1,2,3-trimethyl-cyclopropylcarbonylamino group, a 2,2,3-trimethyl-cyclopropylcarbonylamino group, a 1-ethyl-2-methyl-cyclopropylcarbonylamino group, a 2-ethyl-1-methyl-cyclopropylcarbonylamino group, a 2-ethyl-2-methyl-cyclopropylcarbonylamino group and a 2-ethyl-3-methyl-cyclopropylcarbonylamino group.

Specific examples of the alkyloxyalkyl group that may be used for $R^{14}$ include a methyloxymethyl group, an ethyloxyethyl group, an ethyloxymethyl group, a propyloxypropyl group, a propyloxymethyl group, and a tert-butyloxy-tert-butyl group.

Specific examples of the alkylamino groups that may be used for $R^{14}$ include a methylamino group, an ethylamino group, an n-propylamino group, an isopropylamino group, a cyclopropylamino group, an n-butylamino group, an isobutylamino group, an s-butylamino group, a tert-butylamino group, a cyclobutylamino group, a 1-methyl-cyclopropylamino group, a 2-methyl-cyclopropylamino group, an n-pentylamino group, a 1-methyl-n-butylamino group, a 2-methyl-n-butylamino group, a 3-methyl-n-butylamino group and a 1,1-dimethyl-n-propylamino group.

Specific examples of the alkyldiamino groups that may be used for $R^{14}$ include a methyldiamino group, an ethyldiamino group, an n-propyldiamino group, an isopropyldiamino group, a cyclopropyldiamino group, an n-butyldiamino group, an isobutyldiamino group, an s-butyldiamino group, a tert-butyldiamino group, a cyclobutyldiamino group, a 1-methyl-cyclopropyldiamino group, a 2-methyl-cyclopropyldiamino group, an n-pentyldiamino group, a 1-methyl-n-butyldiamino group, a 2-methyl-n-butyldiamino group, a 3-methyl-n-butyldiamino group and a 1,1-dimethyl-n-propyldiamino group.

In an embodiment in which the floating cross-linking agent is a polyglycidil ether, the floating cross-linking agent has the following structure:

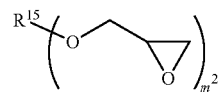

where $m^2$ represented an integer of 2 to 6 and $R^{15}$ represents (similar to the groups described above with respect to the polyether polyol) an alkyl group having 1 to 10 carbon atom(s), an alkenyl group having 2 to 6 carbon atoms, an alkynyl group having 2 to 10 carbon atoms, alkylcarbonyl group having 2 to 10 carbon atoms, an alkylcarbonylamino group having 2 to 10 carbon atoms, an alkyloxyalkyl group having 2 to 10 carbon atoms, an alkylamino group having 1 to 10 carbon atom(s), an alkyldiamino group having 1 to 10 carbon atom(s) or a combination thereof; has either a straight, branched, or cyclic structure; and is an organic group capable of having a valence number of 2 to 6 according to the number m of glycidyl ether groups.

In an embodiment in which the floating cross-linking agent is a vinyl ether, the floating cross-linking agent has the following structure:

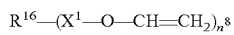

where $n^8$ is from one to six; $R^{16}$ is an aryl group or an alkyl group; and $X^1$ is an alkyl, alkoxys, carboxys, or combinations thereof.

In particular embodiments in which the floating cross-linking agent is a vinyl ether, the floating cross-linking agent has one of the following structures:

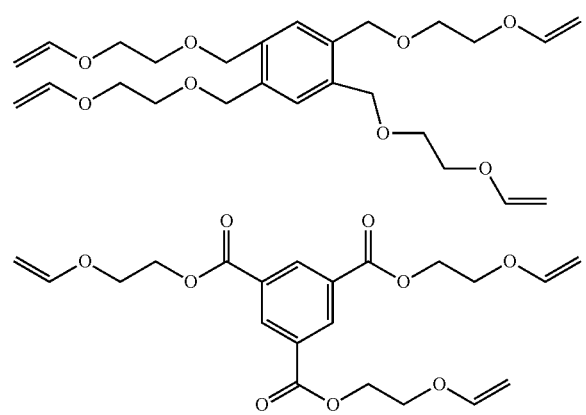

In an embodiment in which the floating cross-linking agent is a glycouril, the floating cross-linking agent may be a methylated glycouril such as a methoxy methylated glycouril. In a particular embodiment in which the floating cross-linking agent is a methoxy methylated glycouril the floating cross-linking agent has the following structure:

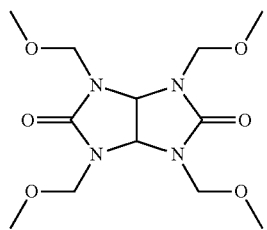

In an embodiment in which the floating cross-linker is a triazene, the floating cross-linker may be such triazenes as 3,3-dimethyl-1-phenylenetriaze, an aryl group containing 3,3-dimethyl-1-phylenetriazene, or bis(triazene). In a particular embodiment, the floating cross-linking agent that is a triazene with the following structure:

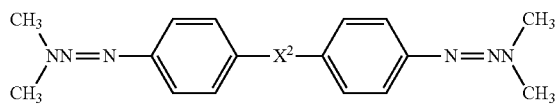

In an embodiment the floating cross-linking agent also comprises a substituted fluorine atom that has been incorporated into the structure of the floating cross-linking agent. In a particular embodiment the fluorine atom may be incorporated into the cross-linking structure as one or more fluorine atoms substituted for, e.g., a hydrogen atom within an alkyl group located within the structure of the floating cross-linking agent.

Alternatively, the fluorine atom may be part of an alkyl fluoride group that is substituted into the structure of the floating cross-linking agent. As particular examples, the fluorine atom may be incorporated into an alkyl fluoride group that has one of the following structures:

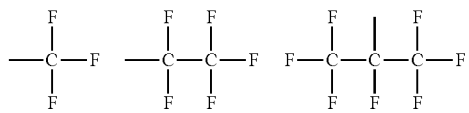

However, any suitable number of carbon and fluorine atoms may alternatively be utilized.

Additionally, as one of ordinary skill in the art will recognize, the precise examples listed above regarding the structures and groups that may be used within the floating cross-linking agent are merely intended to be illustrative and are not intended to list every possible structure or groups that may be utilized to form the floating cross-linking agent. Any suitable alternative structures and any suitable alternative groups may be utilized to form the floating cross-linking agent. All such structures and groups are fully intended to be included within the scope of the embodiments.

The individual components of the BARC layer 105 may be placed into the BARC solvent in order to aid in the mixing and placement of the BARC layer 105. To aid in the mixing and placement of the BARC layer 105, the solvent is chosen at least in part based upon the materials and monomers chosen for the polymer resin of the BARC layer 105 as well as the catalyst. In particular, the BARC solvent is chosen such that the polymer resin, the catalysts, and the floating cross-linking agent can be evenly dissolved into the BARC solvent and dispensed upon the substrate 101 and the fins 103.

In an embodiment the BARC solvent may be an organic solvent, and may comprise any suitable solvent such as ketones, alcohols, polyalcohols, ethers, glycol ethers, cyclic ethers, aromatic hydrocarbons, esters, propionates, lactates, lactic esters, alkylene glycol monoalkyl ethers, alkyl lactates, alkyl alkoxypropionates, cyclic lactones, monoketone compounds that contain a ring, alkylene carbonates, alkyl alkoxyacetate, alkyl pyruvates, ethylene glycol alkyl ether acetates, diethylene glycols, propylene glycol alkyl ether acetates, alkylene glycol alkyl ether esters, alkylene glycol monoalkyl esters, or the like.

Specific examples of materials that may be used as the BARC solvent include, acetone, methanol, ethanol, toluene, xylene, 4-hydroxy-4-methyl-2-pentatone, tetrahydrofuran, methyl ethyl ketone, cyclohexanone, methyl isoamyl ketone, 2-heptanone, ethylene glycol, ethylene glycol monoacetate, ethylene glycol dimethyl ether, ethylene glycol methylethyl ether, ethylene glycol monoethyl ether, methyl cellosolve acetate, ethyl cellosolve acetate, diethylene glycol, diethylene glycol monoacetate, diethylene glycol monomethyl ether, diethylene glycol diethyl ether, diethylene glycol dimethyl ether, diethylene glycol ethylmethyl ether, diethylene glycol monoethyl ether, diethylene glycol monobutyl ether, ethyl 2-hydroxypropionate, methyl 2-hydroxy-2-methylpropionate, ethyl 2-hydroxy-2-methylpropionate, ethyl ethoxyacetate, ethyl hydroxyacetate, methyl 2-hydroxy-2-methylbutanate, methyl 3-methoxypropionate, ethyl 3-methoxypropionate, methyl 3-ethoxypropionate, ethyl 3-ethoxypropionate, ethyl acetate, butyl acetate, methyl lactate and ethyl lactate, propylene glycol, propylene glycol monoacetate, propylene glycol monoethyl ether acetate, propylene glycol monomethyl ether acetate, propylene glycol monopropyl methyl ether acetate, propylene glycol monobutyl ether acetate, propylene glycol monobutyl ether acetate, propylene glycol monomethyl ether propionate, propylene glycol monoethyl ether propionate, propylene glycol methyl ether adcetate, proplylene glycol ethyl ether acetate, ethylene glycol monomethyl ether acetate, ethylene glycol monoethyl ether acetate, propylene glycol monomethyl ether, propylene glycol monoethyl ether, propylene glycol monopropyl ether, propylene glycol monobutyl ether, ethylene glycol monomethyl ether, ethylene glycol monoethyl ether, propyl lactate, and butyl lactate, ethyl 3-ethoxypropionate, methyl 3-methoxypropionate, methyl 3-ethoxypropionate, and ethyl 3-methoxypropionate, β-propiolactone, β-butyrolactone, γ-butyrolactone, α-methyl-γ-butyrolactone, β-methyl-γ-butyrolactone, γ-valerolactone, γ-caprolactone, γ-octanoic lactone, α-hydroxy-γ-butyrolactone, 2-butanone, 3-methylbutanone, pinacolone, 2-pentanone, 3-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexene-2-one, 3-pentene-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone, 3-methylcycloheptanone, pylene carbonate, vinylene carbonate, ethylene carbonate, and butylene carbonate, acetate-2-methoxyethyl, acetate-2-ethoxyethyl, acetate-2-(2-ethoxyethoxyl)ethyl, acetate-3-methoxy-3-methylbutyl, acetate-1-methoxy-2-propyl, dipropylene glycol, monomethylether, monoethylether, monopropylether, monobutylehter, monophenylether, dipropylene glycol monoacetate, dioxane, methyl acetate, ethyl acetate, butyl acetate, methyl puruvate, ethyl puruvate, propyl pyruvate, methyl methoxypropionate, ethyl ethoxypropionate, n-methylpyrrolidone (NMP), 2-methoxyethyl ether (diglyme), ethylene glycol monom-ethyl ether, propylene glycol monomethyl ether; methyl proponiate, ethyl proponiate and ethyl ethoxy proponiate, methylethyl ketone, cyclohexanone, 2-heptanone, carbon dioxide, cyclopentatone, cyclohexanone, ethyl 3-ethocypropionate, ethyl lactate, propylene glycol methyl ether acetate (PGMEA), methylene cellosolve, butyle acetate, and 2-ethoxyethanol, N-methylformamide, N,N-dimethylformamide, N-methylformanilide, N-methylacetamide, N,N-dimethylacetamide, N-methylpyrrolidone, dimethylsulfoxide, benzyl ethyl ether, dihexyl ether, acetonylacetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate, phenyl cellosolve acetate, or the like.

However, as one of ordinary skill in the art will recognize, the materials listed and described above as examples of materials that may be utilized for the solvent component of the BARC layer 105 are merely illustrative and are not intended to limit the embodiments. Rather, any suitable material that may dissolve the polymer resin, the catalyst, and the floating cross-linking layer may alternatively be utilized to help mix and apply the BARC layer 105. All such materials are fully intended to be included within the scope of the embodiments.

Additionally, other components may also be added into the material for the BARC layer 105 if desired. For example, in an embodiment the monomeric dyes, surface leveling agents, adhesion promoters, anti-foaming agent, and the like, may alternatively be utilized. Any suitable additive may be added into the material for the BARC layer 105, and all such additives are fully intended to be included within the scope of the embodiments.

In an embodiment the polymer resin, the catalysts, and the floating cross-linking agent, along with any desired additives or other agents, are added to the BARC solvent to form the material for the BARC layer 105. Once added, the mixture is then mixed in order to achieve an even and constant composition throughout the material for the BARC layer 105 in order to ensure that there are no defects caused by an uneven mixing or non-constant composition of the material for the BARC layer 105. Once mixed together, the material for the BARC layer 105 may either be stored prior to its usage or else used immediately.

In its original mixed form, the material for the BARC layer 105 may comprise a constant composition of components, with the polymer resin having a concentration of between about 0.1% and about 60%, the catalyst having a concentration of between about 0.01% and about 10%, and the floating cross-linking agent having a concentration of between about 0.01% and about 30%. However, while these concentrations are illustrative, any suitable combinations of the various components of the material for the BARC layer 105 may be used, and all such combinations are fully intended to be included within the scope of the embodiments.

Once the material for the BARC layer 105 has been prepared, the material for the BARC layer 105 may be utilized by initially applying the material for the BARC layer 105 onto the substrate 101 and the fins 103. The material for the BARC layer 105 may be applied to the substrate 101 and the fins 103 so that the material for the BARC layer 105 coats an upper exposed surface of the substrate 101 and the fins 103, and may be applied using a process such as a spin-on coating process, a dip coating method, an air-knife coating method, a curtain coating method, a wire-bar coating method, a gravure coating method, a lamination method, an extrusion coating method, combinations of these, or the like. In an embodiment the material for the BARC layer 105 may be initially applied such that it has a constant concentration and has a thickness over a top of the fins 103 of between about 10 nm and about 1000 nm, such as about 100 nm.

In another embodiment the BARC layer 105 may not utilize the polymer resin, the catalyst, and the cross-linking agent as described above, the BARC layer 105 may comprise an anti-reflective material such as double bonded or triple bonded silicon, silicon nitride, titanium, titanium nitride, aluminum, aluminum oxide, silicon oxynitride, combinations of these, or the like. In this embodiment the BARC layer 105 may be formed using a deposition process such as chemical vapor deposition (CVD), physical vapor deposition (PVD), or the like. However, any suitable material and method of formation may be used.

Figure 2:
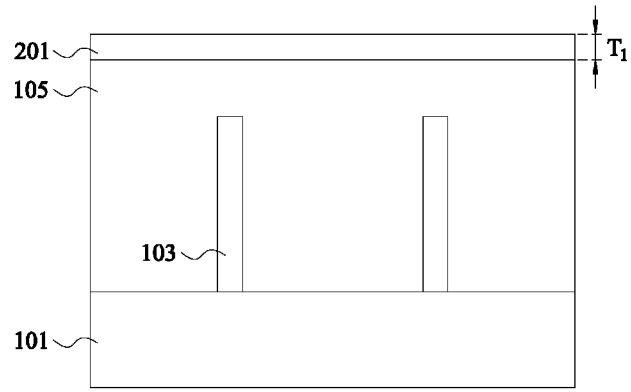
FIG. 2 illustrates a formation of a floating region in accordance with an embodiment.

FIG. 2 illustrates the floating cross-linker forming a floating region 201 along a top surface of the BARC layer 105. In an embodiment the floating cross-linker will move to the top of the BARC layer 105 as the BARC layer 105 is being applied, e.g., in the spin-on process. This movement is initiated because the addition of the fluorine atom causes the floating cross-linker to have a high surface energy. This high surface energy, coupled with the low interaction between the fluorine atoms and the other atoms within the BARC layer 105, will initiate the movement of the floating cross-linker to the top surface of the BARC layer 105.

In an embodiment with the formation of the floating region 201, the floating region 201 will have a higher concentration of the floating cross-linker than a remainder of the BARC layer 105, such as by having a concentration of between about 0.01% and about 10%, such as about 2%, while the remainder of the BARC layer 105 (outside of the floating region 201) will have a concentration of the floating cross-linker no greater than about 5%. Additionally, the floating region 201 will have a thickness $T_1$ of less than about 50% of the overall thickness of the BARC layer 105, such as between about 10 Å and about 1000 Å, such as about 100 Å. However, these dimensions and concentrations may vary and are intended to be illustrative only, and any benefits may be derived from suitable concentrations different from those listed herein.

Figure 3:
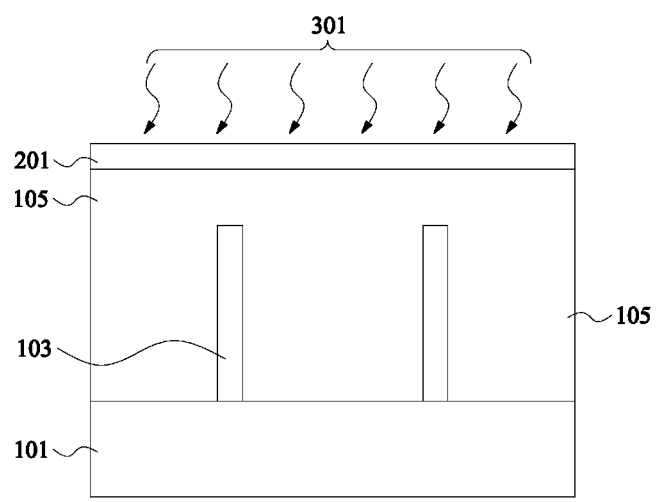
FIG. 3 illustrates a baking process in accordance with an embodiment.

FIG. 3 illustrates a pre-bake of the BARC layer 105 (represented in FIG. 3 by the wavy lines labeled 301), including both the bake itself and its resulting consequences. In an embodiment once the BARC layer 105 has been applied to the substrate 101 and the fins 103, the pre-bake 301 of the BARC layer 105 is performed in order to cure and dry the BARC layer 105 prior to an application of the photoresist 401. The curing and drying of the BARC layer 105 removes a portion of the BARC solvent components but leaves behind the polymer resin, the catalysts, the cross-linking agent, and other additives. In an embodiment the pre-bake 301 may be performed at a temperature suitable to evaporate the BARC solvent, such as between about 40° C. and 400° C. (such as between about 100° C. and 150° C.), although the precise temperature depends upon the materials chosen for the BARC layer 105. The pre-bake 301 is performed for a time sufficient to cure and dry the BARC layer 105, such as between about 10 seconds to about 5 minutes, such as about 90 seconds. Additionally, the pre-bake will cause the floating cross-linking agent to react with the polymer resin and begin bonding and cross-linking the individual polymers of the polymer resin into larger molecule polymers.

However, as one of ordinary skill in the art will recognize, the curing process described above (in which a thermal bake is performed to cure the BARC layer 105), is merely one illustrative process that may be used to cure the BARC layer 105 and initiate the cross-linking reactions, and is not intended to limit the embodiments. Rather, any suitable curing process, such as exposing the BARC layer 105 to an energy source (e.g., a photolithography exposure with a wavelength between about 10 nm to about 1000 nm), irradiating the BARC layer 105 to cure the BARC layer 105, or even an electrical cure of the BARC layer 105, or the like, may alternatively be utilized. All such curing processes are fully intended to be included within the scope of the embodiments.

When all of the components of the material of the BARC layer 105 have a constant concentration throughout the BARC layer 105, series issues in filling the gap between the fins 103 can occur during the pre-bake 301 in which solvent evaporates and cross-linking occurs. In particular, because the solvent evaporates at the surface of the BARC layer 105, the concentrations of the remaining components will increase, driving the cross-linking reaction to occur faster than within the remainder of the BARC layer 105, such as between the fins 103. As such, voids within the BARC layer 105 may be formed from this uneven reaction between the top of the BARC layer 105 and the remainder of the BARC layer 105.

In addition, the cross-linking reaction itself may cause voids to form. In particular, the cross-linking reaction will produce a number of reaction by-products while the polymers of the polymer resin are bonding to each other. These reaction by-products may vaporize and outgas during the pre-bake 301, causing voids to occur between cross-linked polymers throughout the BARC layer 105.

The cross-linking of the polymers, once mature, will also cause shrinkage to occur. In particular, as the polymers cross-link with each other, the cross-linking density of the BARC layer 105 will go up, resulting in a lower overall volume for the BARC layer 105. This lower volume will generate stresses along the surfaces to which the BARC layer 105 is coated (e.g., the substrate 101 and the fins 103). These stresses can pull the BARC layer 105 away from surface structures and causing voids to form adjacent to the surfaces such as the fins 103.

Additionally, the cross-linking reaction will also change the polymer resins to be more hydrophobic. This change will reduce the adhesion between the BARC layer 105 and the substrate 101. Such a reduction is adhesion, if a large enough reduction, can cause delamination and peeling to occur between the BARC layer 105 and the substrate 101, which can detrimentally affect the performance of the BARC layer 105 during further processing.

Finally, the while all of the above is occurring to form voids and peeling within the BARC layer 105, the combination of the cross-linking reaction and the removal of the solvent will also serve to harden and solidify the materials within the BARC layer 105. This hardening will prevent the materials from flowing into the voids or the peeling, preventing the materials of the BARC layer 105 from correcting the voids and peeling.

However, with the inclusion of the floating cross-linking agent and the formation of the floating region 201, the floating cross-linking agent will be located along the top surface of the BARC layer 105. As such, the cross-linking reaction will occur primarily within the floating region 201 with the remainder of the BARC layer 105 that is not located within the floating region 201 having fewer cross-linking reactions and, thus, fewer polymers cross-linking.

Given this, the cross-linking reaction will occur primarily across the top surface of the BARC layer 105, thereby providing the desired protection against the photoresist 401 which will be subsequently applied as well as providing the desired anti-reflective properties. However, the cross-linking reaction elsewhere within the BARC layer 105 will be reduced, leading to a reduction in all of the subsequent problems caused by excessive cross-linking. In particular, there will be no significant film shrinkage outside of the floating region 201 and there will be no significant cross-linking reaction by-products to outgas outside of the floating region 201, thereby avoiding the formation of voids. Additionally, by avoiding the cross-linking reaction along the interface of the BARC layer 105 and the substrate 101, the hydrophilicity of the BARC layer 105 will remain unchanged, leaving the adhesion the same and avoiding or reducing adhesion problems between the BARC layer 105 and the substrate 101. Finally, as the remainder of the BARC layer 105 has fewer cross-linked polymers, the BARC layer 105 may still be able to flow during the course of the cross-linking reactions, thereby filling some voids that may have formed at an early stage of the cross-linking reaction before the pre-bake 301 has been completed.

However, using the floating cross-linking agent is not the only method or material that may be used to form the floating region 201. Rather, any suitable material that is involved within the cross-linking reaction and which may be induced to float to the top surface of the BARC layer 105 and form the floating region 201 may alternatively be used. All such materials and methods are fully intended to be included within the scope of the embodiments.

For example, instead of using a floating cross-linking agent, in one alternative embodiment a floating polymer resin may be utilized instead of the floating cross-linking agent. In this embodiment the floating polymer resin may comprise a polymer resin as described above with respect to FIG. 1, but in which a fluorine atom has been substituted into the structure. For example, in an embodiment in which the floating polymer resin comprises an alkyl group, the fluorine atom may be substituted for a hydrogen atom within one or more of the alkyl groups of the polymer.

In another embodiment the fluorine atom may be part of a fluoralkyl group that is substituted into the polymer of the polymer resin. As a particular example, the fluorine atom may be incorporated into a fluoroalkyl groups such as the fluoroalkyl groups discussed above with respect to the floating cross-linking agent (e.g., $CF_3$, $C_2F_5$, $C_3F_7$, etc.). In an embodiment in which the polymer resin comprises an alkyl group, the fluoralkyl group may be substituted into the polymer resin to form the floating polymer resin by replacing one of the alkyl groups with the fluoroalkyl group to form the floating polymer resin.

In this embodiment, instead of the floating cross-linking agent described above with respect to FIG. 1, the cross-linking agent may be similar to the cross-linking agent described above for the floating cross-linking agent (without the addition of the fluorine atom). Alternatively, the cross-linking agent may be a melamine based agent, a urea based agent, ethylene urea based agent, propylene urea based agent, glycoluril based agent, an aliphatic cyclic hydrocarbon having a hydroxyl group, a hydroxyalkyl group, or a combination of these, oxygen containing derivatives of the aliphatic cyclic hydrocarbon, glycoluril compounds, etherified amino resins, combinations of these, or the like.

Specific examples of materials that may be utilized as a cross-linking agent include melamine, acetoguanamine, benzoguanamine, urea, ethylene urea, or glycoluril with formaldehyde, glycoluril with a combination of formaldehyde and a lower alcohol, hexamethoxymethylmelamine, bismethoxymethylurea, bismethoxymethylbismethoxyethylene urea, tetramethoxymethylglycoluril, and tetrabutoxymethylglycoluril, mono-, di-, tri-, or tetra-hydroxymethylated glycoluril, mono-, di-, tri-, and/or tetra-methoxymethylated glycoluril, mono-, di-, tri-, and/or tetra-ethoxymethylated glycoluril, mono-, di-, tri-, and/or tetra-propoxymethylated glycoluril, and mono-, di-, tri-, and/or tetra-butoxymethylated glycoluril, 2,3-dihydroxy-5-hydroxymethylnorbornane, 2-hydroy-5,6-bis(hydroxymethyl) norbornane, cyclohexanedimethanol, 3,4,8(or 9)-trihydroxytricyclodecane, 2-methyl-2-adamantanol, 1,4-dioxane-2,3-diol and 1,3,5-trihydroxycyclohexane, tetramethoxymethyl glycoluril, methylpropyltetramethoxymethyl glycoluril, and methylphenyltetramethoxymethylglycoluril, 2,6-bis(hydroxymethyl)p-cresol, N-methoxymethyl- or N-butoxymethyl-melamine. Additionally, compounds obtained by reacting formaldehyde, or formaldehyde and lower alcohols with amino group-containing compounds, such as melamine, acetoguanamine, benzoguanamine, urea, ethylene urea and glycoluril, and substituting the hydrogen atoms of the amino group with hydroxymethyl group or lower alkoxymethyl group, examples being hexamethoxymethylmelamine, bismethoxymethyl urea, bismethoxymethylbismethoxyethylene urea, tetramethoxymethyl glycoluril and tetrabutoxymethyl glycoluril, copolymers of 3-chloro-2-hydroxypropyl methacrylate and methacrylic acid, copolymers of 3-chloro-2-hydroxypropyl methacrylate and cyclohexyl methacrylate and methacrylic acid, copolymers of 3-chloro-2-hydroxypropyl methacrylate and benzyl methacrylate and methacrylic acid, bisphenol A-di(3-chloro-2-hydroxypropyl) ether, poly(3-chloro-2-hydroxypro-pyl)ether of a phenol novolak resin, pentaerythritol tetra(3-chloro-2-hydroxypropyl)ether, trimethylolmethane tri(3-chloro-2-hydroxypropyl)ether phenol, bisphenol A-di(3-acetoxy-2-hydroxypropyl)ether, poly(3-acetoxy-2-hydroxypropyl)ethe-r of a phenol novolak resin, pentaerythritol tetra(3-acetoxy-2-hydroxyprop-yl)ether, pentaerythritol poly(3-chloroacetoxy-2-hydroxypropyl)ether, trimethylolmethane tri(3-acetoxy-2-hydroxypropyl)ether, combinations of these, or the like.

In this embodiment in which the floating polymer resin is utilized instead of the floating cross-linking agent, the floating polymer resin may have an initial concentration within the material for the BARC layer 105 of between about 0.1% and about 60%, while the cross-linking agent may have an initial concentration of between about 0.01% and about 30%. The material for the BARC layer 105 may be dispersed as described above with respect to FIG. 1 (e.g., a spin-on process) so that the BARC layer 105 initially has a constant concentration when it is dispersed.

However, similar to the embodiment described above with respect to FIG. 2, once dispersed, the floating polymer resin, with the addition of the fluorine atom, will rise to the top of the BARC layer 105, forming the floating region 201 (see FIG. 2), during the dispensing process. With the floating region 201 at the top of the BARC layer 105, the pre-bake process will initiate the cross-linking reaction primarily in the floating region 201 and any cross-linking reactions outside of the floating region 201 will be reduced. By performing the cross-linking reaction adjacent to the top surface of the BARC layer 105, defects caused by voids and delimanation may be reduced or eliminated.

In yet another embodiment, instead of using the floating cross-linking agent or the floating polymer, the floating region 201 may be formed by using a floating catalyst. In this embodiment the floating catalyst may comprise trifluoride catalyst as described above with respect to FIG. 1, but in which a fluorine atom has been substituted into the structure. For example, in an embodiment in which the floating catalyst comprises an alkyl group, the fluorine atom may be substituted for a hydrogen atom within one or more of the alkyl groups of the catalyst.

In another embodiment the fluorine atom may be part of a fluoralkyl group that is substituted into the catalyst. As a particular example, the fluorine atom may be incorporated into a fluoroalkyl groups such as the fluoroalkyl groups discussed above with respect to the floating cross-linking agent (e.g., $CF_3$, $C_2F_5$, $C_3F_7$, etc.). In an embodiment in which the catalyst comprises an alkyl group, the fluoroalkyl group may be substituted into the catalyst to form the floating catalyst by replacing one of the alkyl groups with the fluoroalkyl group to form the floating catalyst.

In specific embodiments, the fluorine atom or fluoroalkyl groups may be substituted into catalysts such as the following:

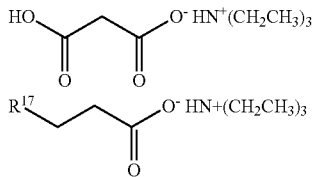

In this embodiment in which the floating catalyst is utilized instead of the floating cross-linking agent or the floating polymer resin, the floating catalyst may have an initial concentration within the material for the BARC layer 105 of between about 0.01% and about 10%. The material for the BARC layer 105 may be dispersed as described above with respect to FIG. 1 (e.g., a spin-on process) so that the material of the BARC layer 105 initially has a constant concentration when it is dispersed.

However, similar to the embodiment described above with respect to FIG. 2, once dispersed, the floating catalyst, with the addition of the fluorine atom, will rise to the top of the BARC layer 105, forming the floating region 201 (see FIG. 2), during the dispensing process. With the floating region 201 at the top of the BARC layer 105, the pre-bake process will initiate the cross-linking reaction only in the floating region 201 and any cross-linking reactions outside of the floating region 201 will be reduced or eliminated, thereby eliminating or reducing voids or delaminating problems.

Figure 4A:
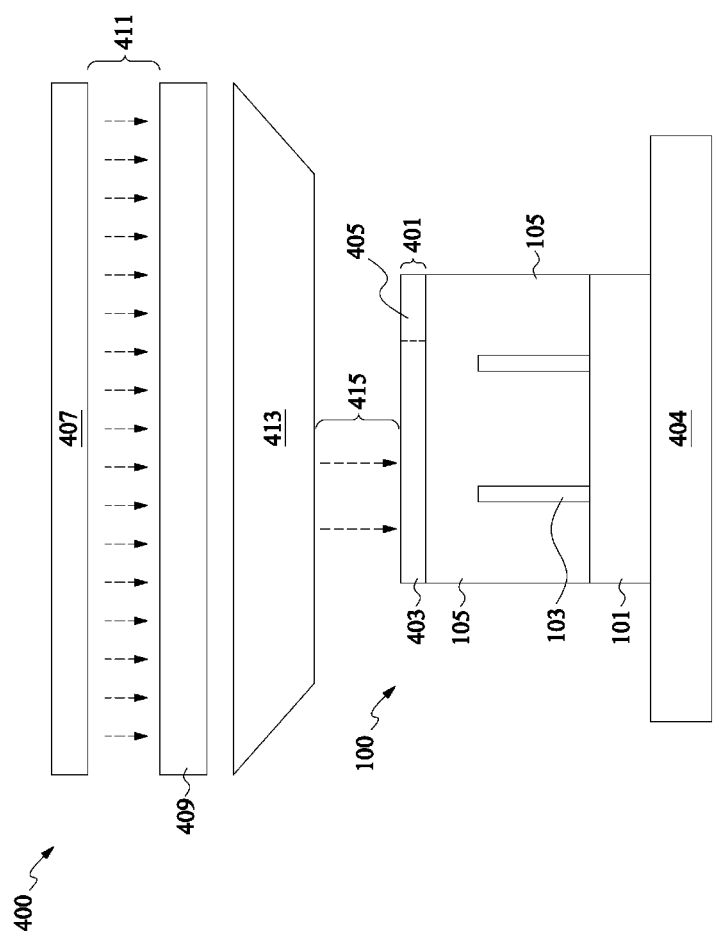
FIGS. 4A-4B illustrate an application, exposure, and development of a photoresist in accordance with an embodiment.
Figure 4B:
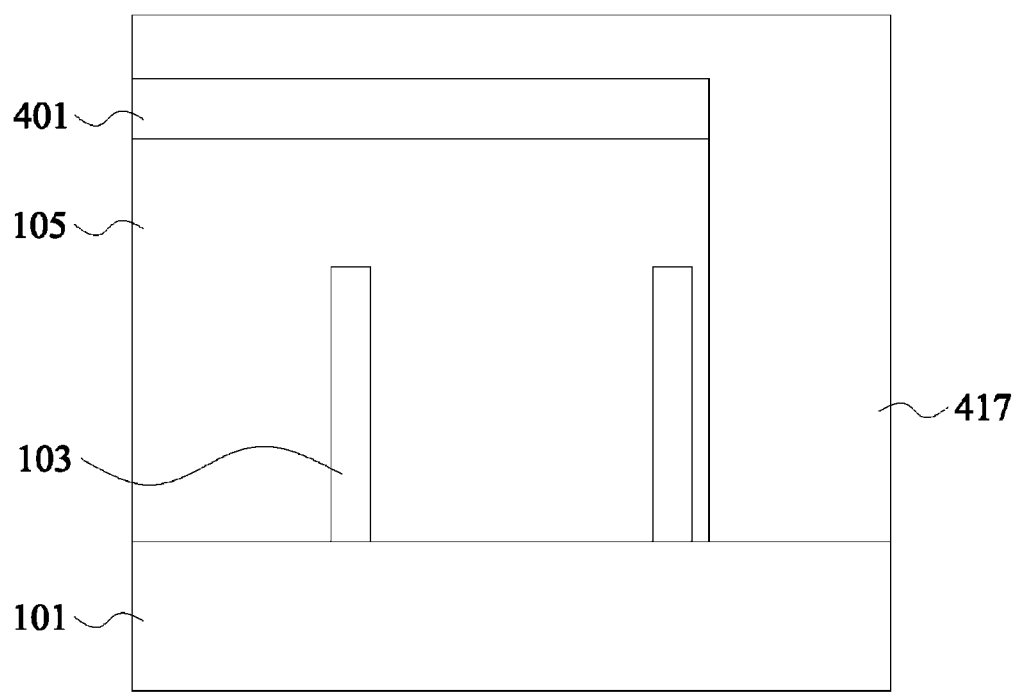

FIGS. 4A-4B illustrates an application, exposure, and development of a photoresist 401 over the BARC layer 105. In an embodiment the photoresist 401 includes a photoresist polymer resin (with a molecular weight of between about 1000 to about 20000) along with one or more photoactive compounds (PACs) in a photoresist solvent. In an embodiment the photoresist polymer resin may comprise a hydrocarbon structure (such as a alicyclic hydrocarbon structure) that contains one or more groups that will decompose (e.g., an acid labile group) or otherwise react when mixed with acids, bases, or free radicals generated by the PACs (as further described below). In an embodiment the hydrocarbon structure comprises a repeating unit that forms a skeletal backbone of the photoresist polymer resin. This repeating unit may include acrylic esters, methacrylic esters, crotonic esters, vinyl esters, maleic diesters, fumaric diesters, itaconic diesters, (meth)acrylonitrile, (meth)acrylamides, styrenes, vinyl ethers, combinations of these, or the like.

Specific structures which may be utilized for the repeating unit of the hydrocarbon structure include methyl acrylate, ethyl acrylate, n-propyl acrylate, isopropyl acrylate, n-butyl acrylate, isobutyl acrylate, tert-butyl acrylate, n-hexyl acrylate, 2-ethylhexyl acrylate, acetoxyethyl acrylate, phenyl acrylate, 2-hydroxyethyl acrylate, 2-methoxyethyl acrylate, 2-ethoxyethyl acrylate, 2-(2-methoxyethoxyl)ethyl acrylate, cyclohexyl acrylate, benzyl acrylate, 2-alkyl-2-adamantyl (meth)acrylate or dialkyl(1-adamantyl)methyl(meth)acrylate, methyl methacrylate, ethyl methacrylate, n-propyl methacrylate, isopropyl methacrylate, n-butyl methacrylate, isobutyl methacrylate, tert-butyl methacrylate, n-hexyl methacrylate, 2-ethylhexyl methacrylate, acetoxyethyl methacrylate, phenyl methacrylate, 2-hydroxyethyl methacrylate, 2-methoxyethyl methacrylate, 2-ethoxyethyl methacrylate, 2-(2-methoxyethoxyl)ethyl methacrylate, cyclohexyl methacrylate, benzyl methacrylate, 3-chloro-2-hydroxypropyl methacrylate, 3-acetoxy-2-hydroxypropyl methacrylate, 3-chloroacetoxy-2-hydroxypropyl methacrylate, butyl crotonate, hexyl crotonate and the like. Examples of the vinyl esters include vinyl acetate, vinyl propionate, vinyl butylate, vinyl methoxyacetate, vinyl benzoate, dimethyl maleate, diethyl maleate, dibutyl maleate, dimethyl fumarate, diethyl fumarate, dibutyl fumarate, dimethyl itaconate, diethyl itaconate, dibutyl itaconate, acrylamide, methyl acrylamide, ethyl acrylamide, propyl acrylamide, n-butyl acrylamide, tert-butyl acrylamide, cyclohexyl acrylamide, 2-methoxyethyl acrylamide, dimethyl acrylamide, diethyl acrylamide, phenyl acrylamide, benzyl acrylamide, methacrylamide, methyl methacrylamide, ethyl methacrylamide, propyl methacrylamide, n-butyl methacrylamide, tert-butyl methacrylamide, cyclohexyl methacrylamide, 2-methoxyethyl methacrylamide, dimethyl methacrylamide, diethyl methacrylamide, phenyl methacrylamide, benzyl methacrylamide, methyl vinyl ether, butyl vinyl ether, hexyl vinyl ether, methoxyethyl vinyl ether, dimethylaminoethyl vinyl ether and the like. Examples of the styrenes include styrene, methyl styrene, dimethyl styrene, trimethyl styrene, ethyl styrene, isopropyl styrene, butyl styrene, methoxy styrene, butoxy styrene, acetoxy styrene, chloro styrene, dichloro styrene, bromo styrene, vinyl methyl benzoate, α-methyl styrene, maleimide, vinylpyridine, vinylpyrrolidone, vinylcarbazole, combinations of these, or the like.

In an embodiment the repeating unit of the hydrocarbon structure may also have either a monocyclic or a polycyclic hydrocarbon structure substituted into it, or else the monocyclic or polycyclic hydrocarbon structure may be the repeating unit, in order to form an alicyclic hydrocarbon structure. Specific examples of monocyclic structures that may be used include bicycloalkane, tricycloalkane, tetracycloalkane, cyclopentane, cyclohexane, or the like. Specific examples of polycyclic structures that may be used include adamantine, norbornane, isobornane, tricyclodecane, tetracycododecane, or the like.

The group which will decompose, otherwise known as a leaving group or, in an embodiment in which the PAC is an photoacid generator, an acid labile group, is attached to the hydrocarbon structure so that it will react with the acids/bases/free radicals generated by the PACs during exposure. In an embodiment the group which will decompose may be a carboxylic acid group, a fluorinated alcohol group, a phenolic alcohol group, a sulfonic group, a sulfonamide group, a sulfonylimido group, an (alkylsulfonyl) (alkylcarbonyl)methylene group, an (alkylsulfonyl)(alkyl-carbonyl) imido group, a bis(alkylcarbonyl)methylene group, a bis (alkylcarbonyl)imido group, a bis(alkylsylfonyl)methylene group, a bis(alkylsulfonyl)imido group, a tris(alkylcarbonyl imido group, a tris(alkylsulfonyl)methylene group, combinations of these, or the like. Specific groups that may be utilized for the fluorinated alcohol group include fluorinated hydroxyalkyl groups, such as a hexafluoroisopropanol group. Specific groups that may be utilized for the carboxylic acid group include acrylic acid groups, methacrylic acid groups, or the like.

In an embodiment the photoresist polymer resin may also comprise other groups attached to the hydrocarbon structure that help to improve a variety of properties of the polymerizable resin. For example, inclusion of a lactone group to the hydrocarbon structure assists to reduce the amount of line edge roughness after the photoresist 401 has been developed, thereby helping to reduce the number of defects that occur during development. In an embodiment the lactone groups may include rings having five to seven members, although any suitable lactone structure may alternatively be used for the lactone group.

The photoresist polymer resin may also comprise groups that can assist in increasing the adhesiveness of the photoresist 401 to underlying structures (e.g., the BARC layer 105). In an embodiment polar groups may be used to help increase the adhesiveness, and polar groups that may be used in this embodiment include hydroxyl groups, cyano groups, or the like, although any suitable polar group may alternatively be utilized.

The photoresist polymer resin may also comprise a chromophore group that can aid with inspection of the photoresist 401. In an embodiment the chromophore group may be part of a chromophore monomer that has been incorporated into the photoresist polymer resin, and may be similar to the chromophore group as described above with respect to the BARC layer 105. However, any suitable chromophore group may alternatively be utilized.

Optionally, the photoresist polymer resin may further comprise one or more alicyclic hydrocarbon structures that do not also contain a group which will decompose. In an embodiment the hydrocarbon structure that does not contain a group which will decompose may include structures such as 1-adamantyl(meth)acrylate, tricyclodecanyl(meth)acrylate, cyclohexayl(meth)acrylate, combinations of these, or the like.

Additionally, in an embodiment in which the photoresist 401 is desired to be a negative tone photoresist, the photoresist polymer resin may comprise a photoresist cross-linking group on a photoresist cross-linking monomer or a polymeric pinacol. In an embodiment the photoresist cross-linking group on the photoresist cross-linking monomer may comprise a hydrocarbon chain that also comprises, e.g., a hydroxyl group, a carboxyl acid group, a carboxylic ester group, epoxy groups, urethane groups, amide groups, combinations of these, and the like. Specific examples of cross-linking monomers that may be utilized include polyhydroxystyrene, poly(hydroxynaphthalene), poly(meth)acrylates, polyarylates, polyesters, polyurethanes, alkyd resins (aliphatic polyesters), poly(hydroxystyrene-methylmethacrylate), homopolymers and/or copolymers obtained by polymerization of at least one of the following monomers: styrene, hydroxystyrene, hydroxyethyl(meth)acrylate, hydroxypropyl(meth)acrylate, methyl(meth)acrylate, ethyl(meth)acrylate, (meth)acrylic acid, poly(4-hydroxystyrene), and poly(pyromellitic dianhydride-ethylene glycol-propylene oxide). During exposure (from the acid generated from, e.g., an photoacid generator discussed further below) the photoresist cross-linking group will react and cross-link in order to increase the molecular weight of the photoresist polymer resin and modify the physical properties of the photoresist polymer resin and make the photoresist 401 more hydrophobic and unable to be dissolved by a an organic solvent (e.g., butyl acetate) or a basic solution (e.g, 2.38% TMAH).

Alternatively in the embodiment in which the photoresist 401 is a negative tone photoresist, the photoresist polymer resin can comprise a pinacol monomer containing a pinacol group. In an embodiment the pinacol monomer will undergo pinacol rearrangement during exposure (from the acid generated from, e.g., an photoacid generator discussed further below) in order to modify the physical properties of the photoresist 401 and make the photoresist 401 more hydrophobic, and unable to be dissolved by a basic solution (e.g, 2.38% TMAH).

Additionally, the photoresist 401 also comprises one or more PACs. The PACs may be photoactive components such as photoacid generators, photobase generators, free-radical generators, or the like, and the PACs may be positive-acting or negative-acting. In an embodiment in which the PACs are a photoacid generator, the PACs may comprise halogenated triazines, onium salts, diazonium salts, aromatic diazonium salts, phosphonium salts, sulfonium salts, iodonium salts, imide sulfonate, oxime sulfonate, diazodisulfone, disulfone, o-nitrobenzylsulfonate, sulfonated esters, halogenerated sulfonyloxy dicarboximides, diazodisulfones, α-cyanooxyamine-sulfonates, imidesulfonates, ketodiazosulfones, sulfonyldiazoesters, 1,2-di(arylsulfonyl)hydrazines, nitrobenzyl esters, and the s-triazine derivatives, suitable combinations of these, and the like.

Specific examples of photoacid generators that may be used include α.-(trifluoromethylsulfonyloxy)-bicyclo[2.2.1]hept-5-ene-2,3-dicarbo-ximide (MDT), N-hydroxy-naphthalimide (DDSN), benzoin tosylate, t-butylphenyl-α-(p-toluenesulfonyloxy)-acetate and t-butyl-α-(p-toluenesulfonyloxy)-acetate, triarylsulfonium and diaryliodonium hexafluoroantimonates, hexafluoroarsenates, trifluoromethanesulfonates, iodonium perfluorooctanesulfonate, N-camphorsulfonyloxynaphthalimide, N-pentafluorophenylsulfonyloxynaphthalimide, ionic iodonium sulfonates such as diaryl iodonium (alkyl or aryl) sulfonate and bis-(di-t-butylphenyl)iodonium camphanylsulfonate, perfluoroalkanesulfonates such as perfluoropentanesulfonate, perfluorooctanesulfonate, perfluoromethanesulfonate, aryl (e.g., phenyl or benzyl)triflates such as triphenylsulfonium triflate or bis-(t-butylphenyl)iodonium triflate; pyrogallol derivatives (e.g., trimesylate of pyrogallol), trifluoromethanesulfonate esters of hydroxyimides, α,α'-bis-sulfonyl-diazomethanes, sulfonate esters of nitro-substituted benzyl alcohols, naphthoquinone-4-diazides, alkyl disulfones, and the like.

In an embodiment in which the PACs are a free-radical generator, the PACs may comprise n-phenylglycine, aromatic ketones such as benzophenone, N,N'-tetramethyl-4,4'-diaminobenzophenone, N,N'-tetraethyl-4,4'-diaminobenzophenone, 4-methoxy-4'-dimethylaminobenzo-phenone, 3,3'-dimethyl-4-methoxybenzophenone, p,p'-bis(dimethylamino)benzo-phenone, p,p'-bis(diethylamino)-benzophenone, anthraquinone, 2-ethylanthraquinone, naphthaquinone and phenanthraquinone, benzoins such as benzoin, benzoinmethylether, benzoinethylether, benzoinisopropylether, benzoin-n-butylether, benzoin-phenylether, methylbenzoin and ethybenzoin, benzyl derivatives such as dibenzyl, benzyldiphenyldisulfide and benzyldimethylketal, acridine derivatives such as 9-phenylacridine and 1,7-bis(9-acridinyl)heptane, thioxanthones such as 2-chlorothioxanthone, 2-methylthioxanthone, 2,4-diethylthioxanthone, 2,4-dimethylthioxanthone and 2-isopropylthioxanthone, acetophenones such as 1,1-dichloroacetophenone, p-t-butyldichloro-acetophenone, 2,2-diethoxyacetophenone, 2,2-dimethoxy-2-phenylacetophenone, and 2,2-dichloro-4-phenoxyacetophenone, 2,4,5-triarylimidazole dimers such as 2-(o-chlorophenyl)-4,5-diphenylimidazole dimer, 2-(o-chlorophenyl)-4,5-di-(m-methoxyphenyl imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer, 2,4-di(p-methoxyphenyl)-5-phenylimidazole dimer, 2-(2,4- dimethoxyphenyl)-4,5-diphenylimidazole dimer and 2-(p-methylmercaptophenyl)-4,5-diphenylimidazole dimmer, suitable combinations of these, or the like.

In an embodiment in which the PACs are a photobase generator, the PACs may comprise quaternary ammonium dithiocarbamates, a aminoketones, oxime-urethane containing molecules such as dibenzophenoneoxime hexamethylene diurethan, ammonium tetraorganylborate salts, and N-(2-nitrobenzyloxycarbonyl) cyclic amines, suitable combinations of these, or the like. However, as one of ordinary skill in the art will recognize, the chemical compounds listed herein are merely intended as illustrated examples of the PACs and are not intended to limit the embodiments to only those PACs specifically described. Rather, any suitable PAC may alternatively be utilized, and all such PACs are fully intended to be included within the scope of the present embodiments.

The individual components of the photoresist 401 may be placed into a photoresist solvent in order to aid in the mixing and placement of the photoresist 401. To aid in the mixing and placement of the photoresist 401, the photoresist solvent is chosen at least in part based upon the materials chosen for the photoresist polymer resin as well as the PACs. In particular, the photoresist solvent is chosen such that the photoresist polymer resin and the PACs can be evenly dissolved into the photoresist solvent and dispensed upon the BARC layer 105.

In an embodiment the photoresist solvent may be an organic solvent, and may comprise any suitable solvent such as ketones, alcohols, polyalcohols, ethers, glycol ethers, cyclic ethers, aromatic hydrocarbons, esters, propionates, lactates, lactic esters, alkylene glycol monoalkyl ethers, alkyl lactates, alkyl alkoxypropionates, cyclic lactones, monoketone compounds that contain a ring, alkylene carbonates, alkyl alkoxyacetate, alkyl pyruvates, lactate esters, ethylene glycol alkyl ether acetates, diethylene glycols, propylene glycol alkyl ether acetates, alkylene glycol alkyl ether esters, alkylene glycol monoalkyl esters, or the like.

Specific examples of materials that may be used as the photoresist solvent for the photoresist 401 include, acetone, methanol, ethanol, toluene, xylene, 4-hydroxy-4-methyl-2-pentatone, tetrahydrofuran, methyl ethyl ketone, cyclohexanone, methyl isoamyl ketone, 2-heptanone, ethylene glycol, ethylene glycol monoacetate, ethylene glycol dimethyl ether, ethylene glycol methylethyl ether, ethylene glycol monoethyl ether, methyl cellosolve acetate, ethyl cellosolve acetate, diethylene glycol, diethylene glycol monoacetate, diethylene glycol monomethyl ether, diethylene glycol diethyl ether, diethylene glycol dimethyl ether, diethylene glycol ethylmethyl ether, diethylene glycol monoethyl ether, diethylene glycol monobutyl ether, ethyl 2-hydroxypropionate, methyl 2-hydroxy-2-methylpropionate, ethyl 2-hydroxy-2-methylpropionate, ethyl ethoxyacetate, ethyl hydroxyacetate, methyl 2-hydroxy-2-methylbutanate, methyl 3-methoxypropionate, ethyl 3-methoxypropionate, methyl 3-ethoxypropionate, ethyl 3-ethoxypropionate, ethyl acetate, butyl acetate, methyl lactate and ethyl lactate, propylene glycol, propylene glycol monoacetate, propylene glycol monoethyl ether acetate, propylene glycol monomethyl ether acetate, propylene glycol monopropyl methyl ether acetate, propylene glycol monobutyl ether acetate, propylene glycol monobutyl ether acetate, propylene glycol monomethyl ether propionate, propylene glycol monoethyl ether propionate, propylene glycol methyl ether adcetate, proplylene glycol ethyl ether acetate, ethylene glycol monomethyl ether acetate, ethylene glycol monoethyl ether acetate, propylene glycol monomethyl ether, propylene glycol monoethyl ether, propylene glycol monopropyl ether, propylene glycol monobutyl ether, ethylene glycol monomethyl ether, ethylene glycol monoethyl ether, propyl lactate, and butyl lactate, ethyl 3-ethoxypropionate, methyl 3-methoxypropionate, methyl 3-ethoxypropionate, and ethyl 3-methoxypropionate, β-propiolactone, β-butyrolactone, γ-butyrolactone, α-methyl-γ-butyrolactone, β-methyl-γ-butyrolactone, γ-valerolactone, γ-caprolactone, γ-octanoic lactone, α-hydroxy-γ-butyrolactone, 2-butanone, 3-methylbutanone, pinacolone, 2-pentanone, 3-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexene-2-one, 3-pentene-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone, 3-methylcycloheptanone, pylene carbonate, vinylene carbonate, ethylene carbonate, and butylene carbonate, acetate-2-methoxyethyl, acetate-2-ethoxyethyl, acetate-2-(2-ethoxyethoxyl)ethyl, acetate-3-methoxy-3-methylbutyl, acetate-1-methoxy-2-propyl, dipropylene glycol, monomethylether, monoethylether, monopropylether, monobutylehter, monopheylether, dipropylene glycol monoacetate, dioxane, methyl acetate, ethyl acetate, butyl acetate, methyl puruvate, ethyl puruvate, propyl pyruvate, methyl methoxypropionate, ethyl ethoxypropionate, n-methylpyrrolidone (NMP), 2-methoxyethyl ether (diglyme), ethylene glycol monom-ethyl ether, propylene glycol monomethyl ether; methyl proponiate, ethyl proponiate and ethyl ethoxy proponiate, methylethyl ketone, cyclohexanone, 2-heptanone, carbon dioxide, cyclopentatone, cyclohexanone, ethyl 3-ethocypropionate, ethyl lactate, propylene glycol methyl ether acetate (PGMEA), methylene cellosolve, butyle acetate, and 2-ethoxyethanol, N-methylformamide, N,N-dimethylformamide, N-methylformanilide, N-methylacetamide, N,N-dimethylacetamide, N-methylpyrrolidone, dimethylsulfoxide, benzyl ethyl ether, dihexyl ether, acetonylacetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate, phenyl cellosolve acetate, or the like.

However, as one of ordinary skill in the art will recognize, the materials listed and described above as examples of materials that may be utilized for the photoresist solvent component of the photoresist 401 are merely illustrative and are not intended to limit the embodiments. Rather, any suitable material that may dissolve the photoresist polymer resin and the PACs may alternatively be utilized to help mix and apply the photoresist 401. All such materials are fully intended to be included within the scope of the embodiments.

Additionally, while individual ones of the above described materials may be used as the photoresist solvent for the photoresist 401, in alternative embodiments more than one of the above described materials may be utilized. For example, the photoresist solvent may comprise a combination mixture of two or more of the materials described.

All such combinations are fully intended to be included within the scope of the embodiments.

Optionally, a photoresist cross-linking agent may also be added to the photoresist 401. The photoresist cross-linking agent reacts with the photoresist polymer resin within the photoresist 401 after exposure, assisting in increasing the cross-linking density of the photoresist, which helps to improve the resist pattern and resistance to dry etching. In an embodiment the photoresist cross-linking agent may be an melamine based agent, a urea based agent, ethylene urea based agent, propylene urea based agent, glycoluril based agent, an aliphatic cyclic hydrocarbon having a hydroxyl group, a hydroxyalkyl group, or a combination of these, oxygen containing derivatives of the aliphatic cyclic hydrocarbon, glycoluril compounds, etherified amino resins, combinations of these, or the like.

Specific examples of materials that may be utilized as a photoresist cross-linking agent include melamine, acetoguanamine, benzoguanamine, urea, ethylene urea, or glycoluril with formaldehyde, glycoluril with a combination of formaldehyde and a lower alcohol, hexamethoxymethylmelamine, bismethoxymethylurea, bismethoxymethylbismethoxyethylene urea, tetramethoxymethylglycoluril, and tetrabutoxymethylglycoluril, mono-, di-, tri-, or tetra-hydroxymethylated glycoluril, mono-, di-, tri-, and/or tetra-methoxymethylated glycoluril, mono-, di-, tri-, and/or tetra-ethoxymethylated glycoluril, mono-, di-, tri-, and/or tetra-propoxymethylated glycoluril, and mono-, di-, tri-, and/or tetra-butoxymethylated glycoluril, 2,3-dihydroxy-5-hydroxymethylnorbornane, 2-hydroy-5,6-bis(hydroxymethyl) norbornane, cyclohexanedimethanol, 3,4,8(or 9)-trihydroxytricyclodecane, 2-methyl-2-adamantanol, 1,4-dioxane-2,3-diol and 1,3,5-trihydroxycyclohexane, tetramethoxymethyl glycoluril, methylpropyltetramethoxymethyl glycoluril, and methylphenyltetramethoxymethylglycoluril, 2,6-bis(hydroxymethyl)p-cresol, N-methoxymethyl- or N-butoxymethyl-melamine. Additionally, compounds obtained by reacting formaldehyde, or formaldehyde and lower alcohols with amino group-containing compounds, such as melamine, acetoguanamine, benzoguanamine, urea, ethylene urea and glycoluril, and substituting the hydrogen atoms of the amino group with hydroxymethyl group or lower alkoxymethyl group, examples being hexamethoxymethylmelamine, bismethoxymethyl urea, bismethoxymethylbismethoxyethylene urea, tetramethoxymethyl glycoluril and tetrabutoxymethyl glycoluril, copolymers of 3-chloro-2-hydroxypropyl methacrylate and methacrylic acid, copolymers of 3-chloro-2-hydroxypropyl methacrylate and cyclohexyl methacrylate and methacrylic acid, copolymers of 3-chloro-2-hydroxypropyl methacrylate and benzyl methacrylate and methacrylic acid, bisphenol A-di(3-chloro-2-hydroxypropyl) ether, poly(3-chloro-2-hydroxypro-pyl)ether of a phenol novolak resin, pentaerythritol tetra(3-chloro-2-hydroxypropyl)ether, trimethylolmethane tri(3-chloro-2-hydroxypropyl)ether phenol, bisphenol A-di(3-acetoxy-2-hydroxypropyl)ether, poly(3-acetoxy-2-hydroxypropyl)ether of a phenol novolak resin, pentaerythritol tetra(3-acetoxy-2-hydroxypropyl)ether, pentaerythritol poly(3-chloroacetoxy-2-hydroxypropyl)ether, trimethylolmethane tri(3-acetoxy-2-hydroxypropyl)ether, combinations of these, or the like.

In addition to the photoresist polymer resins, the PACs, the photoresist solvents, and the photoresist cross-linking agents, the photoresist 401 may also include a number of other additives that will assist the photoresist 401 obtain the highest resolution. For example, the photoresist 401 may also include surfactants in order to help improve the ability of the photoresist 401 to coat the surface on which it is applied. In an embodiment the surfactants may include nonionic surfactants, polymers having fluorinated aliphatic groups, surfactants that contain at least one fluorine atom and/or at least one silicon atom, polyoxyethylene alkyl ethers, polyoxyethylene alkyl aryl ethers, polyoxyethylene-polyoxypropylene block copolymers, sorbitan fatty acid esters, polyoxyethylene sorbitan fatty acid esters.

Specific examples of materials that may be used as surfactants include polyoxyethylene lauryl ether, polyoxyethylene stearyl ether, polyoxyethylene cetyl ether, polyoxyethylene oleyl ether, polyoxyethylene octyl phenol ether, polyoxyethylene nonyl phenol ether, sorbitan monolaurate, sorbitan monopalmitate, sorbitan monostearate, sorbitan monooleate, sorbitan trioleate, sorbitan tristearate, polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate, polyethylene glycol distearate, polyethylene glycol dilaurate, polyethylene glycol, polypropylene glycol, polyoxyethylenestearyl ether and polyoxyethylene cetyl ether; fluorine containing cationic surfactants, fluorine containing nonionic surfactants, fluorine containing anionic surfactants, cationic surfactants and anionic surfactants, combinations of these, or the like.

Another additive that may be added to the photoresist 401 is a quencher, which may be utilized to inhibit diffusion of the generated acids/bases/free radicals within the photoresist, which helps the resist pattern configuration as well as to improve the stability of the photoresist 401 over time. In an embodiment the quencher is an amine such as a second lower aliphatic amine, a tertiary lower aliphatic amine, or the like. Specific examples of amines that may be used include trimethylamine, diethylamine, triethylamine, di-n-propylamine, tri-n-propylamine, tripentylamine, diethanolamine, and triethanolamine, alkanolamine, combinations of these, or the like.

Alternatively, an organic acid may be utilized as the quencher. Specific embodiments of organic acids that may be utilized include malonic acid, citric acid, malic acid, succinic acid, benzoic acid, salicylic acid, phosphorous oxo acid and its derivatives such as phosphoric acid and derivatives thereof such as its esters, such as phosphoric acid, phosphoric acid di-n-butyl ester and phosphoric acid diphenyl ester; phosphonic acid and derivatives thereof such as its ester, such as phosphonic acid, phosphonic acid dimethyl ester, phosphonic acid di-n-butyl ester, phenylphosphonic acid, phosphonic acid diphenyl ester, and phosphonic acid dibenzyl ester; and phosphinic acid and derivatives thereof such as its esters, including phosphinic acid and phenylphosphinic acid.

Another additive that may be added to the photoresist 401 is a stabilizer, which assists in preventing undesired diffusion of the acids generated during exposure of the photoresist 401. In an embodiment the stabilizer may include nitrogenous compounds such as aliphatic primary, secondary, and tertiary amines, cyclic amines such as piperidines, pyrrolidines, morpholines, aromatic heterocycles such as pyridines, pyrimidines, purines, imines such as diazabicycloundecene, guanidines, imides, amides, and others. Alternatively, ammonium salts may also be used for the stabilizer, including ammonium, primary, secondary, tertiary, and quaternary alkyl- and arylammonium salts of alkoxides including hydroxide, phenolates, carboxylates, aryl and alkyl sulfonates, sulfonamides, and others. Other cationic nitrogenous compounds including pyridinium salts and salts of other heterocyclic nitrogenous compounds with anions such as alkoxides including hydroxide, phenolates, carboxylates, aryl and alkyl sulfonates, sulfonamides, and the like may also be employed.

Yet another additive that may be added to the photoresist 401 may be a dissolution inhibitor in order to help control dissolution of the photoresist 401 during development. In an embodiment bile-salt esters may be utilized as the dissolution inhibitor. Specific examples of materials that may be utilized include cholic acid (IV), deoxycholic acid (V), lithocholic acid (VI), t-butyl deoxycholate (VII), t-butyl lithocholate (VIII), and t-butyl-3-α-acetyl lithocholate (IX).

Another additive that may be added to the photoresist 401 may be a plasticizer. Plasticizers may be used to reduce delamination and cracking between the photoresist 401 and underlying layers (e.g., the BARC layer 105) and may comprise monomeric, oligomeric, and polymeric plasticizers such as oligo- and polyethyleneglycol ethers, cycloaliphatic esters, and non-acid reactive steroidally-derived materials. Specific examples of materials that may be used for the plasticizer include dioctyl phthalate, didodecyl phthalate, triethylene glycol dicaprylate, dimethyl glycol phthalate, tricresyl phosphate, dioctyl adipate, dibutyl sebacate, triacetyl glycerine and the like.

Yet another additive that may be added include a coloring agent, which helps observers examine the photoresist 401 and find any defects that may need to be remedied prior to further processing. In an embodiment the coloring agent may be either a triarylmethane dye or, alternatively, may be a fine particle organic pigment. Specific examples of materials that may be used as coloring agents include crystal violet, methyl violet, ethyl violet, oil blue #603, Victoria Pure Blue BOH, malachite green, diamond green, phthalocyanine pigments, azo pigments, carbon black, titanium oxide, brilliant green dye (C. I. 42020), Victoria Pure Blue FGA (Linebrow), Victoria BO (Linebrow) (C. I. 42595), Victoria Blue BO (C. I. 44045) rhodamine 6G (C. I. 45160), Benzophenone compounds such as 2,4-dihydroxybenzophenone and 2,2',4,4'-tetrahydroxybenzophenone, salicylic acid compounds such as phenyl salicylate and 4-t-butylphenyl salicylate, phenylacrylate compounds such as ethyl-2-cyano-3,3-diphenylacrylate, and 2'-ethylhexyl-2-cyano-3,3-diphenylacrylate, benzotriazole compounds such as 2-(2-hydroxy-5-methylphenyl)-2H-benzotriazole, and 2-(3-t-butyl-2-hydroxy-5-methylphenyl)-5-chloro-2H-benzotriazole, coumarin compounds such as 4-methyl-7-diethylamino-1-benzopyran-2-one, thioxanthone compounds such as diethylthioxanthone, stilbene compounds, naphthalic acid compounds, azo dyes, Phthalocyanine blue, phthalocyanine green, iodine green, Victoria blue, naphthalene black, Photopia methyl violet, bromphenol blue and bromcresol green, laser dyes such as Rhodamine G6, Coumarin 500, DCM (4-(dicyanomethylene)-2-methyl-6-(4-dimethylaminostyryl)-4H pyran)), Kiton Red 620, Pyrromethene 580, or the like. Additionally, one or more coloring agents may be used in combination to provide the desired coloring.

Adhesion additives may also be added to the photoresist 401 in order to promote adhesion between the photoresist 401 and an underlying layer upon which the photoresist 401 has been applied (e.g., the BARC layer 105). In an embodiment the adhesion additives include a silane compound with at least one reactive substituent such as a carboxyl group, a methacryloyl group, an isocyanate group and/or an epoxy group. Specific examples of the adhesion components include trimethoxysilyl benzoic acid, γ-methacryloxypropyl trimethoxy silane, vinyltriacetoxysilane, vinyltrimethoxysilane, γ-isocyanatepropyl triethoxy silane, γ-glycidoxypropyl trimethoxy silane, β-(3,4-epoxycyclohexyl)ethyl trimethoxy silane, benzimidazoles and polybenzimidazoles, a lower hydroxyalkyl substituted pyridine derivative, a nitrogen heterocyclic compound, urea, thiourea, 8-oxyquinoline, 4-hydroxypteridine and derivatives, 1,10-phenanthroline and derivatives, 2,2'-bipyridine and derivatives, benzotriazoles; organophosphorus compounds, phenylenediamine compounds, 2-amino-1-phenylethanol, N-phenylethanolamine, N-ethyldiethanolamine, N-ethylethanolamine and derivatives, benzothiazole, and a benzothiazoleamine salt having a cyclohexyl ring and a morpholine ring, 3-glycidoxypropyltrimethoxysilane, 3-glycidoxypropyltriethoxysilane, 3-mercaptopropyltrimethoxysilane, 3-mercaptopropyltriethoxysilane, 3-methacryloyloxypropyltrimethoxysilane, vinyl trimethoxysilane, combinations of these, or the like.

Surface leveling agents may additionally be added to the photoresist 401 in order to assist a top surface of the photoresist 401 to be level so that impinging light will not be adversely modified by an unlevel surface. In an embodiment surface leveling agents may include fluoroaliphatic esters, hydroxyl terminated fluorinated polyethers, fluorinated ethylene glycol polymers, silicones, acrylic polymer leveling agents, combinations of these, or the like.

In an embodiment the photoresist polymer resin and the PACs, along with any desired additives or other agents, are added to the photoresist solvent for application. Once added, the mixture is then mixed in order to achieve an even composition throughout the photoresist 401 in order to ensure that there are no defects caused by an uneven mixing or non-constant composition of the photoresist 401. Once mixed together, the photoresist 401 may either be stored prior to its usage or else used immediately.

Once ready, the photoresist 401 may be utilized by initially applying the photoresist 401 onto the BARC layer 105. The photoresist 401 may be applied to the BARC layer 105 so that the photoresist 401 coats an upper exposed surface of the BARC layer 105, and may be applied using a process such as a spin-on coating process, a dip coating method, an air-knife coating method, a curtain coating method, a wire-bar coating method, a gravure coating method, a lamination method, an extrusion coating method, combinations of these, or the like. In an embodiment the photoresist 401 may be applied such that it has a thickness over the surface of the BARC layer 105 of between about 10 nm and about 300 nm, such as about 150 nm.

Once the photoresist 401 has been applied to the semiconductor substrate, a pre-bake of the photoresist 401 is performed in order to cure and dry the photoresist 401 prior to exposure to finish the application of the photoresist 401. The curing and drying of the photoresist 401 removes the photoresist solvent component while leaving behind the photoresist polymer resin, the PACs, photoresist cross-linking agents, and the other chosen additives. In an embodiment the pre-bake may be performed at a temperature suitable to evaporate the photoresist solvent, such as between about 40° C. and 150° C., although the precise temperature depends upon the materials chosen for the photoresist 401. The pre-bake is performed for a time sufficient to cure and dry the photoresist 401, such as between about 10 seconds to about 5 minutes, such as about 90 seconds.

Once applied, the photoresist 401 may be exposed to form an exposed region 403 and an unexposed region 405 within the photoresist 401. In an embodiment the exposure may be initiated by placing the substrate 101 and the photoresist 401, once cured and dried, into a photoresist imaging device 400 for exposure. The photoresist imaging device 400 may comprise a photoresist support plate 404, a photoresist energy source 407, a patterned mask 409 between the photoresist support plate 404 and the photoresist energy source 407, and photoresist optics 413. In an embodiment the photoresist support plate 404 is a surface to which the semiconductor device 100 and the photoresist 401 may be placed or attached to and which provides support and control to the substrate 101 during exposure of the photoresist 401. Additionally, the photoresist support plate 404 may be movable along one or more axes, as well as providing any desired heating or cooling to the substrate 101 and photoresist 401 in order to prevent temperature gradients from affecting the exposure process.

In an embodiment the photoresist energy source 407 supplies photoresist energy 411 such as light to the photoresist 401 in order to induce a reaction of the PACs, which in turn reacts with the photoresist polymer resin to chemically alter those portions of the photoresist 401 to which the photoresist energy 411 impinges. In an embodiment the photoresist energy 411 may be electromagnetic radiation, such as g-rays (with a wavelength of about 436 nm), i-rays (with a wavelength of about 365 nm), ultraviolet radiation, far ultraviolet radiation, x-rays, electron beams, or the like. The photoresist energy source 407 may be a source of the electromagnetic radiation, and may be a KrF excimer laser light (with a wavelength of 248 nm), an ArF excimer laser light (with a wavelength of 193 nm), a $F_2$ excimer laser light (with a wavelength of 157 nm), or the like, although any other suitable source of photoresist energy 411, such as mercury vapor lamps, xenon lamps, carbon arc lamps or the like, may alternatively be utilized.

The patterned mask 409 is located between the photoresist energy source 407 and the photoresist 401 in order to block portions of the photoresist energy 411 to form a patterned energy 415 prior to the photoresist energy 411 actually impinging upon the photoresist 401. In an embodiment the patterned mask 409 may comprise a series of layers (e.g., substrate, absorbance layers, anti-reflective coating layers, shielding layers, etc.) to reflect, absorb, or otherwise block portions of the photoresist energy 411 from reaching those portions of the photoresist 401 which are not desired to be illuminated. The desired pattern may be formed in the patterned mask 409 by forming openings through the patterned mask 409 in the desired shape of illumination.

Optics (represented in FIG. 4A by the trapezoid labeled 413) may be used to concentrate, expand, reflect, or otherwise control the photoresist energy 411 as it leaves the photoresist energy source 407, is patterned by the patterned mask 409, and is directed towards the photoresist 401. In an embodiment the photoresist optics 413 comprise one or more lenses, minors, filters, combinations of these, or the like to control the photoresist energy 411 along its path. Additionally, while the photoresist optics 413 are illustrated in FIG. 4A as being between the patterned mask 409 and the photoresist 401, elements of the photoresist optics 413 (e.g., individual lenses, mirrors, etc.) may also be located at any location between the photoresist energy source 407 (where the photoresist energy 411 is generated) and the photoresist 401.

In an embodiment the semiconductor device 100 with the photoresist 401 is placed on the photoresist support plate 404. Once the pattern has been aligned to the semiconductor device 100, the photoresist energy source 407 generates the desired photoresist energy 411 (e.g., light) which passes through the patterned mask 409 and the photoresist optics 413 on its way to the photoresist 401. The patterned energy 415 impinging upon portions of the photoresist 401 induces a reaction of the PACs within the photoresist 401. The chemical reaction products of the PACs' absorption of the patterned energy 415 (e.g., acids/bases/free radicals) then reacts with the photoresist polymer resin, chemically altering the photoresist 401 in those portions that were illuminated through the patterned mask 409.

In a specific example in which the patterned energy 415 is a 193 nm wavelength of light, the PAC is a photoacid generator, and the group to be decomposed is a carboxylic acid group on the hydrocarbon structure and a cross linking agent is used, the patterned energy 415 will impinge upon the photoacid generator and the photoacid generator will absorb the impinging patterned energy 415. This absorption initiates the photoacid generator to generate a proton (e.g., a H+ ion) within the photoresist 401. When the proton impacts the carboxylic acid group on the hydrocarbon structure, the proton will react with the carboxylic acid group, chemically altering the carboxylic acid group and altering the properties of the photoresist polymer resin in general. The carboxylic acid group will then react with the photoresist cross-linking agent to cross-link with other photoresist polymer resins within the photoresist 401.

Optionally, the exposure of the photoresist 401 may occur using an immersion lithography technique. In such a technique an immersion medium (not individually illustrated in FIG. 2) may be placed between the photoresist imaging device 400 (and particularly between a final lens of the photoresist optics 413) and the photoresist 401. With this immersion medium in place, the photoresist 401 may be patterned with the patterned energy 415 passing through the immersion medium.

In this embodiment a protective layer (also not individually illustrated in FIG. 4A) may be formed over the photoresist 401 in order to prevent the immersion medium from coming into direct contact with the photoresist 401 and leaching or otherwise adversely affecting the photoresist 401. In an embodiment the protective layer is insoluble within the immersion medium such that the immersion medium will not dissolve it and is immiscible in the photoresist 401 such that the protective layer will not adversely affect the photoresist 401. Additionally, the protective layer is transparent so that the patterned energy 415 may pass through the protective layer without hindrance.

In an embodiment the protective layer comprises a protective layer resin within a protective layer solvent. The material used for the protective layer solvent is, at least in part, dependent upon the components chosen for the photoresist 401, as the protective layer solvent should not dissolve the materials of the photoresist 401 so as to avoid degradation of the photoresist 401 during application and use of the protective layer. In an embodiment the protective layer solvent includes alcohol solvents, fluorinated solvents, and hydrocarbon solvents.

Specific examples of materials that may be utilized for the protective layer solvent include methanol, ethanol, 1-propanol, isopropanol, n-propanol, 1-butanol, 2-butanol, 2-methyl-2-propanol, 3-methyl-1-butanol, isobutyl alcohol, tert-butyl alcohol, 1-pentanol, 2-pentanol, 3-pentanol, n-hexanol, cyclohecanol, 1-hexanol, 1-heptanol, 1-octanol, 2-hexanol, 2-heptanol, 2-octanol, 3-hexanol, 3-heptanol, 3-octanol, 4-octanol, 2-methyl-2-butanol, 3-methyl-1-butanol, 3-methyl-2-butanol, 2-methyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 2,2,3,3,4,4-hexafluoro-1-butanol, 2,2,3,3,4,4,5,5-octafluoro-1-pentanol, 2,2,3,3,4,4,5,5,6,6-decafluoro-1-hexanol, 2,2,3,3,4,4- hexafluoro-1,5-pentanediol, 2,2,3,3,4,4,5,5-octafluoro-1,6-hexanediol, 2,2,3,3,4,4,5,5,6,6,7,7-dodecafluoro-1,8-diol, 2-fluoroanisole, 2,3-difluoroanisole, perfluorohexane, perfluoroheptane, perfluoro-2-pentanone, perfluoro-2-butyltetrahydrofuran, perfluorotetrahydrofuran, perfluorotributylamine, perfluorotetrapentylamine, toluene, xylene and anisole, and aliphatic hydrocarbon solvents, such as n-heptane, n-nonane, n-octane, n-decane, 2-methylheptane, 3-methylheptane, 3,3-dimethylhexane, 2,3,4-trimethylpentane, combinations of these, or the like.

The protective layer resin may, similar to the photoresist 401, comprise a protective layer repeating unit. In an embodiment the protective layer repeating unit may be an acrylic resin with a repeating hydrocarbon structure having a carboxyl group, an alicyclic structure, an alkyl group having one to five carbon atoms, a phenol group, or a fluorine atom-containing group. Specific examples of the alicyclic structure include a cyclohexyl group, an adamantyl group, a norbornyl group, a isobornyl group, a tricyclodecyl group, a tetracyclododecyl group, and the like. Specific examples of the alkyl group include an n-butyl group, an isobutyl group, or the like. However, any suitable protective layer resin may alternatively be utilized.

The protective layer composition may also include additional additives to assist in such things as adhesion, surface leveling, coating, and the like. For example, the protective layer composition may further comprise a protective layer surfactant, although other additives may also be added, and all such additions are fully intended to be included within the scope of the embodiment. In an embodiment the protective layer surfactant may be an alkyl cationic surfactant, an amide-type quaternary cationic surfactant, an ester-type quaternary cationic surfactant, an amine oxide surfactant, a betaine surfactant, an alkoxylate surfactant, a fatty acid ester surfactant, an amide surfactant, an alcohol surfactant, an ethylenediamine surfactant, or a fluorine- and/or silicon-containing surfactant.

Specific examples of materials that may be used for the protective layer surfactant include polyoxyethylene alkyl ethers, such as polyoxyethylene lauryl ether, polyoxyethylene stearyl ether, polyoxyethylene cetyl ether and polyoxyethylene oleyl ether; polyoxyethylene alkyl aryl ethers, such as polyoxyethylene octyl phenol ether and polyoxyethylene nonyl phenol ether; polyoxyethylene-polyooxypropylene block copolymers; sorbitan fatty acid esters, such as sorbitan monolaurate, sorbitan monopalmitate, sorbitan monostearate, sorbitan monooleate, sorbitan trioleate and sorbitan tristearate; and polyoxyethylene sorbitan monolaurate, polyoxyethylene sorbitan monopalmitate, polyoxyethylene sorbitan monostearate, polyoxyethylene sorbitan trioleate and polyoxyethylene sorbitan tristearate.

Prior to application of the protective layer onto the photoresist 401, the protective layer resin and desired additives are first added to the protective layer solvent to form a protective layer composition. The protective layer solvent is then mixed to ensure that the protective layer composition has a consistent concentration throughout the protective layer composition.

Once the protective layer composition is ready for application, the protective layer composition may be applied over the photoresist 401. In an embodiment the application may be performed using a process such as a spin-on coating process, a dip coating method, an air-knife coating method, a curtain coating method, a wire-bar coating method, a gravure coating method, a lamination method, an extrusion coating method, combinations of these, or the like. In an embodiment the protective layer composition may be applied such that it has a thickness over the surface of the photoresist 401 of about 100 nm.

After the protective layer composition has been applied to the photoresist 401, a protective layer pre-bake may be performed in order to remove the protective layer solvent. In an embodiment the protective layer pre-bake may be performed at a temperature suitable to evaporate the protective layer solvent, such as between about 40° C. and 150° C., although the precise temperature depends upon the materials chosen for the protective layer composition. The protective layer pre-bake is performed for a time sufficient to cure and dry the protective layer composition, such as between about 10 seconds to about 5 minutes, such as about 90 seconds.

Once the protective layer has been placed over the photoresist 401, the semiconductor device 100 with the photoresist 401 and the protective layer are placed on the photoresist support plate 404, and the immersion medium may be placed between the protective layer and the photoresist optics 413. In an embodiment the immersion medium is a liquid having a refractive index greater than that of the surrounding atmosphere, such as having a refractive index greater than 1. Examples of the immersion medium may include water, oil, glycerine, glycerol, cycloalkanols, or the like, although any suitable medium may alternatively be utilized.

The placement of the immersion medium between the protective layer and the photoresist optics 413 may be done using, e.g., an air knife method, whereby fresh immersion medium is applied to a region between the protective layer and the photoresist optics 413 and controlled using pressurized gas directed towards the protective layer to form a barrier and keep the immersion medium from spreading. In this embodiment the immersion medium may be applied, used, and removed from the protective layer for recycling so that there is fresh immersion medium used for the actual imaging process.

However, the air knife method described above is not the only method by which the photoresist 401 may be exposed using an immersion method. Any other suitable method for imaging the photoresist 401 using an immersion medium, such as immersing the entire substrate 101 along with the photoresist 401 and the protective layer, using solid barriers instead of gaseous barriers, or using an immersion medium without a protective layer, may also be utilized. Any suitable method for exposing the photoresist 401 through the immersion medium may be used, and all such methods are fully intended to be included within the scope of the embodiments.

After the photoresist 401 has been exposed to the patterned energy 415, a post-exposure baking may be used in order to assist in the generating, dispersing, and reacting of the acid/base/free radical generated from the impingement of the patterned energy 415 upon the PACs during the exposure. Such assistance helps to create or enhance chemical reactions which generate chemical differences between the exposed region 403 and the unexposed region 405 within the photoresist 401. These chemical differences also caused differences in the solubility between the exposed region 403 and the unexposed region 405. In an embodiment this post-exposure baking may occur at temperatures of between about 50° C. and about 160° C. for a period of between about 40 seconds and about 120 seconds.

FIG. 4B illustrates a development of the photoresist 401 with the use of a developer 417 after the photoresist 401 has been exposed. After the photoresist 401 has been exposed and the post-exposure baking has occurred, the photoresist 401 may be developed using either a positive tone developer or a negative tone developer, depending upon the desired pattern for the photoresist 401. In an embodiment in which the exposed region 403 of the photoresist 401 is desired to be removed to form a positive tone, a positive tone developer such as a basic aqueous solution may be utilized to remove those portions of the photoresist 401 which were exposed to the patterned energy 415 and which have had their solubility modified and changed through the chemical reactions. Such basic aqueous solutions may include tetra methyl ammonium hydroxide (TMAH), tetra butyl ammonium hydroxide, sodium hydroxide, potassium hydroxide, sodium carbonate, sodium bicarbonate, sodium silicate, sodium metasilicate, aqueous ammonia, monomethylamine, dimethylamine, trimethylamine, monoethylamine, diethylamine, triethylamine, monoisopropylamine, diisopropylamine, triisopropylamine, monobutylamine, dibutylamine, monoethanolamine, diethanolamine, triethanolamine, dimethylaminoethanol, diethylaminoethanol, potassium metasilicate, sodium carbonate, tetraethylammonium hydroxide, combinations of these, or the like.

If a negative tone development is desired, an organic solvent or critical fluid may be utilized to remove those portions of the photoresist 401 which were not exposed to the energy and, as such, retain their original solubility. Specific examples of materials that may be utilized include hydrocarbon solvents, alcohol solvents, ether solvents, ester solvents, critical fluids, combinations of these, or the like. Specific examples of materials that can be used for the negative tone solvent include hexane, heptane, octane, toluene, xylene, dichloromethane, chloroform, carbon tetrachloride, trichloroethylene, methanol, ethanol, propanol, butanol, critical carbon dioxide, diethyl ether, dipropyl ether, dibutyl ether, ethyl vinyl ether, dioxane, propylene oxide, tetrahydrofuran, cellosolve, methyl cellosolve, butyl cellosolve, methyl carbitol, diethylene glycol monoethyl ether, acetone, methyl ethyl ketone, methyl isobutyl ketone, isophorone, cyclohexanone, methyl acetate, ethyl acetate, propyl acetate, butyl acetate, pyridine, formamide, N,N-dimethyl formamide, or the like.

However, as one of ordinary skill in the art will recognize, the above description of positive tone developers and negative tone developers are only intended to be illustrative and are not intended to limit the embodiments to only the developers listed above. Rather, any suitable type of developer, including acid developers or even water developers, that may be utilized to selectively remove a portion of the photoresist 401 that has a different property (e.g., solubility) than another portion of the photoresist 401, may alternatively be utilized, and all such developers are fully intended to be included within the scope of the embodiments.

In an embodiment in which immersion lithography is utilized to expose the photoresist 401 and a protective layer is utilized to protect the photoresist 401 from the immersion medium, the developer 417 may be chosen to remove not only those portions of the photoresist 401 that are desired to be removed, but may also be chosen to remove the protective layer in the same development step. Alternatively, the protective layer may be removed in a separate process, such as by a separate solvent from the developer 417 or even an etching process to remove the protective layer from the photoresist 401 prior to development.

FIG. 4B illustrates an application of the developer 417 to the photoresist 401 using, e.g., a spin-on process. In this process the developer 417 is applied to the photoresist 401 from above the photoresist 401 while the semiconductor device 100 (and the photoresist 401) is rotated. In an embodiment the developer 417 may be supplied at a flow rate of between about 300 mL/min and about 1000 mL/min, such as about 500 mL/min, while the semiconductor device 100 is being rotated at a speed of between about 500 rpm and about 2500 rpm, such as about 1500 rpm. In an embodiment the developer 417 may be at a temperature of between about 10° C. and about 80° C., such as about 50° C., and the development may continue for between about 1 minute to about 60 minutes, such as about 30 minutes.

However, while the spin-on method described herein is one suitable method for developing the photoresist 401 after exposure, it is intended to be illustrative and is not intended to limit the embodiments. Rather, any suitable method for development, including dip processes, puddle processes, spray-on processes, combinations of these, or the like, may alternatively be used. All such development processes are fully intended to be included within the scope of the embodiments.

FIG. 4B illustrates a cross-section of the development process in an embodiment in which a negative tone developer is used to remove the unexposed regions of the photoresist 401. As illustrated, the developer 417 is applied to the photoresist 401 and dissolves the unexposed region 405 of the photoresist 401. This dissolving and removing of the unexposed region 405 of the photoresist 401 leaves behind an opening within the photoresist 401 that patterns the photoresist 401 in the shape of the patterned energy 415, thereby transferring the pattern of the patterned mask 409 to the photoresist 401.

Once the photoresist 401 has been patterned, the pattern may be transferred to the BARC layer 105. In an embodiment in which the BARC layer 105 remains insoluble to the developer 417, the BARC layer 105 may be removed using an etching process that utilizes the photoresist 401 (now patterned) as a masking layer. The etching process may be a dry etch process utilizing an etchant such as oxygen, nitrogen, hydrogen, ammonia, sulfur hexafluoride, difluoromethane, nitrogen trifluoride, chlorine trifluoride, chlorine, carbon monoxide, carbon dioxide, helium, boron dichloride, argon, fluorine, trifluoromethane, tetrafluoromethane, perfluorocyclobutane, perfluoropropane, combinations of these, or the like. However, any other suitable etch process, such as a wet etch, and any other suitable etchants may alternatively be used.

Alternatively, in an embodiment in which the BARC layer 105 comprises an acid labile group that can react to de-crosslink the cross-linked polymers in the BARC layer 105 and change the solubility of the BARC layer 105, the BARC layer 105 may be patterned during the development process by the developer 417. In particular, during exposure the photoacid generators may generate an acid in the BARC layer 105, which will work to break the cross-linking bonds and change the solubility of the BARC layer 105. Then, in a positive tone development process, a positive tone developer may be used to remove both the photoresist 401 that had been exposed as well as to remove the BARC layer 105 in the same process. Any suitable patterning process, with any suitable number of steps, may be utilized to pattern and remove both the photoresist 401 and the BARC layer 105, and all such processes and steps are fully intended to be included within the scope of the embodiments.

Figure 5:
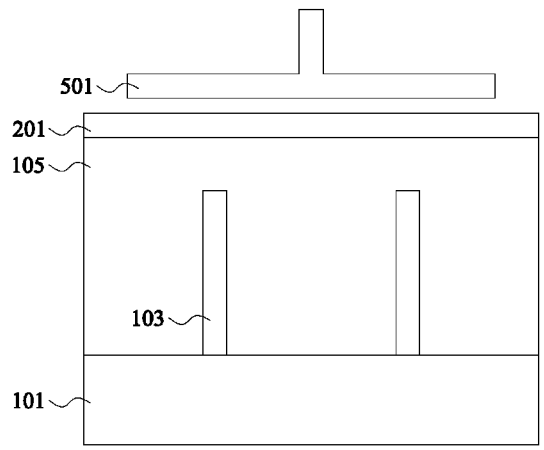
FIG. 5 illustrates another embodiment in which the bottom anti-reflective coating is planarized in a chemical mechanical polishing process in accordance with an embodiment.

FIG. 5 illustrates another embodiment in which the BARC layer 105 is utilized in a physical planarization process such as a chemical mechanical polish (CMP). In a CMP process, a combination of etching materials and abrading materials are put into contact with the BARC layer 105 (or a layer overlying the BARC layer 105, such as the photoresist 401) and a grinding pad 501 is used to grind away the BARC layer 105 (or any layers overlying the BARC layer 105) until a desired thickness is achieved.

In this embodiment the floating region 201 along the top surface of the BARC layer 105 will cause the polymer resin to crosslink within the floating region 201 more than within the remainder of the BARC layer 105. As such, the remainder of the BARC layer 105 (that portion outside of the floating region 201) will have a lower cross-linking density and will remain more flexible than the floating region 201. This flexibility can better withstand the shear forces that are associated with the physical grinding of the chemical mechanical polishing process without a failure such as peeling occurring.

Figure 6:
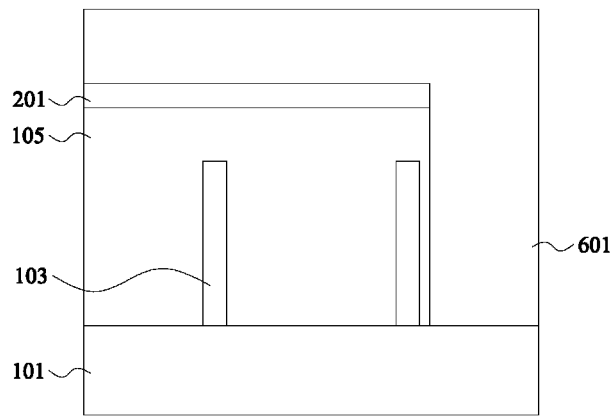
FIG. 6 illustrates a step in the removal of the bottom anti-reflective layer and the floating region in accordance with an embodiment.

FIG. 6 illustrates a removal of the photoresist 401 and the BARC layer 105, with the floating region 201. In an embodiment the photoresist 401 may be removed using, e.g., an ashing process, whereby the temperature of the photoresist 401 is increased until the photoresist 401 undergoes a thermal decomposition. Once thermally decomposed, the photoresist 401 may be physically removed using one or more wash processes.

Once the photoresist 401 has been removed, the BARC layer 105 (with the floating region 201) may be removed using a fluid 601 that will interact with the BARC layer 105 to remove both the floating region 201 as well as the remainder of the BARC layer 105. In an embodiment, the fluid 601 is a fluid that will interact either physically, chemically, or through columbic forces in order to effectuate a removal of the BARC layer 105. In a particular embodiment the fluid 601 may comprise an aqueous solution. When the fluid is an aqueous solution, the aqueous solution may be either acidic (e.g., with a pH of between about −1 to 4) or basic (with a pH of between about 9 to 14). The pH in these embodiments may be adjusted as desired using either organic or inorganic acids or bases (as described further below).

Alternatively, a wet cleaning process may be used to remove the BARC layer 105. In an embodiment in which a wet clean process is utilized, a solution such as an SC-1 or SC-2 cleaning solution may be utilized, although other solutions, such as a mixture of $H_2SO_4$ and $H_2O_2$ (known as SPM), or a solution of hydrogen fluoride (HF), may alternatively be utilized. Any suitable solution or process that may be used to remove the BARC layer 105 are fully intended to be included within the scope of the embodiments.

Alternatively, the fluid 601 may be an organic solvent. In this embodiment the fluid 601 may be an ester, an ether, an amide, an alcohol, an anhydride, or an alkane, with between 2 and 30 carbon atoms. However, any other suitable organic solvent, such as the BARC solvent or photoresist solvent, discussed above, may alternatively be utilized.

The fluid 601 may be applied to the BARC layer 105 using, e.g., a wet etch process. In an embodiment the BARC layer 105 and the floating region 201 are immersed in the fluid 601 using, e.g., a dip process, a puddle process, a spray-on process, combinations of these, or the like. The fluid 601 may have a temperature of between about 30° C. and about 150° C., such as about 50° C.

However, because the floating region 201 has a greater amount of cross-linking within it than the remainder of the BARC layer 105, the floating region 201 also has a greater density than the remainder of the BARC layer 105. As such, the floating region 201 will also have a different rate of removal from the fluid 601 than the remainder of the BARC layer 105. In a particular embodiment the floating region 201 will have a lower rate of removal than the remainder of the BARC layer 105.

Given that the remainder of the BARC layer 105 has a faster removal rate than the floating region 201, the BARC layer 105 (including the floating region 201) can be removed at a much faster rate than other BARC layers that may not have the floating region 201. These other BARC layers (without the floating region 201) may have a constant cross-linking and constant density, which may not see any removal until at least 10 minutes after immersion. As such, in an embodiment in which the BARC layer 105 and the floating region 201 are immersed in the fluid 601, the immersion may be performed for a time of less than about 1 minute.

In an embodiment in which the fluid 601 uses chemical reactions to remove the BARC layer 105 and the floating region 201, the fluid 601 may react with the BARC layer 105 in a number of methods in order to effectuate the removal. For example, the chemical reaction may be an oxidation/reduction reaction, an acid/base reaction, a substitution reaction, an addition reaction, combinations, of these, or the like. For example, the fluid 601 may comprise an inorganic acid (e.g., sulfonic acid, hydrochloric acid, sulfuric acid), an organic acid (e.g., acetic acid), an inorganic base (e.g., sodium hydroxide or potassium hydroxide), or an organic base (e.g., triethylamine, pyridine, methylamine, tetramethylammonium hydroxide, tetrabutylammonium hydroxide, choline_guanidine, imidazole, Organolithiums or Grignard reagent) in order to react with the BARC layer 105. Any suitable type of chemical reaction may be utilized in order to remove the BARC layer 105 and the floating region 201.

Alternatively, in an embodiment in which the removal process uses the fluid 601 to use physical forces to remove the BARC layer 105 and the floating region 201, the physical forces could be columbic forces, whereby the fluid 601 is utilized to modify the surface energy of the BARC layer 105. By modifying the surface energy, the adhesion between the BARC layer 105 and the underlying layers (e.g., the substrate and the fins 103) may be reduced or eliminated, thereby at least partially releasing the BARC layer 105 from its adhesion with the underlying layers and allowing the BARC layer 105 to be removed from the underlying layers.

The fluid 601 may further comprise additives that either assist in the physical properties of the fluid 601 or else assist in the chemical reactions between the fluid 601 and the BARC layer 105. In an embodiment the fluid 601 may additionally include a surfactant. In an embodiment the surfactant may include nonionic surfactants, polymers having fluorinated aliphatic groups, surfactants that contain at least one fluorine atom and/or at least one silicon atom, polyoxyethylene alkyl ethers, polyoxyethylene alkyl aryl ethers, polyoxyethylene-polyoxypropylene block copolymers, sorbitan fatty acid esters, polyoxyethylene sorbitan fatty acid esters.

Specific examples of materials that may be used as surfactants include polyoxyethylene lauryl ether, polyoxyethylene stearyl ether, polyoxyethylene cetyl ether, polyoxyethylene oleyl ether, polyoxyethylene octyl phenol ether, polyoxyethylene nonyl phenol ether, sorbitan monolaurate, sorbitan monopalmitate, sorbitan monostearate, sorbitan monooleate, sorbitan trioleate, sorbitan tristearate, polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate, polyethylene glycol distearate, polyethylene glycol dilaurate, polyethylene glycol, polypropylene glycol, polyoxyethylenestearyl ether and polyoxyethylene cetyl ether; fluorine containing cationic surfactants, fluorine containing nonionic surfactants, fluorine containing anionic surfactants, cationic surfactants and anionic surfactants, combinations of these, or the like.

Additionally, the fluid 601 may also comprise additional components that may help stabilize or control the physical properties of the fluid 601. For example, the fluid 601 may comprise a component such as ozone, which may be used to stabilize the fluid 601 as well as act as a surfactant, hydrogen peroxide, and/or carbon dioxide, which may be useful in modifying a surface charge. Any suitable materials may be included within the fluid 601 in order to help control the fluid 601, and all such materials are fully intended to be included within the scope of the embodiments.

In particular embodiments, the fluid 601 may be a solution within a Standard Clean 1 (SC-1) cleaning process or a sulfuric peroxide mixture (SPM). For example, in the embodiment in which the fluid 601 is an SC-1 fluid, the fluid 601 may be a solution of ammonium hydroxide ($NH_4OH$), hydrogen peroxide ($H_2O_2$), and water in a suitable ratio (such as a 1:1:5 ratio). Such a solution will remove both the floating region 201 as well as the remainder of the BARC layer 105.

By utilizing the fluid 601 such that it will remove the BARC layer 105 with the floating region 201, the overall removal time of the BARC layer 105 may be reduced relative to a BARC layer without the floating region 201. For example, without the floating region 201, wherein the entire BARC layer may have a constant density and a constant cross-linking, the removal may be much more difficult and time consuming, sometimes taking well over 10 minutes to ensure an effective removal of the BARC layer. However, by incorporating the floating region 201, the removal of the overall BARC layer 105 (which has differing regions of density), may be effectuated at a much greater pace, such that an effective removal of the BARC layer 105 may be performed with much less time, such as less than about 1 minute.

Additionally, as one of ordinary skill in the art will recognize, the embodiments described above which utilize the BARC layer 105 to fill voids between the fins 103 over the substrate 101 are merely intended to be illustrative and are not intended to be limiting to the embodiments. Rather, any suitable type of substrate 101 with any suitable type of structures on the substrate 101 may alternatively be utilized. For example, in an embodiment in which the substrate 101 is conductive, the substrate 101 may be formed of a conductive material using processes similar to the processes used for the metallization layers (e.g., damascene, dual damascene, deposition, etc.). In a particular embodiment in which the substrate 101 is conductive, the conductive material for the substrate 101 comprises at least one metal, metal alloy, metal nitride, metal sulfide, metal selenide, metal oxide, or metal silicide. For example, the conductive material can have the formula $MX^3$, where M is a metal and $X^3$ is nitrogen, silicon, selenium, or oxygen and wherein a is between 0.4 and 2.5. Particular examples include copper, titanium, aluminum, cobalt, ruthenium, titanium nitride, tungsten nitride ($WN_2$), and tantalum nitride, although any suitable material may alternatively be utilized.

In yet another embodiment the substrate 101 is a dielectric layer with a dielectric constant between about 1 to about 40. In this embodiment the substrate 101 comprises silicon, a metal oxide, or a metal nitride with a formula of $MX^4$, where M is a metal or silicon, $X^4$ is nitrogen or oxygen, and b is between about 0.4 and 2.5. In particular examples the dielectric layer for the substrate 101 may be silicon oxide, silicon nitride, aluminum oxide, hafnium oxide, lanthanum oxide, or the like, formed using such processes as deposition, oxidation, or the like.

Figure 7:
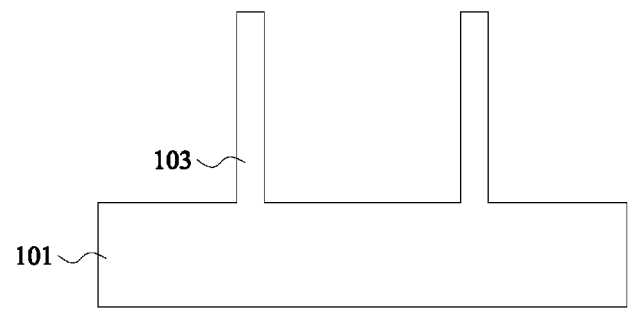
FIG. 7 illustrates a removal of the bottom anti-reflective layer and the floating region in accordance with an embodiment.

FIG. 7 illustrates a removal of the fluid 601 after the BARC layer 105 (including the floating region 201) has been removed. As can be seen, the removal of the fluid 601 and the BARC layer 105 leaves behind the substrate 101 and the fins 103. Once the BARC layer 105 has been removed, additional processing may be performed on the fins 103, such as by forming multiple-gate transistors from the fins 103.

Figure 8:
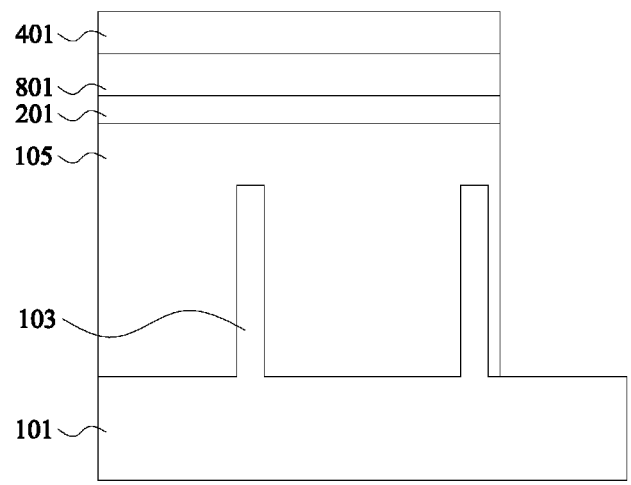
FIG. 8 illustrates a middle layer used in conjunction with the bottom anti-reflective layer in accordance with an embodiment.

FIG. 8 illustrates another embodiment in which the BARC layer 105 (with the floating region 201) is utilized along with a middle layer 801 that is placed on the BARC layer 105 after the floating region 201 has been formed. In an embodiment the middle layer 801 may be an organic layer or inorganic layer that has a different etch resistance than the photoresist 401 and the BARC layer 105. In one embodiment the middle layer 801 comprises at least one etching resistance molecule such as a low onishi number structure, a double bond structure, a triple bond structure, titanium, titanium nitride, aluminum, aluminum oxide, silicon oxynitride, or the like.

In another particular embodiment the middle layer 801 is a hard mask material such as silicon, silicon nitride, oxides, oxynitrides, silicon carbide, combinations of these, or the like. The hard mask material for the middle layer 801 may be formed through a process such as chemical vapor deposition (CVD), although other processes, such as plasma enhanced chemical vapor deposition (PECVD), low pressure chemical vapor deposition (LPCVD), spin-on coating, or even silicon oxide formation followed by nitridation, may alternatively be utilized. Any suitable method or combination of methods to form or otherwise place the hard mask material may be utilized, and all such methods or combinations are fully intended to be included within the scope of the embodiments. The middle layer 801 may be formed to a thickness of between about 100 Å and about 800 Å, such as about 300 Å.

In another embodiment the middle layer 801 may be formed by initially placing a middle layer resin such as an organo-silicon polymer within a middle layer solvent. In an embodiment the organo-silicon polymer comprises a polymer based on monomers of polysilsesquioxane or polysiloxane, such as a polymer comprising monomers of a polyhedral oligomeric silsesquioxane. However, any suitable polymer comprising one or more of these monomers or other suitable monomers, may alternatively be utilized.

Additionally, the middle layer resin may also comprise one or more monomers with a middle layer chromophore unit. In an embodiment the middle layer chromophore unit may be similar to the chromophore unit described above with respect to the BARC layer 105. For example, in an embodiment the middle layer chromophore unit may be a vinyl compound with conjugated double bonds. However, any suitable group may alternatively be utilized.

To assist in curing the middle layer resin, the middle layer resin may also comprise a middle layer cross-linking group. In an embodiment the middle layer cross-linking group may be part of a middle layer cross-linking monomer incorporated into the middle layer polymer resin, and the middle layer cross-linking monomer may be similar to the cross-linking monomer described above with respect to the BARC layer 105. For example, the middle layer cross-linking monomer may be a siloxane that contains an OR group, wherein R could be a methyl group, an ethyl group, or a hydrocarbon chain that also comprises, e.g., a hydroxyl group, a carboxyl acid group, a carboxylic ester group, epoxy groups, urethane groups, amide groups, combinations of the, and the like. However, any suitable cross-linking group may alternatively be utilized.

In an embodiment the middle layer polymer resin may be placed into the middle layer solvent along with a middle layer catalyst for dispersion onto the BARC layer 105. In an embodiment the middle layer solvent may be any suitable solvent that can absorb the middle layer polymer resin (along with any desired additives) and be removable using, e.g. a post-placement bake, without absorbing the BARC layer 105 upon which the middle layer 801 will be applied. As such, while the material utilized for the middle layer solvent is dependent at least in part upon the material for the BARC layer 105, in some embodiments the middle layer solvent may comprise butanol, isobutanol, isopentanon, IPA, propylene glycol monomethyl ether (PGME), propylene glycol monomethyl ether acetate (PGMEA), ethyl lactate, propylene glycol n-propyl ether (PnP), cyclohexanone, tetrahydrofuran (THF), dimethyl formamide (DMF), γ-butyrolactone, 2-heptanone, N-methylpyrollidinone, combinations of these, or the like.

The middle layer catalyst may be placed within the middle layer solvent along with the middle layer polymer resin in order to initiate the chemical reactions during the post-placement bake. In an embodiment the middle layer catalyst may be similar to the catalyst discussed above with respect to the BARC layer 105. For example, the catalyst may be a thermal acid generator, a photoacid generator, a photobase generator, suitable combinations of these, or the like. However, any suitable catalyst may alternatively be utilized for the middle layer catalyst.

Additives may optionally be placed along with the middle layer polymer resin and the middle layer catalyst into the middle layer solvent. In an embodiment one such additive is a middle layer cross-linking additive, which may be similar to the cross-linking agent (without the addition of the fluorine atom) as described above with respect to the BARC layer 105. For example, the middle layer cross-linking agent may comprise a melamine or a glycouril. However, any suitable cross-linking agent may also be utilized.

Once the middle layer polymer resin and the middle layer catalyst have been placed within the middle layer solvent (along with any desired middle layer additives), the middle layer polymer resin and the middle layer catalyst within the middle layer solvent may be utilized by initially applying the material for the middle layer 801 onto the BARC layer 105. The material for the middle layer 801 may be applied to the BARC layer 105 so that the material for the middle layer 801 coats an upper exposed surface of the BARC layer 105, and may be applied using a process such as a spin-on coating process, a dip coating method, an air-knife coating method, a curtain coating method, a wire-bar coating method, a gravure coating method, a lamination method, an extrusion coating method, combinations of these, or the like.

In an embodiment once the middle layer 801 has been applied to the BARC layer 105, a pre-bake of the middle layer 801 is performed in order to cure and dry the middle layer 801 prior to an application of the photoresist 401. The curing and drying of the middle layer 801 removes a portion of the middle layer solvent components but leaves behind the middle layer polymer resin, the middle layer catalysts, the middle layer cross-linking agent, and any other additives that are present. In an embodiment the pre-bake may be performed at a temperature suitable to evaporate the middle layer solvent, such as between about 40° C. and 400° C. (such as between about 100° C. and 150° C.), although the precise temperature depends at least in part upon the materials chosen for the middle layer 801. The pre-bake is performed for a time sufficient to cure and dry the middle layer 801, such as between about 10 seconds to about 5 minutes, such as about 90 seconds. Additionally, the pre-bake will cause the middle layer cross-linking agent and to react with the middle layer polymer resin and begin bonding and cross-linking the individual polymers of the middle layer polymer resin into larger molecule polymers.

However, as one of ordinary skill in the art will recognize, the curing process described above (in which a thermal bake is performed to cure the middle layer 801), is merely one illustrative process that may be used to cure the middle layer 801 and initiate the cross-linking reactions, and is not intended to limit the embodiments. Rather, any suitable curing process, such as exposing the middle layer 801 to an energy source (e.g., a photolithography exposure with a wavelength between about 10 nm to about 1000 nm), irradiating the middle layer 801 to cure the middle layer 801, or even an electrical cure of the middle layer 801, or the like, may alternatively be utilized. All such curing processes are fully intended to be included within the scope of the embodiments.

Once a layer of the hard mask material for the middle layer 801 has been formed, the photoresist 401 may be placed and patterned over the hard mask material for the middle layer 801. The placement of the photoresist 401 over the hard mask material for the middle layer 801 and the patterning of the photoresist 401 may be similar to the placement of the photoresist 401 and the development of the photoresist 401 as described above with respect to FIGS. 1-4B. For example, the photoresist 401 may be placed using a spin-on process, illuminated using the photoresist imaging device 400, and then developed using the developer 417.

FIG. 8 also illustrates that, once the photoresist 401 has been patterned into the desired pattern, the photoresist 401 may be used as a mask to pattern the hard mask material of the middle layer 801. For example, the pattern of the photoresist 401 may be transferred to the middle layer 801 using an anisotropic etching process such as reactive ion etching (RIE), whereby ions of a suitable etchant such as $CF_4/O_2$, may be utilized in a dry etch to remove portions of the middle layer 801 exposed by the patterned photoresist 401. However, any other suitable etchant, such as $CHF_3/O_2$, $CH_2F_2$, $CH_3F$, or the like, and any other suitable method of removal, such as a wet stripping, may alternatively be used.

FIG. 8 further illustrates that once the pattern of the photoresist 401 has been transferred to the middle layer 801, the middle layer 801 may be used to transfer the pattern of the photoresist 401 to the BARC layer 105. In an embodiment the BARC layer 105 may be removed using an etching process that utilizes the photoresist 401 and the middle layer 801 (now patterned) as masking layers. The etching process may be a dry etch process utilizing an etchant such as oxygen, nitrogen, hydrogen, ammonia, sulfur hexafluoride, difluoromethane, nitrogen trifluoride, chlorine trifluoride, chlorine, carbon monoxide, carbon dioxide, helium, boron dichloride, argon, fluorine, trifluoromethane, tetrafluoromethane, perfluorocyclobutane, perfluoropropane, combinations of these, or the like. However, any other suitable etch process, such as a wet etch, or even a wet etch performed simultaneously as the middle layer 801, and any other suitable etchants may alternatively be used.

However, as one of ordinary skill will recognize, the placement of the middle layer 801 over the BARC layer 105 is intended to be illustrative and is not intended to be limiting to the embodiments. Rather, the middle layer 801 may be placed in any relation to the BARC layer 105, such as by being between the BARC layer 105 and the substrate 101. Any suitable sequence of layers is fully intended to be included within the scope of the embodiments.

By utilizing the BARC layer 105 along with the floating region 201 and the middle layer 801, the pattern from the photoresist 401 can be formed within the middle layer 801 and the BARC layer 105. This pattern may then be used for additional processing of the substrate 101 and the fins 103.

Figure 9:
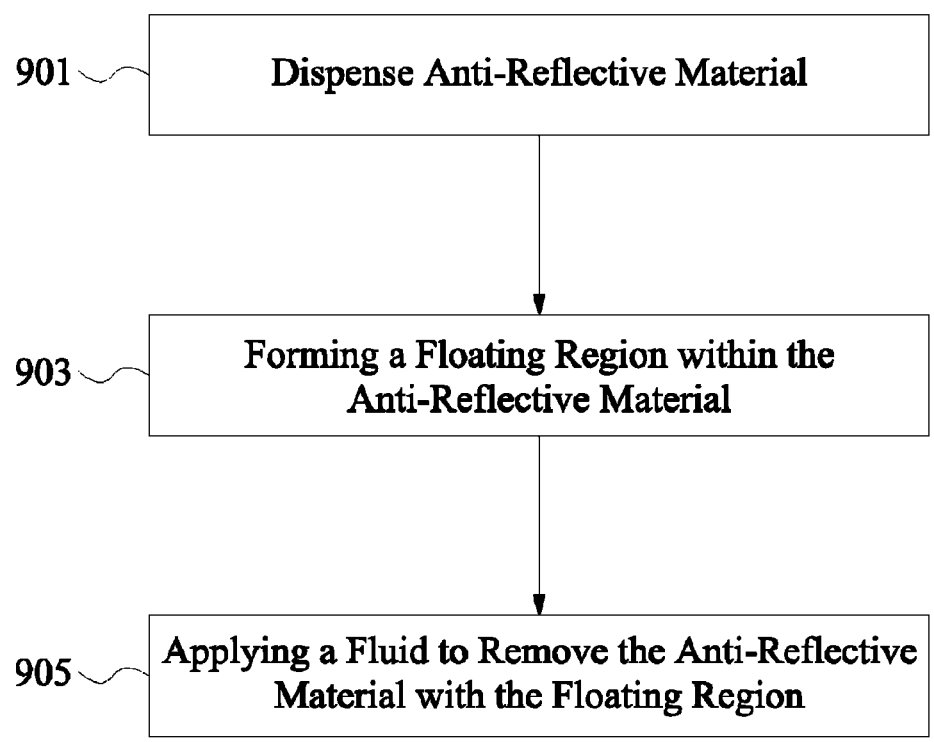
FIG. 9 illustrates a process flow of dispensing the bottom anti-reflective layer, forming the floating region, and applying a fluid to remove the bottom anti-reflective layer in accordance with an embodiment.

FIG. 9 illustrates a process flow which may be utilized to apply and remove the BARC layer 105 with the floating region 201. In an embodiment the BARC layer 105 is dispense or applied in a first step 901. Once dispensed, the floating region 201 is formed within the BARC layer 105 in a second step 903. Once utilized, the BARC layer 105 and the floating region 201 are removed by applying a fluid to the BARC layer 105 and the floating region 201 in a third step 905.

Figure 10:
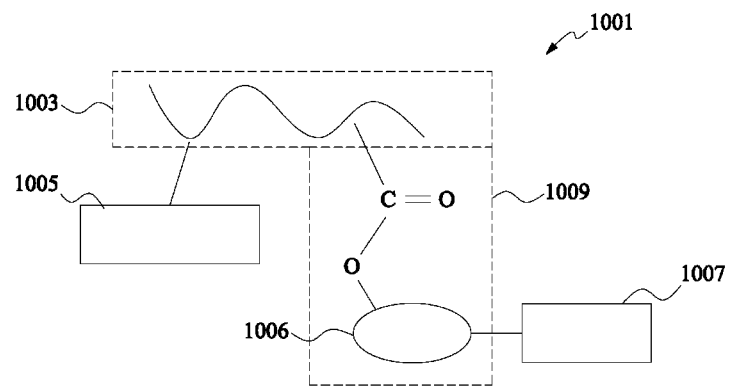
FIG. 10 illustrates an additive that may be used within the BARC layer in accordance with an embodiment.

FIG. 10 illustrates another embodiment in which an additive 1001 is added to the BARC layer 105 to assist the floating cross-linking agent within the floating region 201. In an embodiment the additive 1001 may comprise an additive backbone (represented in FIG. 10 by the dashed box labeled 1003) to which a cross-linking group (represented in FIG. 10 by the box labeled 1005), an additive group which will decompose (represented in FIG. 10 by the box labeled 1009), and a fluorine unit (represented in FIG. 10 by the box labeled 1007) are attached. In an embodiment the additive backbone 1003 utilized may be similar to the hydrocarbon backbone discussed above with respect to the polymer resin of the BARC layer 105 in FIG. 1. For example, the additive 1001 may have an aliphatic polyether that will form the additive backbone 1003. However, any suitable hydrocarbon backbone may alternatively be utilized for the additive backbone 1003.

To the additive backbone 1003 is attached the additive cross-linking group 1005. In an embodiment the additive cross-linking group 1005 may be part of an additive cross-linking monomer, a portion of which has been incorporated into the additive backbone 1003. In this embodiment the additive cross-linking monomer may be similar to the cross-linking monomer described above with respect to the BARC layer 105 in FIG. 1. However, any other suitable cross-linking group may be utilized within the additive 1001.

Additionally, the additive backbone 1003 of the additive 1001 will also have an additive group which will decompose 1009 attached to the additive backbone 1003. In an embodiment the additive group which will decompose 1009 is similar to the group which will decompose as discussed above with respect to the photoresist 401 in FIG. 4. For example, in an embodiment in which acid generators are utilized, the additive group which will decompose 1009 may comprise an acid labile group (represented in FIG. 10 by the circle labeled 1006) connected to the additive backbone 1003 using, e.g., a connective group.

Additionally, as one of ordinary skill in the art will recognize, the precise examples regarding the structures and groups that may be used within the additive group which will decompose 1009 are merely intended to be illustrative and are not intended to list every possible structure or groups that may be utilized to form the additive group which will decompose 1009. Any suitable alternative structures and any suitable alternative groups may be utilized to form the additive group which will decompose 1009. All such structures and groups are fully intended to be included within the scope of the embodiments.

Additionally in this embodiment the fluorine unit 1007 is attached to the additive group which will decompose 1009 and is utilized to help the additive 1001 form an additive floating region 1101 (as described further below with respect to FIG. 11). In an embodiment the fluorine unit 1007 is as described above with respect to FIG. 1, such as by being a substituted atom that has been incorporated into the structure of the additive group which will decompose 1009. Alternatively, the fluorine atom may be part of an alkyl fluoride group that is substituted into the structure of the additive group which will decompose 1009. Any suitable incorporation of the fluorine unit 1007 that modifies the surface energy of the additive 1001 may alternatively be utilized. In a particular embodiment, the group which will decompose 1009 with the acid labile group 1006 and the fluorine unit 1007 has the following structure:

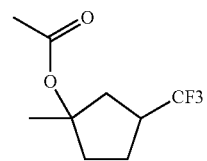

However, the fluorine unit 1007 may also be a linear fluoro alkyl chain or a cyclic fluoro alkyl.

To utilize the additive 1001, the additive 1001 may be placed into the BARC solvent along with the polymer resin, the catalyst, and the cross-linking agent in order to aid in the mixing and placement of the BARC layer 105. In an embodiment the additive 1001 is placed into the BARC solvent such that the additive 1001 has a concentration of between about 5% and about 50%, such as less than about 30% (while the BARC layer 105 polymer resin comprises greater than about 50%). However, any suitable concentration of the additive 1001 may alternatively be utilized.

Figure 11:
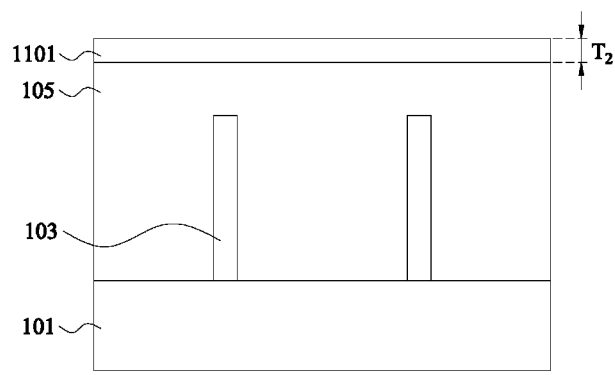
FIG. 11 illustrates a formation of a floating additive region in accordance with an embodiment.

With reference now to FIG. 11, once the material for the BARC layer 105 which includes the additive 1001 has been prepared, the material for the BARC layer 105 with the additive 1001 included may be utilized by applying the material for the BARC layer 105 with the additive 1001 onto the substrate 101 and the fins 103. In an embodiment the material for the BARC layer 105 with the additive 1001 is applied as described above with respect to FIG. 1. However, any suitable method of application may alternatively be utilized.

As the material for the BARC layer 105 with the additive 1001 is applied, the additive 1001 will move to the top of the BARC layer 105 to form the additive floating region 1101. This movement is initiated because the addition of the fluorine unit 1007 to the additive group which will decompose 1009 causes the additive 1001 to have a high surface energy. This high surface energy, coupled with the low interaction between the fluorine unit 1007 and the other atoms within the BARC layer 105, will initiate the movement of the additive 1001 to the top surface of the BARC layer 105.

In an embodiment, with the formation of the additive floating region 1101, the additive floating region 1101 will have a higher concentration of the additive 1001 than a remainder of the BARC layer 105, such as by having a concentration of the additive 1001 of between about 5% and about 50%, such as about 30%, while the remainder of the BARC layer 105 (outside of the additive floating region 1101) will have a concentration of the additive 1001 no greater than about 20%. Additionally, the additive floating region 1101 will have a second thickness $T_2$ of less than about 50% of the overall thickness of the BARC layer 105, such as between about 100 Å and about 1000 Å, such as about 100 Å. However, these dimensions and concentrations may vary and are intended to be illustrative only, and benefits may be derived from suitable concentrations different from those listed herein.

Figure 12A:
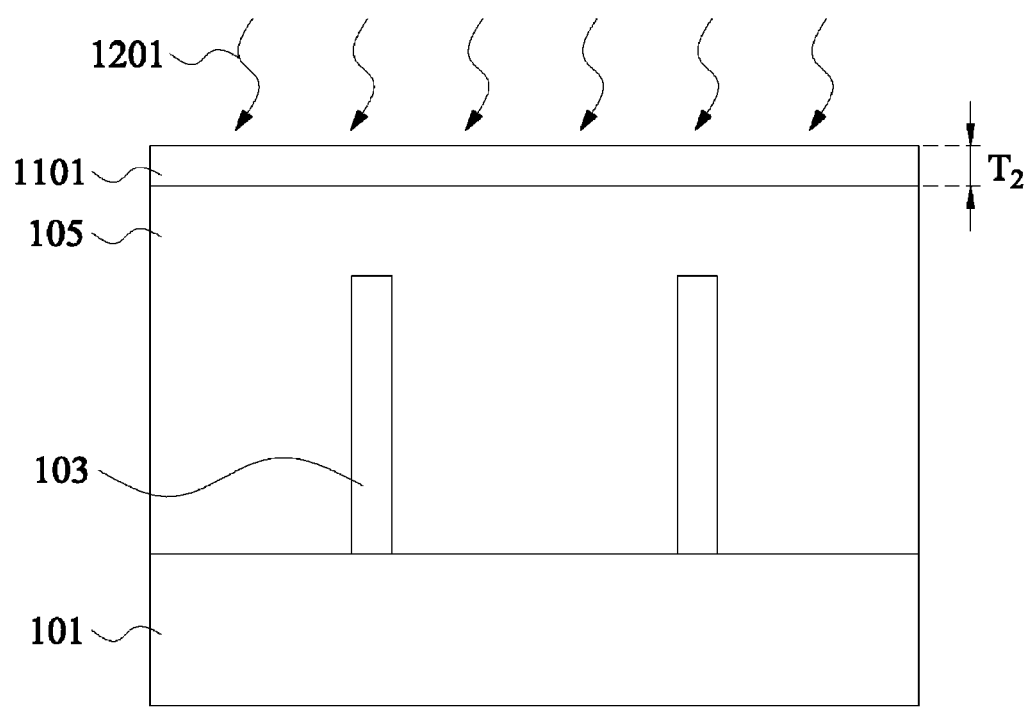
FIGS. 12A-12B illustrate a pre-bake of the BARC layer in accordance with an embodiment.
Figure 12B:
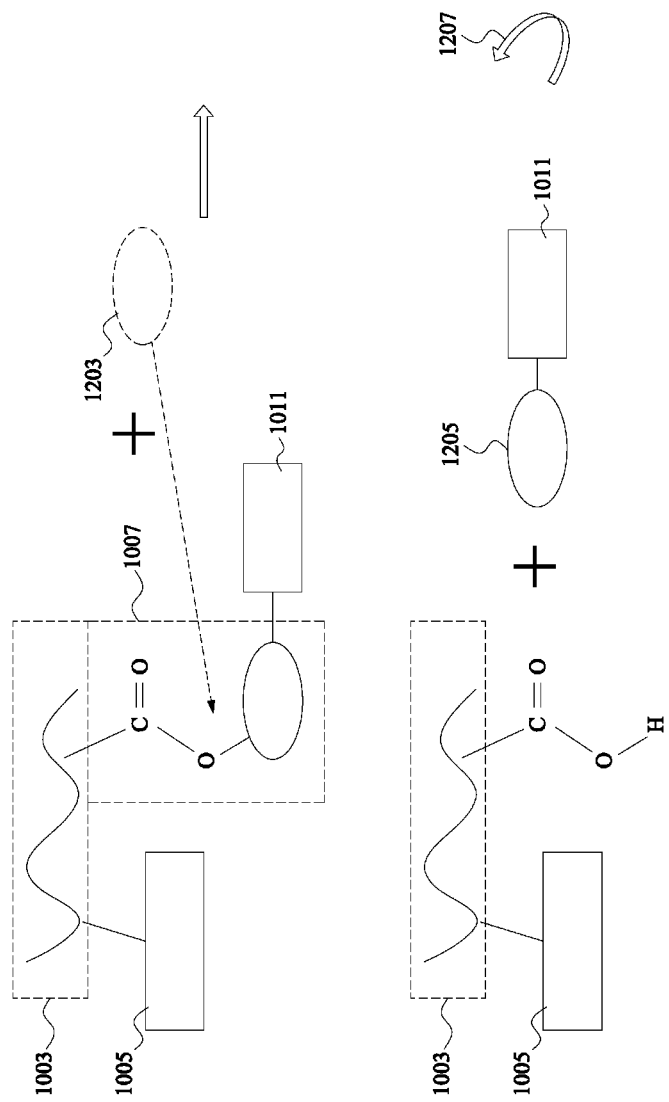

FIGS. 12A-12B illustrate a pre-bake of the BARC layer 105 (represented in FIG. 12A by the wavy lines labeled 1201), including both the bake itself (in FIG. 12A) and the chemical reaction that may occur with the additive 1001 during the pre-bake (in FIG. 12B). In an embodiment once the BARC layer 105 has been applied to the substrate 101 and the fins 103, the pre-bake 1201 of the BARC layer 105 is performed in order to cure and dry the BARC layer 105 prior to an application of the photoresist 401. The curing and drying of the BARC layer 105 removes a portion of the BARC solvent but leaves behind the polymer resin, the catalysts, the cross-linking agent, the additive 1001 and any other desired additives. In an embodiment the pre-bake 1201 may be performed at a temperature suitable to evaporate the BARC solvent, such as between about 40° C. and 400° C. (such as between about 100° C. and 150° C.), although the precise temperature depends upon the materials chosen for the BARC layer 105. The pre-bake 1201 is performed for a time sufficient to cure and dry the BARC layer 105, such as between about 10 seconds to about 5 minutes, such as about 90 seconds.

Additionally, with respect to the additive 1001, FIG. 12B illustrates one chemical reaction that may occur during the pre-bake 1201 of the BARC layer 105. As illustrated, the catalyst (e.g., a thermal acid generator, represented in FIG. 12B by the circle labeled 1203) will generate an acid during the pre-bake 1201, and the acid will attack the bond within the additive group which will decompose 1009. In an embodiment in which the additive group which will decompose comprises a carboxyl unit, a portion of the additive group which will decompose 1009 that remains attached to the additive backbone 1003 will reform into a COOH group. As such, the surface of the additive floating region 1101 (and, therefore, the surface of the BARC layer 105) will change its polarity.

Additionally, by cleaving the additive group which will decompose 1009, the remainder of the additive group which will decompose 1009 (the remainder is represented in FIG. 12B by the circle labeled 1205), will no longer be bonded to the additive backbone 1003. In some embodiments the remainder 1205 may remain within the BARC layer 105 after the pre-bake 1201. However, alternatively, some or all of the remainder 1205 may evaporate or be driven out of the BARC layer 105 and into the surrounding environment. This evaporation is represented in FIG. 12B by the arrow labeled 1207

Additionally, as the remainder 1205 is removed from the additive 1001, the fluorine unit 1007, which has been attached to the remainder 1205, will also be removed from the additive 1001. As with the remainder 1205, the fluorine unit 1007 may remain within the BARC layer 105 or else evaporate or be driven into a gaseous form and into the surrounding environment along with the remainder 1205. In other embodiments, the fluorine unit 1007 may disassociate from the remainder 1205 and react with other components within the BARC layer 105. Any of these dispositions, or any other suitable disposition of the fluorine unit 1007 are fully intended to be included within the scope of the embodiments.

However, the cleaving of the additive group which will decompose 1009 will also modify the properties of the top surface of the BARC layer 105 where it is located. In particular, with the cleaving of the additive group which will decompose 1009 (for example to form the COOH group illustrated in FIG. 12B), the additive 1001 will change its polarity. For example, in one embodiment, the polarity of the additive 1001 will change from being hydrophobic (with the additive group which will decompose 1009) to being hydrophilic (with the COOH group).

Additionally, the cleaving of the additive group to be decomposed 1009 along with the fluorine unit 1007 will also modify the contact angle of the surface of the BARC layer 105. For example, in BARC layers that do not utilize the additive 1001 as described herein, the contact angle of the BARC layer 105 may have a contact angle of greater than about 60 degrees. However, by using the floating additive 1001 to generate the additive floating region 1101, and then cleaving the additive group which will decompose 1009 along with the attached fluorine unit 1007, the contact angle of the surface can be reduced to less than about 45 degrees.

Additionally, while the additive group which will decompose 1009 is cleaved during the pre-bake 1201, the additive cross-linking group 1005 within the additive 1001 will also react. In an embodiment the additive cross-linking group 1005 will react with the other components of the BARC layer 105 such as the cross-linking group within the polymer resin of the BARC layer 105. Such cross-linking of the additive 1001 with the other components of the BARC layer 105 will serve to help prevent the additive 1001 from intermixing with overlying layers (such as the middle layer 801) once the overlying layers are in physical contact with the additive floating layer 1101 with the additive 1001.

Figure 13:
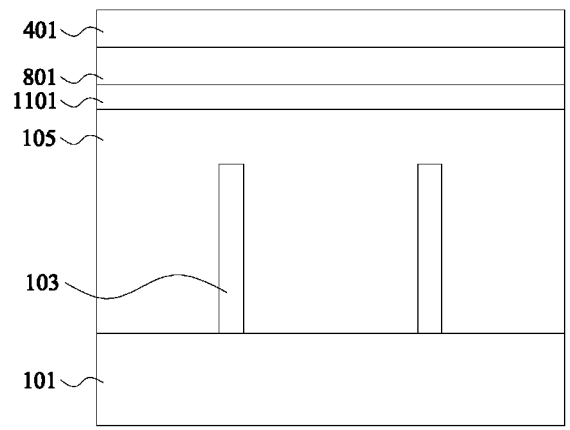
FIG. 13 illustrates an application of a middle layer and a photoresist to the BARC layer with the additive in accordance with an embodiment.

FIG. 13 illustrates a placement of the middle layer 801 over the BARC layer 105 (including the additive floating region 1101). However, because the middle layer 801 has a contact angle of less than about 30 degrees, there is a much smaller difference between the contact angle of the BARC layer 105 (with less than about 45 degrees) and the middle layer 801. This reduction in the difference between the contact angle of the BARC layer 105 and the overlying middle layer 801, along with the shift in polarity, makes the coating of the middle layer 801 easier. Additionally, bubbles that normally would be formed during the coating process are reduced or eliminated.

FIG. 13 additionally illustrates a placement of the photoresist 401 over the middle layer 801. In an embodiment the photoresist 401 is as described above with respect to FIGS. 4A-4B, and may be, for example, a photoresist polymer resin along with one or more photoactive compounds (PACs) in a photoresist solvent. Additionally, the photoresist 401 may be applied to a top surface of the middle layer as described above with respect to FIGS. 4A-4B. For example, the photoresist 401 may be applied using a process such as a spin-on coating process, a dip coating method, an air-knife coating method, a curtain coating method, a wire-bar coating method, a gravure coating method, a lamination method, although any suitable method of application may alternatively be utilized.

Figure 14:
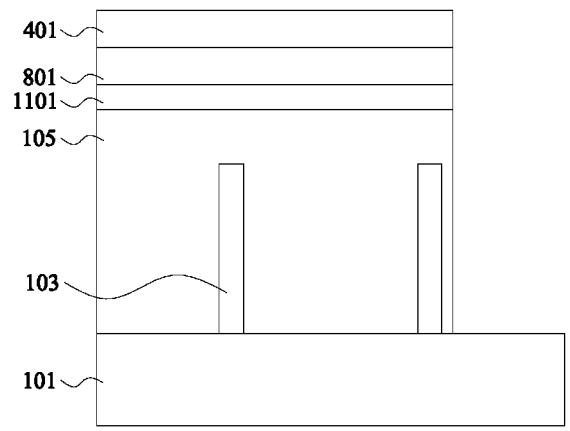
FIG. 14 illustrates a patterning of the photoresist, the middle layer and the BARC layer with the additive in accordance with an embodiment.

FIG. 14 illustrates a patterning of the photoresist 401 as well as a transfer of the pattern of the photoresist 401 into the middle layer 801 as well as the BARC layer 105 (with the additive floating region 1101). In an embodiment the photoresist 401 may be patterned as described above with respect to FIGS. 4A-4B, such as by being exposed to a patterned energy source (e.g., light) and then developed using the developer 417 (not illustrated in FIG. 14). Similarly, once the photoresist 401 has been developed, the pattern of the photoresist 401 may be transferred to the middle layer 801 and the BARC layer 105 (including the additive floating region 1101) as described above with respect to FIG. 8. For example, a reactive ion etch may be utilized to transfer the pattern of the photoresist 401 to the middle layer 801, and then the middle layer 801 and the photoresist 401 may be used as masks to transfer the pattern to the BARC layer 105. The substrate may then be processed and the BARC layer 105, the middle layer 801, and the photoresist 401 may be removed as described above with respect to FIG. 6.

By using the additive 1001 and forming the floating additive layer 1101 as described herein, a better and more uniform coating of the middle layer 801 onto the BARC layer 105 may be obtained. In particular, by shifting the polarity of the BARC layer 105 as well as reducing the difference in contact angles, the application of the overlying layer (e.g., the middle layer 801) can avoid a formation of bubbles or other interactions that can impact the formation of a patterned mask. As such, a better mask can be formed and defects can be avoided.

Figure 15:
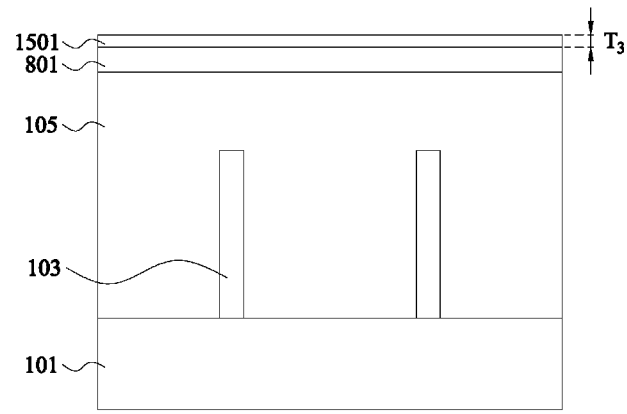
FIG. 15 illustrates an adhesion promotion layer over the BARC layer in accordance with an embodiment.

FIG. 15 illustrates another embodiment which may be used to enhance adhesion between the middle layer 801 and the overlying photoresist 401. In this embodiment a separate adhesion promotion layer 1501 may be applied over the middle layer 801 after the middle layer 801 has been applied (as described above with respect to FIG. 8). The adhesion promotion layer 1501 may be an adhesive material, such as an organic or inorganic layer, that is used to modify the adhesive properties of the exposed surface of the middle layer 801 by covering the exposed surface prior to application of the photoresist 401.

In one embodiment the adhesion promotion layer 1501 may be an organic material such as an organic polymer. For example, the organic material for the adhesion promotion layer 1501 may be a polymer with an organic backbone with monomers such as, e.g., polyhydroxystyrene (PHS), methacrylate, polyether, a methacrylate/PHS hybrid, or any other suitable organic polymer which contains an aromatic ring. In one particular embodiment of the adhesion promotion layer 1501 which uses an organic polymer, the organic polymer may be acrylate, methyl acrylate, poly(hydroxystyrene) (PHS) or Novolac.

However, as one of ordinary skill in the art will recognize, the embodiments discussed above are intended to be illustrative only and are not intended to be limiting upon the embodiments. Rather, any suitable organic material may be utilized for the organic material. All such organic materials are fully intended to be included within the scope of the embodiments.

In another embodiment the adhesion promotion layer 1501 may be an inorganic material such as an inorganic polymer. For example, the inorganic material for the adhesion promotion layer 1501 may be a polymer with an inorganic backbone with monomers such as, e.g., silicon oxide, silicon nitride, silicon cyanide, combinations of these, or the like. In one particular embodiment of the adhesion promotion layer 1501 which uses an inorganic polymer, the inorganic polymer may be hexamethyldisiloxane (HMDS) or polysiloxane deposited by, e.g., atomic layer deposition (ALD).

In yet another embodiment the adhesion promotion layer 1501 may be an inorganic material that comprises a metal. For example, the inorganic material that comprises a metal for the adhesion promotion layer 1501 may be a polymer with an inorganic polymer backbone with monomers that comprise, e.g., a metal oxide, a metal nitride, a metal cyanide, combinations of these, or the like. In one particular embodiment of the adhesion promotion layer 1501 which uses an inorganic polymer that comprises a metal, the inorganic polymer may be a metal deposited by atomic layer deposition (ALD).

However, as one of ordinary skill in the art will recognize, the embodiments discussed above are intended to be illustrative only and are not intended to be limiting upon the embodiments. Rather, any suitable inorganic material may be utilized for the inorganic material. All such inorganic materials are fully intended to be included within the scope of the embodiments.

Optionally, if desired, organic groups may be bonded to the inorganic backbones within the inorganic materials (either with the metal or without). In some embodiments, organic groups such as alkyl groups, aromatic groups, or non-aromatic cycle groups may be attached to the inorganic backbones. In a particular embodiment, organic groups may be attached to the inorganic backbones to form the following structure:

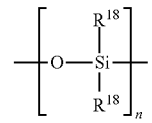

Where $R^{18}$ is an organic group such as an alkyl groups (methyl, ethyl, propyl, isopropyl, butyl. Isobuty, sec-butyl, vinyl, allyl); an aromatic group (phenyl, 4-methylphenyl, benzyl, 4-methylbenzyl, naphthalenyl, benzyl sulfonyl); or non-aromatic cycle groups ((cyclopentyl, cyclohexyl).

Additionally, if desired an adhesion promotion chromophore unit may be attached to the organic backbone or the inorganic backbone of the adhesive material. In an embodiment the adhesion promotion chromophore unit may be similar to the chromophore unit as described above with respect to the BARC layer 105. For example, the adhesion promotion chromophore unit may comprise vinyl compounds (e.g., with conjugated double bonds) containing substituted and unsubstituted phenyl, although any suitable chromophore unit may alternatively be utilized.

The adhesion promotion layer 1501 may be applied over the middle layer 801 using a deposition process such as spin-coating, vapor coating, chemical vapor deposition (CVD), physical vapor deposition (PVD), or the like. In an embodiment the adhesion promotion layer 1501 may be deposited to a third thickness $T_3$ of between about 10 Å, and about 100 Å, such as about 50 Å, although any suitable method of deposition may alternatively be utilized.

In a particular embodiment in which the adhesion promotion layer 1501 is applied using a spin-coating process, the adhesive material (e.g., the organic polymer and/or inorganic polymers) may be placed into an adhesion promotion solvent (not separately illustrated in FIG. 15). In an embodiment the adhesion promotion solvent may be similar to the BARC solvent described above with respect to FIG. 1. However, any suitable solvent may be used in order to apply the adhesion promotion layer 1501.

Along with the adhesive material (e.g., the organic polymer and/or inorganic polymers), one or more adhesion promotion additives may also be added to the adhesion promotion solvent. In one embodiment an adhesion promotion cross-linking agent may be utilized. In an embodiment the adhesion promotion cross-linking agent may be similar to the cross-linking agent (without the addition of the fluorine atom) as described above with respect to the BARC layer 105. For example, the adhesion promotion cross-linking agent may comprise a melamine or a glycouril. However, any suitable cross-linking agent may also be utilized.

Another additive that may be added to the adhesion promotion material may be an initiator additive to initiate a cross-linking reaction between the polymers of the adhesive material during curing of the adhesion promotion layer 1501 (discussed further below). In an embodiment in which the cure will be performed by heating, the initiator additive may be an adhesion promotion catalyst, which may be similar to the catalyst described above with respect to the BARC layer 105. However, any suitable catalyst may alternatively be utilized.

Alternatively, in an embodiment in which the cure will be performed through an exposure of the adhesion promotion layer 1501 to an energy source, the initiator additive may be, for example, an adhesion promotion photoactive compound. In this embodiment the adhesion promotion photoactive compound may be similar to the photoactive compounds described above with respect to FIGS. 4A-4B. For example, the adhesion promotion photoactive compound may be a photoacid generator, a photobase generator, a free-radical generator, or the like. However, any suitable photoactive compounds may alternatively be utilized.

Another additive that may be added to the adhesion promotion solvent may be an adhesion promotion quencher. In an embodiment the adhesion promotion quencher may be similar to the quencher described above with respect to the photoresist 401. For example, the adhesion promotion quencher may be a base such as an amine such as a second lower aliphatic amine, a tertiary lower aliphatic amine, or the like. However, any suitable quencher may alternatively be utilized.

Yet another additive that may be added is a dissolution inhibitor that may be utilized to lower the dissolution rate during development to allow for more control. In an embodiment the dissolution inhibitor comprises a fluorinated additive such as perfluorosuberic acid bis-(2,2,2,-trifluoro-1-phenyl-1-trifluoromethyl-ethyl) ester, perfluorosuberic acid bis-[1-(4-trifluoromethyl-phenyl)-ethyl]ester, or a fluorinated phenylmethanediol diester, or the like. However, any suitable dissolution inhibitor may alternatively be utilized.

In an embodiment the adhesive material (e.g., the organic polymer and/or inorganic polymers), the adhesion promotion cross-linking agent, the adhesion promotion catalyst, the adhesion promotion photoactive compound, the adhesion promotion quencher, and any other desired additives are placed into the adhesion promotion solvent to form the material for the adhesion promotion layer 1501. Once added, the mixture is then mixed in order to achieve an even and constant composition throughout the material for the adhesion promotion layer 1501 in order to ensure that there are no defects caused by an uneven mixing or non-constant composition of the material for the adhesion promotion layer 1501. Once mixed together, the material for the adhesion promotion layer 1501 may either be stored prior to its usage or else used immediately.

In its original mixed form, the material for the adhesion promotion layer 1501 may comprise a constant composition of components, with the adhesive material (e.g., the organic polymer and/or inorganic polymers) having a concentration of between about 50% and about 90%, the adhesion promotion initiator (e.g., the adhesion promotion catalyst or adhesion promotion photoactive compounds) having a concentration of between about 3% and about 20%, and the adhesion promotion cross-linking agent having a concentration of between about 5% and about 40%. However, while these concentrations are illustrative, any suitable combinations of the various components of the material for the adhesion promotion layer 1501 may be used, and all such combinations are fully intended to be included within the scope of the embodiments.

Once the material for the adhesion promotion layer 1501 has been prepared, the material for the adhesion promotion layer 1501 may be utilized by initially applying the material for the adhesion promotion layer 1501 onto the BARC layer 105 (with or without the floating region 201 or the additive floating region 1101). The material for the adhesion promotion layer 1501 may be applied to the BARC layer 105 so that the material for the adhesion promotion layer 1501 coats an upper exposed surface of the BARC layer 105, and may be applied using a process such as a spin-on coating process, a dip coating method, an air-knife coating method, a curtain coating method, a wire-bar coating method, a gravure coating method, a lamination method, an extrusion coating method, combinations of these, or the like. In an embodiment the material for the adhesion promotion layer 1501 may be initially applied such that it has a constant concentration and has the third thickness $T_3$ over a top of the BARC layer 105.

Once the material for the adhesion promotion layer 1501 has been applied, a pre-bake of the adhesion promotion layer 1501 may be performed. In an embodiment once the adhesion promotion layer 1501 has been applied to the BARC layer 105, the pre-bake of the adhesion promotion layer 1501 is performed in order to cure and dry the adhesion promotion layer 1501 prior to an application of the photoresist 401 and, in an embodiment in which the adhesion promotion initiator is the adhesion promotion catalyst, to initiate cross-linking between the polymers of the adhesive material (e.g., the organic polymer and/or inorganic polymers). The curing and drying of the adhesion promotion layer 1501 removes a portion of the adhesion promotion solvent but leaves behind the remainder of the adhesion promotion materials. In an embodiment the pre-bake of the adhesion promotion layer 1501 may be performed at a temperature suitable to evaporate the adhesion promotion solvent, such as between about 40° C. and 400° C. (such as between about 100° C. and 150° C.), although the precise temperature depends upon the materials chosen for the adhesion promotion layer 1501. The pre-bake is performed for a time sufficient to cure and dry the adhesion promotion layer 1501, such as between about 10 seconds to about 5 minutes, such as about 90 seconds.

However, as one of ordinary skill in the art will recognize, the curing process described above (in which a thermal bake is performed to cure the adhesion promotion layer 1501), is merely one illustrative process that may be used to cure the adhesion promotion layer 1501, and is not intended to limit the embodiments. Rather, any suitable curing process, such as exposing the adhesion promotion layer 1501 to an energy source (e.g., a photolithography exposure with a wavelength between about 10 nm to about 1000 nm) in an embodiment in which the adhesion promotion initiator is a photoactive compound, irradiating the adhesion promotion layer 1501 to cure the adhesion promotion layer 1501, or even an electrical cure of the adhesion promotion layer 1501, or the like, may alternatively be utilized. All such curing processes are fully intended to be included within the scope of the embodiments.

Figure 16:
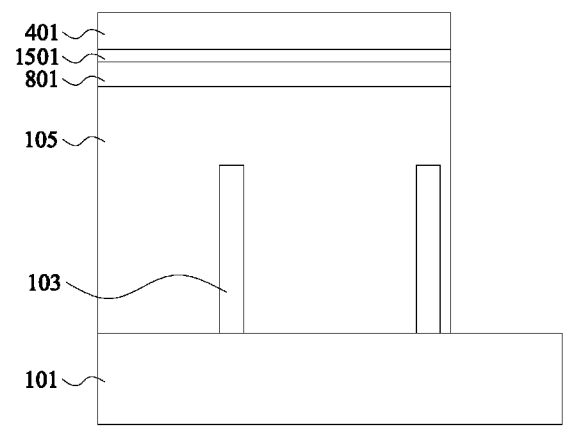
FIG. 16 illustrates a photoresist applied to the adhesion promotion layer in accordance with an embodiment.

FIG. 16 illustrates that, once the adhesion promotion layer 1501 has been applied, the photoresist 401 may be applied over the adhesion promotion layer 1501. In an embodiment the photoresist 401 is as described above with respect to FIGS. 4A-4B, and may be, for example, a photoresist polymer resin along with one or more photoactive compounds (PACs) in a photoresist solvent. For example, the photoresist 401 may be applied using a process such as a spin-on coating process, a dip coating method, an air-knife coating method, a curtain coating method, a wire-bar coating method, a gravure coating method, a lamination method, although any suitable method of application may alternatively be utilized.

FIG. 16 also illustrates a patterning of the photoresist 401 as well as a transfer of the pattern of the photoresist 401 into the adhesion promotion layer 1501 as well as the middle layer 801 and the BARC layer 105. In an embodiment the photoresist 401 may be patterned as described above with respect to FIGS. 4A-4B, such as by being exposed to a patterned energy source (e.g., light) and then developed using the developer 417 (not illustrated in FIG. 16). Similarly, once the photoresist 401 has been developed, the pattern of the photoresist 401 may be transferred to the adhesion promotion layer 1501, the middle layer 801 and the BARC layer 105 as described above with respect to FIG. 8. For example, one or more reactive ion etches may be utilized to transfer the pattern of the photoresist 401 to the adhesion promotion layer 1501 and the middle layer 801, and then the middle layer 801, the adhesion promotion layer 1501 and the photoresist 401 may be used as masks to transfer the pattern to the BARC layer 105. The substrate 101 may then be processed and the BARC layer 105, the middle layer 801, and the photoresist 401 may be removed as described above with respect to FIG. 6.

However, by utilizing the adhesion promotion layer 1501 over the surface of the middle layer 801, the overlying photoresist 401 will adhere to the adhesion promotion layer 1501 with a larger force than if the photoresist 401 had been applied directly to the surface of the middle layer 801. As such, with this larger adherence, the photoresist 401 is less likely to suffer a collapse of the pattern after the photoresist 401 has been patterned and is being used as a mask. With fewer collapses, a larger yield may be achieved, and smaller features may be formed using the photoresist 401.

Figure 17:
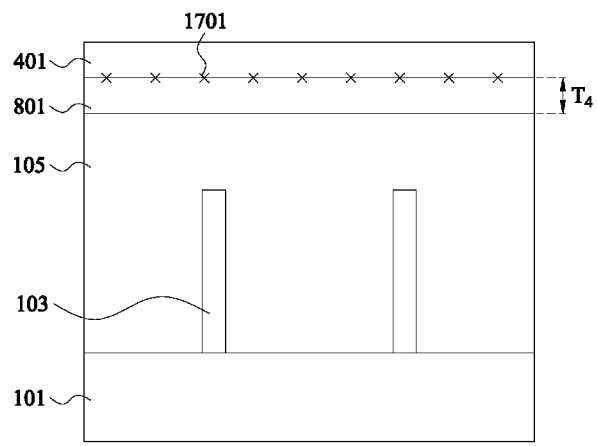
FIG. 17 illustrates a middle layer cross-linking with the photoresist in accordance with an embodiment.

FIG. 17 illustrates another embodiment in which adhesion between the photoresist 401 and the middle layer 801 may be achieved. In this embodiment, rather than simply adding another layer (e.g., the adhesion promotion layer 1501), middle layer cross-linking groups are added to the middle layer polymer resin in order to initiate a cross-linking between the middle layer 801 and the overlying photoresist 401 (the cross-links are represented in FIG. 17 by the Xs labeled 1701). In an embodiment the middle layer cross-linking groups may be part of a middle layer cross-linking monomer, a portion of which has been incorporated into the middle layer polymer backbone (described above with respect to FIG. 8). In this embodiment the middle layer cross-linking monomer may be as described above with respect to the middle layer 801 in FIG. 8. However, any other suitable middle layer cross-linking unit may be utilized within the middle layer polymer resin.

For example, in an embodiment in which the photoresist 401 is a positive tone photoresist, the middle layer cross-linking monomer may comprise a hydrocarbon structure with a cross-linking acid labile group (e.g., an acid labile group within the middle layer cross-linking monomer) such that the bonds within the cross-linking group can be cleaved by an acid-catalyzed reaction (induced, e.g., by the exposure). For example, the hydrocarbon structure may be a non-cyclic structure or a cyclic structure, either of which may or may not comprise an aromatic ring. Onto the hydrocarbon structure of the cross-linking monomer, the cross-linking acid labile group may be attached. The cross-linking acid labile group may be similar to the acid labile group described above with respect to the photoresist 401, although any suitable acid labile group may alternatively be utilized. For example, the cross-linking acid labile group may comprise a functionalized group such as an —I group, a —Br group, a —Cl group, a —NH₂ group, a —COOH group, a —OH group, a —SH group, a —N₃ group, a —S(=O)— group, an alkene group, an alkyne group, an imine group, an ether group, a vinyl ether group, an acetal group, a hemiacetal group, an ester group, an aldehyde group, a ketone group, an amide group, a sulfone group, an acetic acid group, a cyanide group, an allene group, combinations of these, or the like attached to the structure. In a particular embodiment the middle layer cross-linking monomer with a cross-linking acid labile group may have the following structure:

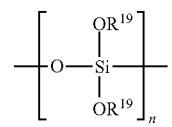

Wherein $R^{19}$ may have one of the following structures:

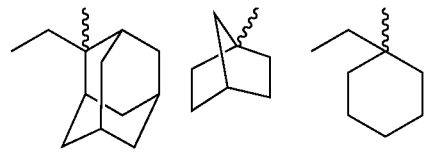

Alternatively, in an embodiment in which the photoresist 401 is a positive tone photoresist, instead of the middle layer cross-linking group having a cross-linking acid labile group (as described above), the middle layer cross-linking group may comprise a light sensitive group wherein the cross-linking bonds can be cleaved by irradiation of an energy source. In this embodiment the middle layer cross-linking group within the middle layer cross-linking monomer may be an alkyl group with between three and twenty carbon atoms, and may additionally comprise at least one light-sensitive functional group. For example, the light sensitive functional group may comprise azo compound groups, alkyl halide groups, imine groups, alkene groups, alkyne groups, peroxide groups, ketone groups, aldehyde groups, allene groups, aromatic groups or heterocyclic groups. Specific embodiments of the aromatic groups include phenyl groups, napthlenyl groups, phenanthrenyl groups, anthracenyl groups, phenalenyl groups, and other aromatic derivatives containing one to five-membered rings. In a particular embodiment the middle layer cross-linking monomer with a light sensitive group may have the following structure:

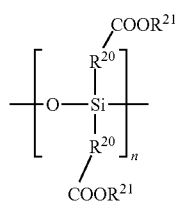

Wherein $R^{20}$ is a linear alkyl chain and $R^{21}$ has one of the following structures:

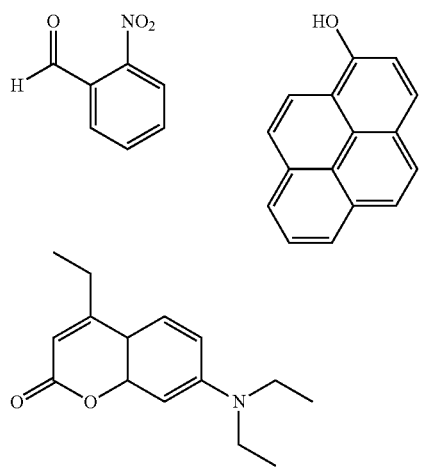

In another embodiment in which the photoresist 401 is a negative tone photoresist, the middle layer cross-linking monomer will comprise a middle layer cross-linking group which can cross-link with the photoresist 401 under an acid-catalyzed reaction. For example, in this embodiment the hydrocarbon structure may be a non-cyclic structure or a cyclic structure, either of which may or may not comprise an aromatic ring. Additionally, the cross-linking group which can cross-link with the photoresist 401 may comprise a functionalized group such as an —I group, a —Br group, a —Cl group, a —NH$_2$ group, a —COOH group, a —OH group, a —SH group, a —N$_3$ group, a —S(=O)— group, an alkene group, an alkyne group, an imine group, an ether group, a vinyl ether group, an acetal group, a hemiacetal group, an ester group, an aldehyde group, a ketone group, an amide group, a sulfone group, an acetic acid group, a cyanide group, an allene group, combinations of these, or the like attached to the structure. In a particular embodiment the middle layer cross-linking monomer for use with a negative tone photoresist may have the same structure as described above for use with the positive tone photoresist.

In another embodiment in which the photoresist 401 is a negative tone photoresist, the middle layer cross-linking group within the middle layer cross-linking monomer is a light sensitive group and the middle layer cross-linking group will bond and cross-link with the photoresist 401 during irradiation of the photoresist 401. In this embodiment the middle layer cross-linking group within the middle layer cross-linking monomer may be an alkyl group with between three and twenty carbon atoms, and may additionally comprise at least one light-sensitive functional group. For example, the light sensitive functional group may comprise epoxy groups, azo compound groups, alkyl halide groups, imine groups, alkene groups, alkyne groups, peroxide groups, ketone groups, aldehyde groups, allene groups, aromatic groups or heterocyclic groups. Specific embodiments of the aromatic groups include phenyl groups, napthlenyl groups, phenanthrenyl groups, anthracenyl groups, phenalenyl groups, and other aromatic derivatives containing one to five-membered rings. In a particular embodiment the middle layer cross-linking monomer with a light sensitive group for a negative tone photoresist may have the same structure as used for the positive tone photoresist described above:

However, while specific embodiments of the middle layer cross-linking group are described above, these embodiments are intended to be illustrative and are not intended to limit the embodiments. Rather, any suitable cross-linking group that may be utilized to assist in cross-linking the material of the middle layer 801 to the photoresist 401 may be used. All such cross-linking material is fully intended to be included within the scope of the embodiments.

To form the middle layer resin in this embodiment the middle layer cross-linking monomer is polymerized with the other monomers during formation of the middle layer resin. In an embodiment the middle layer cross-linking monomer will have a loading within the middle layer resin (after polymerization) of between about 15% and about 80%, such as about 65%. Once polymerized to form the middle layer resin with the middle layer cross-linking monomer, the middle layer resin with the middle layer cross-linking monomer is placed into the middle layer solvent along with any other desired additives as described above to form the material for the middle layer 801 with the middle layer cross-linking monomer.

Additionally, once the material for the middle layer 801 with the middle layer cross-linking monomer is ready, the material for the middle layer 801 with the middle layer cross-linking monomer is dispersed onto the BARC layer 105. The material for the middle layer 801 with the middle layer cross-linking monomer may be applied to the BARC layer 105 so that the material for the middle layer 801 with the middle layer cross-linking monomer coats an upper exposed surface of the BARC layer 105, and may be applied using a process such as a spin-on coating process, a dip coating method, an air-knife coating method, a curtain coating method, a wire-bar coating method, a gravure coating method, a lamination method, an extrusion coating method, combinations of these, or the like. In an embodiment the material for the middle layer 801 with the middle layer cross-linking monomer may be initially applied such that it has a constant concentration and has a fourth thickness $T_4$ over a top of the BARC layer 105 of between about 100 Å and about 1000 Å, such as about 200 Å.

In an embodiment once the middle layer 801 with the middle layer cross-linking monomer has been applied to the BARC layer 105, a pre-bake of the middle layer 801 with the middle layer cross-linking monomer is performed in order to cure and dry the middle layer 801 with the middle layer cross-linking monomer prior to an application of the photoresist 401. The curing and drying of the middle layer 801 with the middle layer cross-linking monomer removes a portion of the middle layer solvent but leaves behind the middle layer polymer resin with the middle layer cross-linking monomer, the middle layer catalysts, the middle layer cross-linking agent, and any other additives that are present. In an embodiment the pre-bake may be performed at a temperature suitable to evaporate the middle layer solvent, such as between about 40° C. and 400° C. (such as between about 100° C. and 150° C.), although the precise temperature depends at least in part upon the materials chosen for the middle layer 801. The pre-bake is performed for a time sufficient to cure and dry the middle layer 801 with the middle layer cross-linking monomer, such as between about 10 seconds to about 5 minutes, such as about 90 seconds.

However, as one of ordinary skill in the art will recognize, the curing process described above (in which a thermal bake is performed to cure the middle layer 801), is merely one illustrative process that may be used to cure the middle layer 801, and is not intended to limit the embodiments. Rather, any suitable curing process, such as exposing the middle layer 801 to an energy source (e.g., a photolithography exposure with a wavelength between about 10 nm to about 1000 nm), irradiating the middle layer 801 to cure the middle layer 801, or even an electrical cure of the middle layer 801, or the like, may alternatively be utilized. All such curing processes are fully intended to be included within the scope of the embodiments.

Once the middle layer 801 with the middle layer cross-linking monomer has been applied, the photoresist 401 may be formed over the middle layer 801 with the middle layer cross-linking monomer. In this embodiment the photoresist 401 will also comprise the photoresist cross-linking agent (as described above with respect to FIGS. 4A-4B). The placement of the photoresist 401 over the middle layer 801 may be similar to the placement of the photoresist 401 as described above with respect to FIGS. 1-4B. For example, the photoresist 401 may be placed using a spin-on process, although any suitable process may alternatively be utilized.

Once the photoresist 401 is in place over the middle layer 801 with the middle layer cross-linking monomer, the pre-bake of the photoresist 401 may be performed to drive off the photoresist solvent. In an embodiment in which the photoresist 401 is a positive tone photoresist, however, the pre-bake is performed at a temperature that will not only drive off the photoresist solvent, but will also initiate and enhance a cross-linking between the middle layer cross-linking group within the middle layer cross-linking monomer of the middle layer 801 and the cross-linking agent within the photoresist 401. For example, the pre-bake may be performed at a temperature of between about 80° C. and about 300° C. for a time of between about 30 s and about 300 s, such as about 90 s. Alternatively, in an embodiment in which the photoresist 401 is a negative tone photoresist, the pre-bake of the photoresist 401 may be performed either to drive off the photoresist solvent (as described above with respect to the photoresist 401) or else to both drive off the photoresist solvent and also to initiate and enhance the cross-linking between the middle layer 801 and the photoresist 401.

When the pre-bake of the photoresist 401 is utilized to initiate the cross-linking process, the middle layer cross-linking group within the middle layer resin of the middle layer 801 will begin to react with the photoresist cross-linking agent that is present in adjacent portions of the photoresist 401. This reaction will form the cross-links 1701 and physically bind the middle layer cross-linking group (and, therefore, the middle layer resin) to the photoresist cross-linking agent within the photoresist 401. Additionally, because the photoresist cross-linking agent also begins to react with and begins to bond to the photoresist polymer resin, the middle layer resin begins to bond to the photoresist polymer resin through the middle layer cross-linking group and the photoresist cross-linking agent. As such, the adhesion between the middle layer 801 and the photoresist 401 can begin to be enhanced. By bonding the middle layer polymer resin to the photoresist polymer resin, the adhesion between the middle layer 801 and the overlying photoresist 401 can be increased at this point in the process.

After the pre-bake of the photoresist 401 (and the partial cross-linking between the middle layer 801 and the photoresist 401), the photoresist 401 is exposed to the patterned energy 415 (as described above with respect to FIGS. 4A-4B). Such an exposure creates an exposed region and an unexposed region within the photoresist 401, wherein the exposed region and the unexposed region have different physical properties which may be utilized to separate the exposed region from the unexposed region. For example, during the exposure of the photoresist 401 to the patterned energy 415, the PACs within the photoresist 401, such as a photoacid generator within the photoresist 401, will absorb the energy and generate the proton. This proton will react with the groups that will decompose (e.g., the acid labile group) within the photoresist polymer resin and will change the physical properties of the photoresist polymer resin within the exposed region.

Additionally, in the embodiment discussed herein in which the middle layer cross-linking monomer comprises an acid labile group (e.g., when the photoresist 401 is a positive tone photoresist), the protons generated by the exposure that are adjacent to the middle layer 801 will also migrate and react with the middle layer cross-linking monomer within the middle layer 801 (which previously cross-linked with the photoresist 401 during the pre-bake) in the exposed region of the photoresist 401. In this reaction, the bonds within the acid labile group will cleave because of the proton and break the cross-linking bond between the middle layer 801 and the photoresist 401 in the exposed region while the cross-linking bonds in the unexposed region remain unaffected. As such, the adhesion between the middle layer 801 and the photoresist 401 in the unexposed region (which for a positive tone photoresist is the region to remain behind during development) is maintained while the adhesion between the middle layer 801 and the photoresist 401 in the exposed region (the region to be removed during development) is reduced in preparation for development.

Alternatively, in the embodiment discussed herein in which the middle layer cross-linking monomer comprises the light sensitive group and the photoresist 401 is the positive tone photoresist, the light sensitive group will cleave from the remainder of the middle layer cross-linking monomer as the light sensitive group absorbs portions of the patterned energy 415 during the exposure that passes through the photoresist 401. In this embodiment the reaction is initiated not by the generation of the acid (as described above) but is initiated by the patterned energy 415 directly. As such, the adhesion between the middle layer 801 and the photoresist 401 in the unexposed region (which for a positive tone photoresist is the region to remain behind during development) is maintained while the adhesion between the middle layer 801 and the photoresist 401 in the exposed region (the region to be removed during development) is reduced in preparation for development.

Alternatively, in an embodiment in which the photoresist 401 is a negative tone photoresist (wherein the unexposed portion of the photoresist 401 is desired to be removed during development and the exposed portion is desired to be retained), the proton generated during the exposure of the photoresist 401 will react with additional ones of the middle layer cross-linking groups, causing the middle layer cross-linking monomers to bond to additional ones of the photoresist polymer resins. As such, this additional reaction will cause cross-linking to occur, thereby either initiating (in embodiments in which little to no cross-linking has occurred) or else strengthening (in embodiments in which some cross-linking has already occurred) the adhesion between the middle layer 801 and the photoresist 401 in the exposed regions of the photoresist 401.

In another embodiment in which the photoresist 401 is the negative tone photoresist and the middle layer cross-linking group comprises the light sensitive group, the light sensitive group will absorb the patterned energy 415 that has passed through the photoresist 401 in the exposed region. This absorption will initiate cross-linking reactions between the middle layer 801 and the photoresist 401 without the use of the intervening proton formed during the exposure within the photoresist 401. As such, this reaction will also cause cross-linking to occur, thereby either initiating (in embodiments in which little to no cross-linking has occurred) or else strengthening (in embodiments in which some cross-linking has already occurred) the adhesion between the middle layer 801 and the photoresist 401 in the exposed regions of the photoresist 401.

Figure 18:
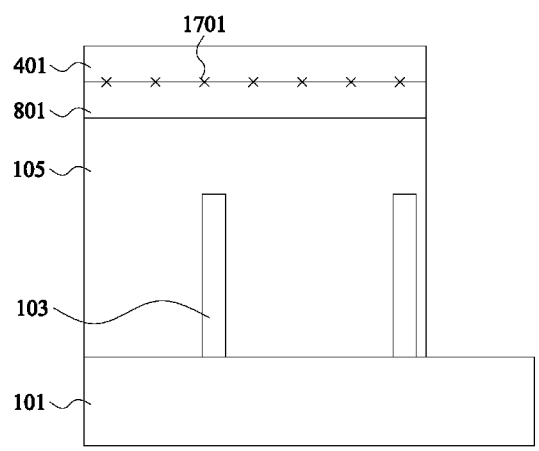
FIG. 18 illustrates a photoresist applied to the cross-linked middle layer and photoresist in accordance with an embodiment.

FIG. 18 illustrates a development of the photoresist 401 as well as a transfer of the pattern of the photoresist 401 into the middle layer 801 and the BARC layer 105. In an embodiment the photoresist 401 may be developed using the developer 417 (not illustrated in FIG. 17). For example, in an embodiment in which the photoresist 401 is a positive tone photoresist, the developer is a positive tone developer that removes the exposed region (which has had the cross-links 1701 removed or weakened during the exposure) without significantly removing the unexposed region (which has not had the cross-links 1701 removed or weakened during the exposure). Alternatively, in an embodiment in which the photoresist 401 is a negative tone photoresist, the developer is a negative tone developer that removes the unexposed region (which has not had additional cross-linking from the irradiation) without significantly removing the exposed region (which has had additional cross-links 1701 from the irradiation).

Once the photoresist 401 has been irradiated with the patterned energy 415 (and the cross-linking reactions have been initiated), the post-exposure baking may be performed. In an embodiment the post-exposure baking may be performed as described above with respect to FIGS. 4A-4B. However, in order to enhance the cross-linking reactions in this embodiment (as described above), the post-exposure baking may be performed at a temperature of between about 80° C. and about 300° C., such as about 110° C., for a time period of between about 30 s and about 180 s, such as about 60 s. Such a post-exposure baking will drive the cross-linking reactions, either cleaving the cross-linking bonds or else enhancing the cross-linking bonds.

FIG. 18 also illustrated that, once the photoresist 401 has been developed, the pattern of the photoresist 401 may be transferred to the middle layer 801 and the BARC layer 105 as described above with respect to FIG. 8. For example, one or more reactive ion etches may be utilized to transfer the pattern of the photoresist 401 to the middle layer 801, and then the middle layer 801 and the photoresist 401 may be used as masks to transfer the pattern to the BARC layer 105. The substrate 101 may then be processed and the BARC layer 105, the middle layer 801, and the photoresist 401 may be removed as described above with respect to FIG. 6.

However, by initiating the cross-linking between the middle layer 801 and the photoresist 401, additional adhesion may be achieved between the middle layer 801 and the photoresist 401. This adhesion may then be used to reduce or eliminate pattern collapse of the photoresist 401. Such a prevention allows for a higher yield and also allows for a reduction in the size of patterns that may be achieved.

Figure 19:
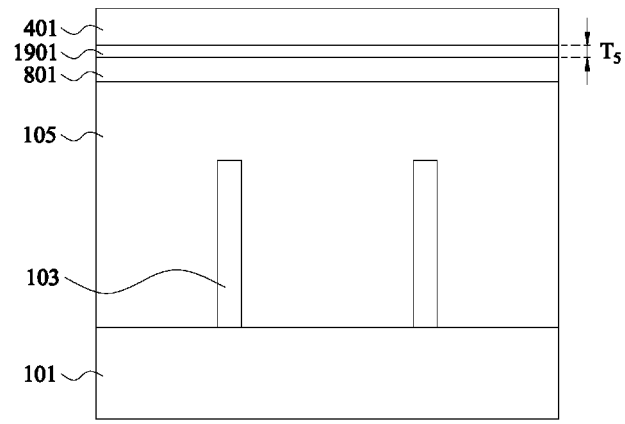
FIG. 19 illustrates a middle layer with a phase separation in accordance with an embodiment.

FIG. 19 illustrates yet another embodiment that may be utilized to improve the adhesion between the middle layer 801 and the overlying photoresist 401. In this embodiment, rather than applying a separate layer such as the adhesion promotion layer 1501 over the middle layer 801, the middle layer 801 is formed using at least a first separation material and a second separation material. Upon dispersal, the first separation material and the second separation material will undergo a phase separation to form an internal adhesion layer such as a separation region 1901 within the middle layer 801.

In an embodiment the first separation material within the middle layer 801 is the middle layer resin described above with respect to FIG. 8. For example, the first separation material may be a first organo-silicon polymer such as a polymer based on monomers of polysilsesquioxane or polysiloxane, such as a polymer comprising monomers of a polyhedral oligomeric silsesquioxane. In a particular embodiment the first separation material may comprise monomers having the following structure:

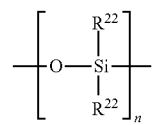

where $R^{22}$ is an organic group such as an alkyl group with less than six carbon atoms or an lkoxy group with less than six carbon atoms. However, any suitable polymer comprising one or more of these monomers or other suitable monomers, may alternatively be utilized.

The second separation material may be a second organo-silicon polymer. However, in an embodiment the second organo-silicon polymer has different silicon-containing monomers from the first separation material. For example, the second separation material may comprise monomers such as the following structure:

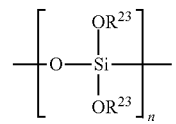

Where $R^{23}$ is an alkyl chain or a fluoroalkyl chain with between five and twenty carbon atoms.

By utilizing a different silicon containing polymer for the second separation material than for the first separation material, the first separation material and the second separation material will have different physical properties. For example, depending on the precise materials chosen for the first separation material and the second separation material, the first separation material may have a different hydrophobicity than the second separation material. Such a difference will allow the first separation material and the second separation material to phase separate after application (described further below).

In this embodiment the first separation material and the second separation material may be placed within the middle layer solvent along with the other components or desired additives in order to prepare the material for the middle layer 801 with the first separation material and the second separation material for dispersal. In an embodiment the first separation material may have a concentration within the middle layer solvent of between about 2% and about 20%, such as about 10%, while the second separation material may have a concentration within the middle layer solvent of between about 1% and about 10%, such as about 3%. However, any suitable concentration may alternatively be utilized.

In an alternative embodiment, the second separation material may not be a silicon containing polymer (as discussed above), but may be an organic polymer. In this embodiment the second separation material may be similar to the organic layer as described above with respect to FIG. 15. For example, the second separation material may be a polymer with an organic backbone with monomers such as, e.g., polyhydroxystyrene (PHS), methacrylate, polyether, a methacrylate/PHS hybrid, or any other suitable organic polymer which contains an aromatic ring. However, any suitable organic polymer may alternatively be utilized.

In this embodiment, to prepare for dispersal, the first separation material (e.g., the first organo-silicon polymer) and the second separation material (e.g., the organic polymer) may be placed within the middle layer solvent along with the other components or desired additives. In this embodiment the first separation material may have a concentration within the middle layer solvent of between about 2% and about 20%, such as about 10%, while the second separation material may have a concentration within the middle layer solvent of between about 1% and about 10%, such as about 3%. However, any suitable concentration may alternatively be utilized.

Once all of the components have been placed within the middle layer solvent the middle layer solvent may be dispersed onto the BARC layer 105. The material for the middle layer 801 (with the first separation material and the second separation material) may be applied to the BARC layer 105 so that the material for the middle layer 801 coats an upper exposed surface of the BARC layer 105, and may be applied using a process such as a spin-on coating process, a dip coating method, an air-knife coating method, a curtain coating method, a wire-bar coating method, a gravure coating method, a lamination method, an extrusion coating method, combinations of these, or the like.

Once applied, the first separation material and the second separation material will undergo a phase separation to form a separation region 1901 within the middle layer 801. In an embodiment in which the second separation material is the organic polymer, the second separation material will phase separate from the first separation material (e.g., the organo-silicon polymer) and float to the surface of the middle layer 801. As such, the organic polymer (in the separation region 1901) is on the organo-silicon polymer in the remainder of the middle layer 801.

Alternatively, in the embodiment in which the second separation material is the second silicon-containing polymer, one of the first separation material and the second separation material will float to the surface of the middle layer 801 to form the separation region 1701. In an embodiment in which the second separation material is more hydrophobic than the first separation material (which would be more hydrophylic), the second separation material will float to the top of the middle layer 801.

By floating to the top surface of the middle layer 801, the phase separation of the first separation material and the second separation material will form the separation region 1901 along a top surface of the middle layer 801, and will therefore modify the properties of the surface of the middle layer 801. In an embodiment the phase separation will form the separation region 1901 to have a fifth thickness $T_5$ of between about 10 Å and about 100 Å, such as about 50 Å. However, any suitable thickness may alternatively be utilized.

FIG. 19 also illustrates a placement of the photoresist 401 over the middle layer 801 with the separation region 1901. In an embodiment the photoresist 401 is as described above with respect to FIGS. 4A-4B, and may be, for example, a photoresist polymer resin along with one or more photoactive compounds (PACs) in a photoresist solvent. Additionally, the photoresist 401 may be applied to a top surface of the middle layer as described above with respect to FIGS. 4A-4B. For example, the photoresist 401 may be applied using a process such as a spin-on coating process, a dip coating method, an air-knife coating method, a curtain coating method, a wire-bar coating method, a gravure coating method, a lamination method, although any suitable method of application may alternatively be utilized.

Figure 20:
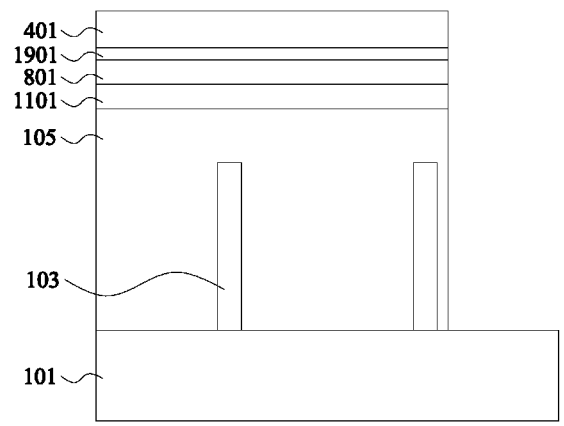
FIG. 20 illustrates a photoresist applied to the phase separation in accordance with an embodiment.

FIG. 20 illustrates a patterning of the photoresist 401 as well as a transfer of the pattern of the photoresist 401 into the middle layer 801 as well as the BARC layer 105. In an embodiment the photoresist 401 may be patterned as described above with respect to FIGS. 4A-4B, such as by being exposed to a patterned energy source (e.g., light) and then developed using the developer 417 (not illustrated in FIG. 18). Similarly, once the photoresist 401 has been developed, the pattern of the photoresist 401 may be transferred to the middle layer 801 and the BARC layer 105 as described above with respect to FIG. 8. For example, a reactive ion etch may be utilized to transfer the pattern of the photoresist 401 to the middle layer 801, and then the middle layer 801 and the photoresist 401 may be used as masks to transfer the pattern to the BARC layer 105. The substrate 101 may then be processed and the BARC layer 105, the middle layer 801, and the photoresist 401 may be removed as described above with respect to FIG. 6.

However, by modifying the surface of the middle layer 801 with the separation region 1901, additional adhesion may be achieved between the middle layer 801 and the photoresist 401. This adhesion may then be used to reduce or eliminate pattern collapse of the photoresist 401. Such a prevention allows for a higher yield and also allows for a reduction in the size of patterns that may be achieved.

In accordance with an embodiment, a method for manufacturing a semiconductor device comprising dispensing an anti-reflective material over a substrate to form an anti-reflective coating layer, the anti-reflective material having a first concentration of a floating component is provided. A floating region is formed adjacent to a top surface of the anti-reflective layer, the floating region having a second concentration of the floating component greater than the first concentration.

In accordance with another embodiment, a method of manufacturing a semiconductor device comprising applying an anti-reflective coating onto a substrate, the anti-reflective coating comprising at least one component that has a fluorine atom, is provided. A floating region is formed along a top surface of the anti-reflective coating, wherein the floating region has a higher concentration of the at least one component than the remainder of the anti-reflective coating. The anti-reflective coating is baked to initiate a cross-linking reaction in the floating region.

In accordance with yet another embodiment, an anti-reflective material comprising a polymer resin and a cross-linking agent is provided, wherein one of the polymer resin or the cross-linking agent comprises a fluorine atom. The anti-reflective material also comprises a catalyst.

In accordance with yet another embodiment, a method of manufacturing a semiconductor device comprising dispensing an anti-reflective material over a substrate to form an anti-reflective coating layer, the anti-reflective material having a first concentration of a floating component, is provided. A floating region is formed adjacent to a top surface of the anti-reflective coating, the floating region having a second concentration of the floating component greater than the first concentration. A fluid is applied to the anti-reflective material to remove the anti-reflective material and the floating region.

In accordance with yet another embodiment, a method of manufacturing a semiconductor device comprising applying a middle layer to a substrate and applying an adhesion promotion layer to the middle layer, wherein the applying the adhesion promotion layer is performed in a separate step than the applying the middle layer, is provided. A photoresist is applied to the adhesion promotion layer, and the photoresist is patterned.

In accordance with yet another embodiment, a method of manufacturing a semiconductor device comprising applying a middle layer to a substrate, wherein the middle layer comprises a first cross-linking group is provided. A photoresist is applied to the middle layer, wherein the photoresist comprises a second cross-linking group, and the first cross-linking group is cross-linked to the second cross-linking group.

In accordance with yet another embodiment, a method of manufacturing a semiconductor device comprising applying a middle layer to a substrate and performing a phase separation within the middle layer to form a separation region along a top surface of the middle layer. A photoresist is adhered to the separation region.

Although the present embodiments and their advantages have been described in detail, it should be understood that various changes, substitutions and alterations can be made herein without departing from the spirit and scope of the disclosure as defined by the appended claims. For example, many different monomers may be used to form the material of the BARC layer, and may different processes may be utilized to form, apply, and develop the photoresist.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
    dispensing an anti-reflective material over a semiconductor substrate to form an anti-reflective coating layer, the anti-reflective material having a first concentration of a floating additive, wherein the floating additive further comprises:
        a group to be decomposed; and
        a fluorine group bonded to the group to be decomposed;
    forming a floating region adjacent to a top surface of the anti-reflective coating layer, the floating region having a second concentration of the floating additive greater than the first concentration and a thickness of at least 100 Å; and
    placing, exposing and developing a photoresist over the floating region.

2. The method of claim 1, wherein the group to be decomposed further comprises an acid labile group.

3. The method of claim 1, wherein the floating region further comprises a catalyst.

4. The method of claim 3, wherein the catalyst is a thermal acid generator.

5. The method of claim 4, further comprising baking the floating region, wherein the baking the floating region initiates a reaction between the thermal acid generator and the floating additive which cleaves the group to be decomposed.

6. The method of claim 1, wherein the fluorine group is a substituted fluorine.

7. The method of claim 1, further comprising applying a middle layer to the floating region.

8. A method of manufacturing a semiconductor device, the method comprising:
    applying a middle layer to a bottom layer over a substrate;
    applying an adhesion promotion layer to the middle layer, wherein the applying the adhesion promotion layer is performed in a separate step than the applying the middle layer;
    applying a photoresist to the adhesion promotion layer; and
    exposing and developing the photoresist.

9. The method of claim 8, wherein the adhesion promotion layer comprises an organic polymer.

10. The method of claim 9, wherein the organic polymer comprises methacrylate.

11. The method of claim 10, wherein the adhesion promotion layer comprises an inorganic layer.

12. The method of claim 11, wherein the inorganic layer comprises a silicon containing polymer.

13. The method of claim 11, wherein the inorganic layer comprises a metal containing polymer.

14. A method of manufacturing a semiconductor device, the method comprising:
    applying a middle layer to a bottom layer, the bottom layer being over a substrate, wherein the middle layer comprises a first cross-linking group;
    applying a photoresist to the middle layer, wherein the photoresist comprises a second cross-linking group;
    cross-linking the first cross-linking group to the second cross-linking group; and
    exposing and developing the photoresist after the cross-linking the first cross-linking group to the second cross-linking group.

15. The method of claim 14, further comprising cleaving a bond within the first cross-linking group after the cross-linking the first cross-linking group to the second cross-linking group.

16. The method of claim 15, wherein the cleaving the bond within the first cross-linking group is performed by irradiating a light sensitive group.

17. The method of claim 15, wherein the cleaving the bond within the first cross-linking group is performed by cleaving an acid labile group.

18. The method of claim 14, wherein the cross-linking the first cross-linking group to the second cross-linking group is performed at least in part by irradiating a light sensitive group.

19. The method of claim 14, wherein the cross-linking the first cross-linking group to the second cross-linking group is performed at least in part with an acid-catalyzed reaction.

20. A method of manufacturing a semiconductor device, the method comprising:
   applying a middle layer to a substrate having a bottom layer;
   performing a phase separation within the middle layer to form a separation region along a top surface of the middle layer;
   adhering a photoresist to the separation region; and
   exposing and developing the photoresist.

21. The method of claim 20, wherein the performing the phase separation separates a silicon-containing material from an organic material.

22. The method of claim 20, wherein the performing the phase separation separates a first silicon-containing material from a second silicon-containing material.

\* \* \* \* \*